(12) United States Patent
Yanagisawa et al.

(10) Patent No.: US 12,396,214 B2
(45) Date of Patent: Aug. 19, 2025

(54) SEMICONDUCTOR DEVICE

(71) Applicant: SEMICONDUCTOR ENERGY LABORATORY CO., LTD., Atsugi (JP)

(72) Inventors: Yuichi Yanagisawa, Kanagawa (JP); Yasumasa Yamane, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 447 days.

(21) Appl. No.: 17/437,439

(22) PCT Filed: Mar. 6, 2020

(86) PCT No.: PCT/IB2020/051933
§ 371 (c)(1),
(2) Date: Sep. 9, 2021

(87) PCT Pub. No.: WO2020/188392
PCT Pub. Date: Sep. 24, 2020

(65) Prior Publication Data
US 2022/0173246 A1      Jun. 2, 2022

(30) Foreign Application Priority Data

Mar. 15, 2019   (JP) ................................. 2019-048542

(51) Int. Cl.
*H10D 30/67*        (2025.01)
*H10B 12/00*        (2023.01)
(Continued)

(52) U.S. Cl.
CPC ......... *H10D 30/6755* (2025.01); *H10B 12/00* (2023.02); *H10D 30/6734* (2025.01);
(Continued)

(58) Field of Classification Search
CPC ................. H01L 29/7869; H01L 29/24; H01L 29/66969; H01L 29/78648;
(Continued)

(56) References Cited

U.S. PATENT DOCUMENTS 8,455,868 B2    6/2013   Yamazaki et al.
8,547,771 B2    10/2013  Koyama
(Continued)

FOREIGN PATENT DOCUMENTS

JP    2011-151383 A    8/2011
JP    2012-257187 A    12/2012
(Continued)

OTHER PUBLICATIONS

Stanley M. Howard, "Ellingham Diagrams," https://web.archive.org/web/20110813100231/http://showard.sdsmt.edu/MET320/Handouts/EllinghamDiagrams/Ellingham_v22_Macro.pdf (Year: 2011).*

(Continued)

*Primary Examiner* — William B Partridge
*Assistant Examiner* — Linda J. Fleck
(74) *Attorney, Agent, or Firm* — NIXON PEABODY LLP; Jeffrey L. Costellia

(57) ABSTRACT

A semiconductor device having favorable electrical characteristics is provided. The semiconductor device includes an insulator including an excess-oxygen region, a metal oxide over the insulator, a first oxide semiconductor over the metal oxide, a first conductor in contact with the first oxide semiconductor, a second conductor in contact with the first oxide semiconductor, and a second oxide semiconductor in contact with the first oxide semiconductor and the insulator. The metal oxide contains an element having lower Gibbs energy of formation in an Ellingham diagram than a metal element contained in the first oxide semiconductor, and a (Continued)

region where the first oxide semiconductor and the second oxide semiconductor are in contact with each other is positioned between the first conductor and the second conductor.

12 Claims, 30 Drawing Sheets

(51) Int. Cl.
    *H10D 62/80*     (2025.01)
    *H10D 86/40*     (2025.01)
    *H10D 86/60*     (2025.01)
    *H10D 87/00*     (2025.01)
    *H10D 99/00*     (2025.01)

(52) U.S. Cl.
    CPC ........... *H10D 62/80* (2025.01); *H10D 86/423* (2025.01); *H10D 86/441* (2025.01); *H10D 86/481* (2025.01); *H10D 86/60* (2025.01); *H10D 87/00* (2025.01); *H10D 99/00* (2025.01)

(58) Field of Classification Search
    CPC ........... H01L 29/78696; H01L 27/1207; H01L 27/1225; H01L 27/124; H01L 27/1255; H01L 27/0629; H01L 27/0688; H01L 21/8258; H10B 12/00; H10B 41/70; H10D 30/6755; H10D 30/6734; H10D 30/6757; H10D 86/423; H10D 86/441; H10D 86/481; H10D 86/60; H10D 99/00; H10D 62/80; H10D 87/00; H10D 84/08; H10D 84/811; H10D 88/00

See application file for complete search history.

(56) References Cited

U.S. PATENT DOCUMENTS

| | | | |
|---|---|---|---|
| 8,995,174 B2 | 3/2015 | Koyama | |
| 9,349,735 B2 | 5/2016 | Yamazaki et al. | |
| 9,601,631 B2 | 3/2017 | Godo | |
| 9,917,209 B2 | 3/2018 | Endo et al. | |
| 9,991,265 B2 | 6/2018 | Yamazaki et al. | |
| 10,084,072 B2 | 9/2018 | Godo | |
| 10,223,194 B2 | 3/2019 | Aoki et al. | |
| 10,236,389 B2 | 3/2019 | Endo et al. | |
| 10,522,397 B2 | 12/2019 | Endo et al. | |
| 10,553,589 B2 | 2/2020 | Yamazaki et al. | |
| 10,692,994 B2 | 6/2020 | Hosaka et al. | |
| 10,998,447 B2 | 5/2021 | Onuki et al. | |
| 11,139,298 B2 | 10/2021 | Harada et al. | |
| 12,218,246 B2 * | 2/2025 | Yamazaki | H10D 86/481 |
| 12,218,247 B2 * | 2/2025 | Yamazaki | H01L 21/465 |
| 12,237,389 B2 * | 2/2025 | Yamazaki | H10D 30/673 |
| 2014/0339539 A1 * | 11/2014 | Yamazaki | H01L 27/1255 257/43 |
| 2015/0008428 A1 * | 1/2015 | Yamamoto | H01L 29/40114 257/43 |
| 2015/0280691 A1 | 10/2015 | Koyama | |
| 2016/0172500 A1 * | 6/2016 | Yamazaki | H01L 27/1225 257/43 |
| 2016/0254386 A1 * | 9/2016 | Yamazaki | H01L 27/1225 257/43 |
| 2017/0062192 A1 * | 3/2017 | Oota | H01L 29/78696 |
| 2017/0092660 A1 * | 3/2017 | Wang | H01L 29/78618 |
| 2017/0207242 A1 * | 7/2017 | Yamazaki | H01L 29/66969 |
| 2017/0222056 A1 * | 8/2017 | Sawai | H01L 27/1203 |
| 2017/0309752 A1 * | 10/2017 | Yamazaki | H01L 27/124 |
| 2018/0006124 A1 * | 1/2018 | Murakawa | H01L 29/7869 |
| 2018/0129556 A1 | 5/2018 | Aoki et al. | |
| 2018/0182870 A1 | 6/2018 | Hosaka et al. | |
| 2018/0301561 A1 * | 10/2018 | Kanzaki | H01L 29/66969 |
| 2019/0027508 A1 * | 1/2019 | Ueda | H01L 27/1229 |
| 2019/0139783 A1 * | 5/2019 | Yamazaki | H01L 21/443 |
| 2020/0176450 A1 | 6/2020 | Yamazaki et al. | |
| 2020/0321454 A1 | 10/2020 | Hosaka et al. | |

FOREIGN PATENT DOCUMENTS

| | | |
|---|---|---|
| JP | 2017-017320 A | 1/2017 |
| JP | 2017-092485 A | 5/2017 |
| JP | 2017-174489 A | 9/2017 |
| JP | 2018-081736 A | 5/2018 |
| JP | 2018-121049 A | 8/2018 |
| WO | WO-2019/048979 | 3/2019 |

OTHER PUBLICATIONS

International Search Report (Application No. PCT/IB2020/051933) Dated Jun. 9, 2020.

Written Opinion (Application No. PCT/IB2020/051933) Dated Jun. 9, 2020.

* cited by examiner

511 Driver circuit

521a Driver circuit

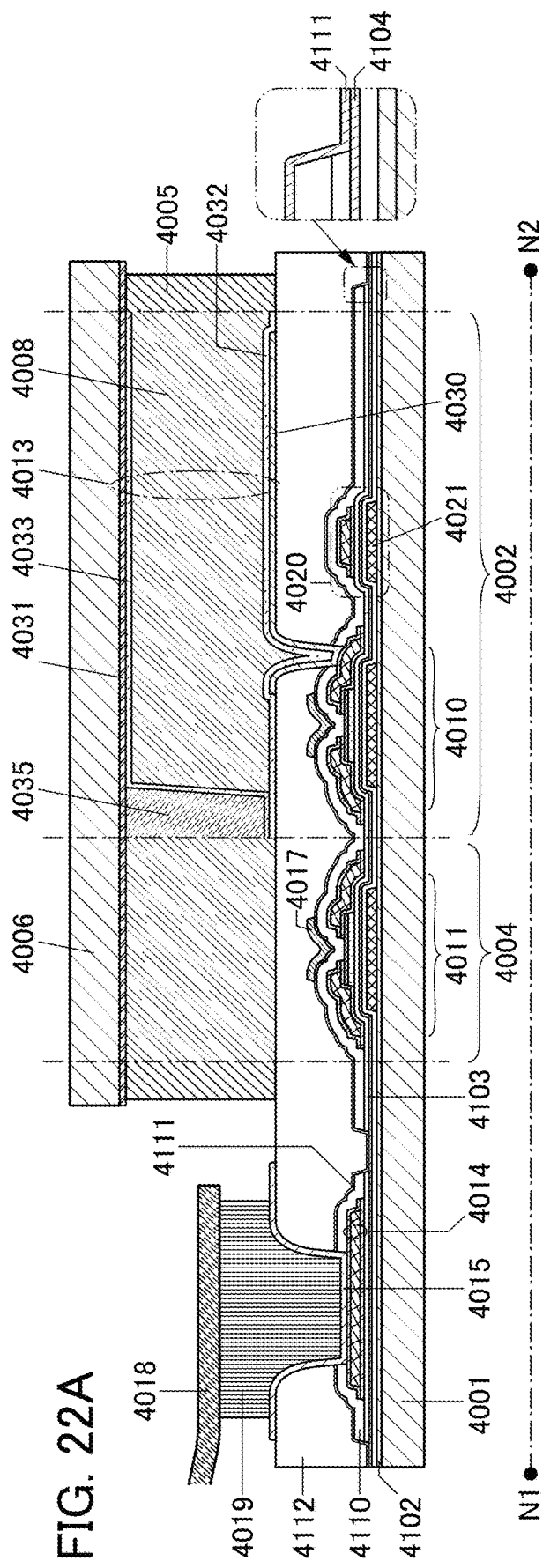
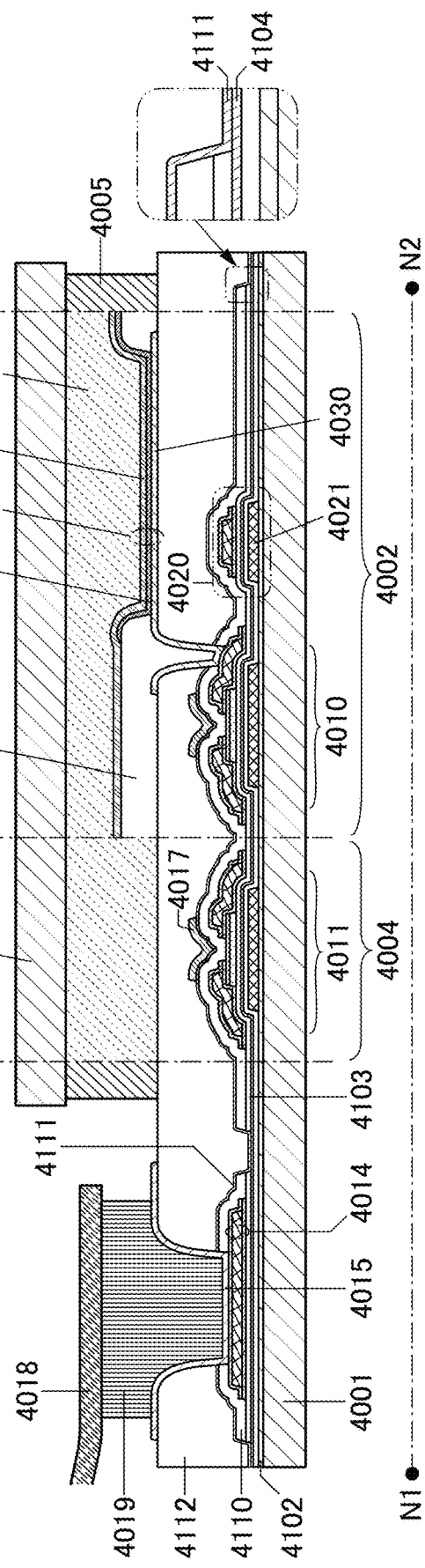
FIG. 22A
FIG. 22B

FIG. 25A

| 908 |
|---|
| 906 |
| 904 |
| 902 |
| 900 |

FIG. 25B

| 908 |
|---|
| 907 |
| 906 |
| 904 |
| 902 |
| 900 |

SEMICONDUCTOR DEVICE

TECHNICAL FIELD

One embodiment of the present invention relates to a semiconductor device and a method for manufacturing the semiconductor device. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed and an LSI, a CPU, and a memory are mainly used. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of LSIs, CPUs, memories, and the like is mounted on a circuit board, for example, a printed wiring board, to be used as one of components of a variety of electronic devices.

In addition, a technique for forming a transistor by using a semiconductor thin film formed over a substrate having an insulating surface has attracted attention. The transistor is used in a wide range of electronic devices such as an integrated circuit (IC) and an image display device (also simply referred to as a display device). A silicon-based semiconductor material is widely known as a material for a semiconductor thin film that can be used in a transistor, and as another material, an oxide semiconductor has attracted attention.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1). Furthermore, a memory device that can retain stored contents for a long time by utilizing a characteristic of a low leakage current of the transistor using an oxide semiconductor is disclosed, for example (see Patent Document 2).

In recent years, demand for an integrated circuit with higher density has risen with reductions in size and weight of electronic devices. Furthermore, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device having favorable electrical characteristics. Another object of one embodiment of the present invention is to provide a semiconductor device having favorable reliability. Another object of one embodiment of the present invention is to provide a semiconductor device having normally-off electrical characteristics. Another object of one embodiment of the present invention is to provide a semiconductor device having a high on-state current. Another object of one embodiment of the present invention is to provide a semiconductor device in which power consumption can be reduced.

Another object of one embodiment of the present invention is to provide a semiconductor device having high design flexibility. Another object of one embodiment of the present invention is to provide a semiconductor device that can be miniaturized or highly integrated. Another object of one embodiment of the present invention is to provide a semiconductor device with high productivity. Another object of one embodiment of the present invention is to provide a novel semiconductor device.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device having excellent frequency characteristics.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention includes an insulator including an excess-oxygen region, a metal oxide over the insulator, a first oxide semiconductor over the metal oxide, a first conductor in contact with the first oxide semiconductor, a second conductor in contact with the first oxide semiconductor, and a second oxide semiconductor in contact with the first oxide semiconductor and the insulator. The metal oxide contains an element having lower Gibbs energy of formation in an Ellingham diagram than a metal element contained in the first oxide semiconductor. A region where the first oxide semiconductor and the second oxide semiconductor are in contact with each other is positioned between the first conductor and the second conductor.

In the above, a second insulator in contact with a lower portion of the insulator and a third conductor below the second insulator are included. The second insulator inhibits diffusion of excess oxygen into the third conductor from the insulator.

In the above, the first conductor and the second conductor contain an element having higher Gibbs energy of formation in an Ellingham diagram than the metal element contained in the first oxide semiconductor.

In the above, the first oxide semiconductor is an In—Ga—Zn oxide.

A first insulator including an excess-oxygen region, a metal oxide over the first insulator, a second insulator over the metal oxide, a first oxide semiconductor over the second insulator, a first conductor in contact with the first oxide semiconductor, a second conductor in contact with the first oxide semiconductor, and a second oxide semiconductor in contact with the first oxide semiconductor and the insulator. The second insulator contains an element having lower Gibbs energy of formation in an Ellingham diagram than an element contained in the first oxide semiconductor. The metal oxide contains an element having lower Gibbs energy of formation in an Ellingham diagram than an element contained in the second insulator. A region where the first oxide semiconductor and the second oxide semiconductor are in contact with each other is positioned between the first conductor and the second conductor.

In the above, a third insulator in contact with a lower portion of the first insulator and a third conductor below the third insulator are included. The third insulator inhibits diffusion of excess oxygen into the third conductor from the first insulator.

In the above, the first conductor and the second conductor contain an element having higher Gibbs energy of formation in an Ellingham diagram than a metal element contained in the first oxide semiconductor.

In the above, the first oxide semiconductor is an In—Ga—Zn oxide.

Effect of the Invention

According to one embodiment of the present invention, a semiconductor device having favorable electrical characteristics can be provided. Alternatively, according to one embodiment of the present invention, a semiconductor device having favorable reliability can be provided.

Alternatively, according to one embodiment of the present invention, a semiconductor device having normally-off electrical characteristics can be provided. Alternatively, according to one embodiment of the present invention, a semiconductor device having a high on-state current can be provided. Alternatively, a semiconductor device in which power consumption can be reduced can be provided.

Alternatively, a semiconductor device having high design flexibility can be provided. Alternatively, according to one embodiment of the present invention, a semiconductor device that can be miniaturized or highly integrated can be provided. Alternatively, according to one embodiment of the present invention, a semiconductor device with high productivity can be provided. Alternatively, a novel semiconductor device can be provided.

Alternatively, a semiconductor device capable of retaining data for a long time can be provided. Alternatively, a semiconductor device capable of high-speed data writing can be provided. Alternatively, according to one embodiment of the present invention, a semiconductor device having excellent frequency characteristics can be provided.

Note that the description of these effects does not preclude the existence of other effects. One embodiment of the present invention does not have to have all these effects. Note that effects other than these are apparent from the description of the specification, the drawings, the claims, and the like and effects other than these can be derived from the description of the specification, the drawings, the claims, and the like.

BRIEF DESCRIPTION OF THE DRAWINGS

FIG. 22A and FIG. 22B are diagrams illustrating examples of a display device.

FIG. 25A and FIG. 25B are schematic diagrams of samples of an example.

MODE FOR CARRYING OUT THE INVENTION

Figure 1A:
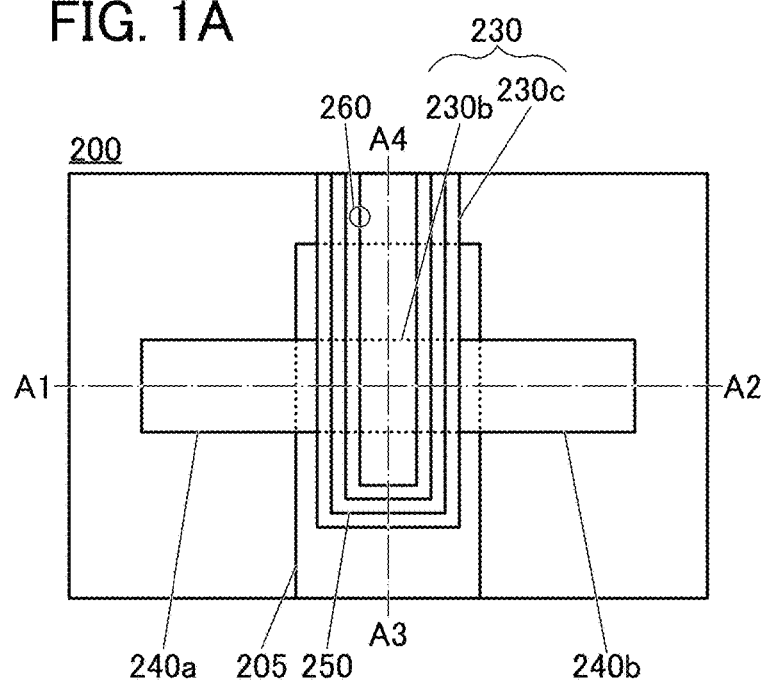
FIG. 1A is a top view of a semiconductor device.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that in this specification and the like, depending on the transistor structure, a channel width in a region where a channel is actually formed (channel formation region) (hereinafter also referred to as an "effective channel width") is different from a channel width shown in a top view of a transistor (hereinafter also referred to as an "apparent channel width") in some cases. For example, when a gate covers a side surface of a semiconductor, an effective channel width is greater than an apparent channel width, and its influence cannot be ignored in some cases. For example, in a miniaturized transistor having a gate covering a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor might be increased or the crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies (also referred to as Vo) are formed in some cases by entry of impurities, for example. Furthermore, in the case where the semiconductor is silicon, examples of an impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification, a barrier film means a film having a function of inhibiting transmission of oxygen and impurities such as water or hydrogen, and the barrier film having conductivity is sometimes referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

An example of a semiconductor device including a transistor 200 of one embodiment of the present invention and a manufacturing method thereof are described below.
<Structure Example 1 of Semiconductor Device>

Figure 1C:
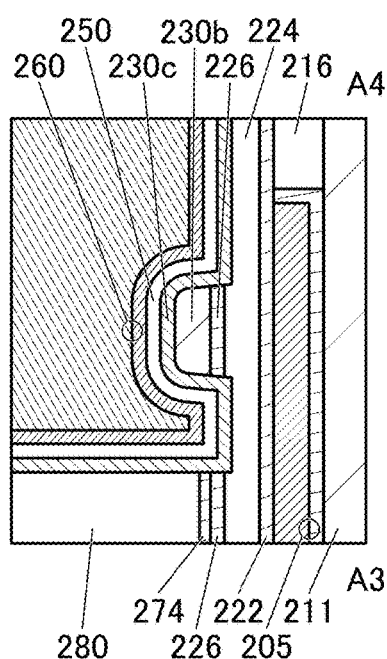
FIG. 1B and FIG. 1C are cross-sectional views of the semiconductor device.
Figure 1B:
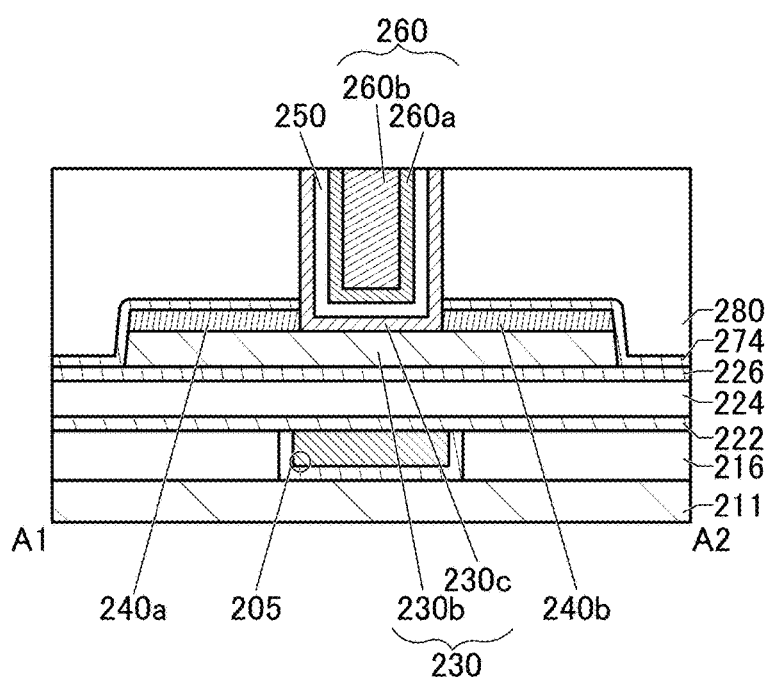

FIG. 1A is a top view of the semiconductor device including the transistor 200 of one embodiment of the present invention. FIG. 1B and FIG. 1C are cross-sectional views of the semiconductor device. Note that for clarity of the drawing, some components are not illustrated in the top view of FIG. 1A.

FIG. 1B is a cross-sectional view of a portion indicated by dashed-dotted line A1-A2 in FIG. 1A, and illustrates a cross section of the transistor 200 in the channel length direction. FIG. 1C is a cross-sectional view of a portion indicated by dashed-dotted line A3-A4 in FIG. 1A, and illustrates a cross section of the transistor 200 in the channel width direction.

As illustrated in FIG. 1, the semiconductor device including the transistor 200 includes a substrate 211, the transistor 200 positioned over the substrate 211, and an insulator 280 functioning as an interlayer film positioned over the transistor 200. Note that a plug electrically connected to the transistor 200 or a conductor functioning as a wiring may be provided in the insulator 280.

The detailed structure of the semiconductor device including the transistor 200 of one embodiment of the present invention is described below.

[Transistor 200]

As illustrated in FIG. 1, the transistor 200 includes an insulator 216, a conductor 205 (illustrated to have a two-layer structure in the drawing, but not limited thereto), an insulator 222, an insulator 224, a metal oxide 226, an oxide 230 (an oxide 230b and an oxide 230c), a conductor 240 (a conductor 240a and a conductor 240b), an insulator 274, an insulator 250, and a conductor 260 (a conductor 260a and a conductor 260b).

The oxide 230 includes at least a region functioning as a semiconductor including a channel formation region.

Note that in the transistor 200, the conductor 260 functions as a first gate of the transistor and the conductor 205 functions as a second gate of the transistor. The conductor 240a and the conductor 240b function as a source electrode and a drain electrode.

The insulator 250 functions as a first gate insulator, and the insulator 222 and the insulator 224 function as a second gate insulator.

The metal oxide 226 is positioned between the oxide 230 and the insulator 224.

Here, in the transistor 200, a metal oxide functioning as a semiconductor (hereinafter also referred to as an oxide semiconductor) is preferably used as the oxide 230 which includes a region where a channel is formed (hereinafter also referred to as a channel formation region).

As the oxide semiconductor, for example, a metal oxide such as an In-M-Zn oxide (the element M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, an In—Ga oxide or an In—Zn oxide may be used.

The transistor including an oxide semiconductor in its channel formation region has an extremely low leakage current in an off state; thus, a semiconductor device with low power consumption can be provided. Furthermore, by using an oxide semiconductor, a variety of elements can be stacked and three-dimensionally integrated. In other words, an oxide semiconductor can be deposited by a sputtering method or the like; therefore, a three-dimensional integrated circuit (a 3D integrated circuit) in which a circuit is developed not only on a flat surface of a substrate but also in a perpendicular direction can be formed.

In contrast, a transistor including an oxide semiconductor easily has normally-on characteristics (the characteristics are that a channel exists without voltage application to a gate electrode and a current flows in a transistor) owing to impurities and oxygen vacancies in the oxide semiconductor that affect the electrical characteristics. Examples of the impurities in the oxide semiconductor that affect the electrical characteristics include hydrogen, nitrogen, alkali metal, alkaline earth metal, iron, nickel, and silicon.

Therefore, it is preferable to use, as the oxide semiconductor used for the channel formation region of the transistor, a highly purified intrinsic oxide semiconductor in which impurities and oxygen vacancies are reduced. Note that in this specification and the like, a state with a low impurity concentration and a low density of defect states is referred to as a highly purified intrinsic or substantially highly purified intrinsic state.

Meanwhile, in the case where a metal layer is used, in the transistor using the oxide semiconductor, for a conductor included in the transistor or a conductor used as a plug or a wiring connected to the transistor, oxygen in the oxide semiconductor is gradually absorbed and an oxygen vacancy is generated in some cases, which is one of changes over time.

In particular, in the case where an In-M-Zn oxide is used as the oxide semiconductor, indium (In) and zinc (Zn) have relatively high Gibbs energy of formation in an Ellingham diagram. That is, since indium (In) and zinc (Zn) is more likely to be reduced, oxygen bonded to indium (In) and zinc (Zn) is extracted to a metal or the like positioned close to the oxide; as a result, it is highly possible that oxygen vacancies are generated.

Accordingly, it is preferable to provide a structure body including an excess-oxygen region in the vicinity of the oxide semiconductor of the transistor. Excess oxygen of the structure body including the excess-oxygen region is diffused into oxygen vacancies generated in the oxide semiconductor, whereby the oxygen vacancies can be compensated for.

Note that in this specification, oxygen that is released by heating is referred to as excess oxygen in some cases. Oxygen in excess of that in the stoichiometric composition is referred to as excess oxygen in other cases. A region where oxygen exists in excess of that in the stoichiometric composition may be referred to as an excess-oxygen region.

As the insulator including an excess-oxygen region, specifically, an oxide material that releases part of oxygen by heating is preferably used. The oxide that releases oxygen by heating (hereinafter also referred to as an insulating material including an excess-oxygen region) is an oxide in which the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

For the insulator in which an excess-oxygen region can be formed, specifically, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

However, also in the insulator including the excess-oxygen region, excess oxygen is gradually absorbed by a metal serving as a conductor used in a structure body such as a transistor included in a semiconductor device, and a metal serving as a conductor used as a plug or a wiring electrically connected to the structure body in some cases.

In the case where the metal layer is in contact with the oxide semiconductor, the metal layer absorbs oxygen from the oxide semiconductor while excess oxygen is supplied to the oxygen vacancies generated in the oxide semiconductor even when the insulator including the excess-oxygen region is positioned in the vicinity of the oxide semiconductor. That is, the metal layer in contact with the oxide semiconductor absorbs excess oxygen from the excess-oxygen region through the oxide semiconductor.

Accordingly, excess oxygen in the excess-oxygen region is absorbed by the metal positioned in the vicinity of the insulator including the excess-oxygen region, whereby the amount of oxygen extracted from the oxide semiconductor by the conductor might become greater than the amount of excess oxygen diffused into the oxygen vacancies generated in the oxide semiconductor. In the case where excess oxygen becomes insufficient, the oxygen vacancies generated in the oxide semiconductor are not sufficiently compensated for and thus electrical characteristics of the transistor are changed.

In particular, in the case where structure bodies such as transistors or capacitors including a conductor are arranged with high density, it is highly possible that excess oxygen becomes insufficient. Specifically, in a layout in which transistors are arranged in a matrix, typified by a memory cell region or a pixel region, excess oxygen might be insufficient in a center portion of the region.

Thus, a structure body that inhibits movement or diffusion of oxygen (hereinafter also referred to as having a barrier property against oxygen) is preferably positioned between the insulator including the excess-oxygen region and the metal layer positioned in the vicinity of the insulator.

Excess oxygen contained in the insulator including the excess-oxygen region is absorbed by the metal layer in contact with the oxide semiconductor through the oxide semiconductor. In the oxide semiconductor, oxygen vacancies are generated in a region in contact with the metal layer, which can reduce the contact resistance between the conductor and the oxide semiconductor.

That is, in the oxide semiconductor, it is preferable that excess oxygen not be supplied to regions in contact with or overlapping with the metal layer (specifically, regions functioning as a source region and a drain region). Accordingly, a structure body having a barrier property against oxygen is preferably positioned at least between the region functioning as the source region or the drain region of the oxide semiconductor and the insulator including the excess-oxygen region.

Meanwhile, in the oxide semiconductor in a region overlapping with the conductor with the insulator therebetween (specifically, a region functioning as a channel formation region) is preferably a highly purified intrinsic oxide semiconductor in which impurities and oxygen vacancies are reduced. Thus, a region in contact with the insulator including the excess-oxygen region is preferably provided in a channel formation region of the oxide semiconductor or in the vicinity of the channel formation region.

Note that as a material that inhibits movement of excess oxygen into the conductor from the insulator including the excess-oxygen region (a material having a barrier property against oxygen), a metal oxide containing an element having lower Gibbs energy of formation in an Ellingham diagram than a metal element contained in the conductor is preferably used.

In addition, as a material that inhibits movement of excess oxygen into the oxide semiconductor from the insulator including the excess-oxygen region (a material having a barrier property against oxygen), a metal oxide containing an element having lower Gibbs energy of formation in an Ellingham diagram than a metal element contained in the oxide semiconductor can be used.

When the metal oxide containing a metal element having a higher oxidation tendency than the metal element contained in a conductor or an oxide semiconductor is positioned between the conductor or the oxide semiconductor and the insulator containing excess oxygen is positioned, movement or diffusion of excess oxygen into the conductor through the metal oxide are inhibited.

Specific description is made with reference to the structure of the transistor 200 illustrated in FIG. 1.

In the transistor 200 illustrated in FIG. 1, the oxide 230 including a channel formation region includes at least the oxide 230b over the metal oxide 226 and the oxide 230c that is positioned over the oxide 230b and is at least partly in contact with a top surface of the oxide 230b.

Note that the oxide 230c is positioned to overlap with the conductor 260 functioning as a gate electrode with the insulator 250 therebetween. That is, a region where the oxide 230c and the oxide 230b overlap with each other functions as a channel formation region.

The oxide 230c is positioned in contact with the insulator 224, the metal oxide 226, the oxide 230b, the conductor 240, the insulator 274, and the insulator 280. The oxide 230b is positioned in contact with the conductor 240, the insulator 274, and the metal oxide 226.

An excess-oxygen region is provided in the insulator 224 in contact with the oxide 230c. The design of the thickness or the like of the insulator 224 can be easily changed. In other words, since a volume reduction or the like due to a process performed after providing the excess-oxygen region is small, the amount of excess oxygen can be easily controlled by adjusting the thickness or the like of the insulator 224.

Note that the oxide 230c is in contact with the insulator 250 and the insulator 280. Thus, an excess-oxygen region may be provided in one or both of the insulator 250 and insulator 280.

Here, the insulator 222 is positioned between the insulator 224 including an excess-oxygen region and the conductor 205. Note that the insulator 222 is formed using a material that inhibits movement or diffusion of excess oxygen into the conductor 205 from the insulator 224. That is, the insulator 222 is formed using an insulating metal oxide that contains an element having lower Gibbs energy of formation in an Ellingham diagram than a metal element contained in the conductor 205.

When the insulator 222 including a barrier property against oxygen is positioned between the conductor 205 and the insulator 224 including the excess-oxygen region, excess oxygen contained in the insulator 224 can be inhibited from being extracted by the conductor 205. The conductor 205 can be inhibited from having increased resistance due to oxidation caused by excess oxygen.

The metal oxide 226 is provided at least between the oxide 230b and the insulator 224 including the excess-oxygen region. Note that the metal oxide 226 illustrated in FIG. 1 preferably has an insulating property.

As illustrated in FIG. 1B, the metal oxide 226 is positioned between the oxide 230b and the insulator 224. The oxide 230b and the conductor 240 (the conductor 240a and the conductor 240b) functioning as a source electrode and a drain electrode overlap with each other. Accordingly, the metal oxide 226 can inhibit movement or diffusion of excess oxygen contained in the insulator 224 into the oxide 230b.

By contrast, in the oxide 230b in a region overlapping with the conductor 240, oxygen is absorbed by the conductor 240 and oxygen vacancies are generated in the oxide 230b. The resistance of the oxide 230b is reduced by generation of the oxygen vacancies, so that the contact resistance between the region overlapping with the conductor 240 in the oxide 230b and the conductor 240 can be reduced.

As illustrated in FIG. 1C, the metal oxide 226 is removed in a region not overlapping with the oxide 230b but overlapping with the oxide 230c and the insulator 224. The oxide 230c and the metal oxide 226 include a region where they overlap with each other only in a region where the oxide 230b is between them. That is, the oxide 230c includes a region in contact with the insulator 224 in a region not overlapping with the oxide 230b.

Accordingly, the oxide 230c includes a region in contact with the insulator 224 in the vicinity of the channel formation region (see FIG. 1C). That is, excess oxygen contained in the insulator 224 passes through the oxide 230c and then is moved and diffused into the oxide 230b in a region overlapping with the conductor 260 with the insulator 250 therebetween. That is, in the transistor 200, excess oxygen contained in the insulator 224 is supplied to the channel formation region of the transistor 200, whereby oxygen vacancies generated in the region can be compensated for.

Note that the metal oxide 226 or the insulator 222 is preferably formed using an oxide containing an element having low Gibbs energy of formation in an Ellingham diagram such as aluminum (Al) or hafnium (Hf). Specifically, it is preferable that aluminum oxide, hafnium oxide, or the like be positioned between the conductor and the insulator including an excess-oxygen region.

The detailed structure of the semiconductor device including the transistor 200 of one embodiment of the present invention is described below.

As illustrated in FIG. 1, the transistor 200 has a structure in which the two layers of the oxide 230b and the oxide 230c are stacked in the channel formation region and the vicinity thereof; however, the present invention is not limited thereto. For example, one or both of the oxide 230b and the oxide 230c may have a stacked-layer structure of two or more layers and the oxide 230 may have a multilayer structure of three or more layers.

In the case where an In—Ga—Zn oxide is used as the oxide 230b, a metal oxide having In:Ga:Zn=4:2:3 [atomic ratio] or a composition in the vicinity thereof, or 1:1:1 [atomic ratio] or a composition in the vicinity thereof is preferably used.

The oxide 230b may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. Thus, the transistor 200 is stable with respect to high temperatures in a manufacturing process.

In the case where an In—Ga—Zn oxide is used as the oxide 230c, a metal oxide having In:Ga:Zn=1:3:4 [atomic ratio] or a composition in the vicinity thereof, In:Ga:Zn=4:2:3 [atomic ratio] or a composition in the vicinity thereof, In:Ga:Zn=5:1:3 [atomic ratio] or a composition in the vicinity thereof, In:Ga:Zn=10:1:3 [atomic ratio] or a composition in the vicinity thereof, Ga:Zn=2:1 [atomic ratio] or a composition in the vicinity thereof, or Ga:Zn=2:5 [atomic ratio] or a composition in the vicinity thereof may be used.

Specific examples of the oxide 230c having a stacked-layer structure include In:Ga:Zn=4:2:3 [atomic ratio] or a composition in the vicinity thereof and In:Ga:Zn=1:3:4 [atomic ratio] or a composition in the vicinity thereof, a stacked-layer structure of In:Ga:Zn=4:2:3 [atomic ratio] or a composition in the vicinity thereof and In:Ga:Zn=5:1:3 [atomic ratio] or a composition in the vicinity thereof, a stacked-layer structure of Ga:Zn=2:1 [atomic ratio] or a composition in the vicinity thereof and In:Ga:Zn=4:2:3 [atomic ratio] or a composition in the vicinity thereof, a stacked-layer structure of Ga:Zn=2:5 [atomic ratio] or a composition in the vicinity thereof and In:Ga:Zn=4:2:3 [atomic ratio] or a composition in the vicinity thereof, or a stacked-layer structure of gallium oxide and In:Ga:Zn=4:2:3 [atomic ratio] or a composition in the vicinity thereof. Note that a composition in the vicinity includes ±30% of an intended atomic ratio.

The conductor 205 is positioned to overlap with the oxide 230 and the conductor 260. The conductor 205 is preferably provided to be embedded in the insulator 216.

Here, the conductor 260 functions as a first gate (also referred to as a top gate) in some cases. The conductor 205 functions as a second gate (also referred to as a bottom gate) in some cases.

In the case where the conductor 205 functions as a gate electrode, by changing a potential applied to the conductor 205 independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. That is, by applying a negative potential to the conductor 205, a drain current when the potential applied to the conductor 260 is 0 V can be reduced.

Note that as illustrated in FIG. 1A, the conductor 205 is preferably provided so as to overlap with an end portion of the conductor 240a on the channel formation region side and an end portion of the conductor 240b on the channel formation region side. As illustrated in FIG. 1C, it is preferable that the conductor 205 extend to a region outside an end portion of the oxide 230b that intersects with the channel width direction. That is, the conductor 205 and the conductor 260 preferably overlap with each other with the insulators therebetween on an outer side of the side surface of the oxide 230b in the channel width direction.

Providing the conductor 205 with a large area can reduce local charging (referred to as charge up) in treatment using plasma in a manufacturing step after forming the conductor 205 in some cases. Note that one embodiment of the present invention is not limited thereto. The conductor 205 overlaps with at least the oxide 230b positioned between the conductor 240a and the conductor 240b.

Although the conductor 205 has a two-layer structure in the drawing, the structure is not limited to this. A single layer or a stacked-layer structure of three or more layers may be employed. For example, as illustrated in the drawing, in the case where the conductor 205 has a two-layer structure, a first conductor of the conductor 205 in contact with the insulator 216 is preferably a conductor that inhibits the transmission of oxygen and impurities such as water or hydrogen. For example, titanium, titanium nitride, tantalum, or tantalum nitride can be used. A conductive material containing tungsten, copper, or aluminum as its main component is preferably used for a second conductor of the conductor 205.

Here, it is preferable that an oxide semiconductor, an insulator or a conductor positioned below the oxide semiconductor, and an insulator or a conductor positioned over the oxide semiconductor, different kinds of films be successively deposited without being exposed to the air, in which case a substantially highly purified intrinsic oxide semiconductor film where the concentration of impurities (in particular, hydrogen and water) is reduced can be deposited.

For the insulator 274, a material that inhibits entry of impurities such as water or hydrogen into the transistor 200 from the substrate side or from above the transistor 200 (hereinafter also referred to as a material having a barrier property against impurities) is preferably used. In addition to the insulator 274, a material having a barrier property against impurities is preferably used for the insulator 222.

That is, for the insulator 274 and the insulator 222, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, and $NO_2$), and a copper atom (through which the above impurities are less likely to pass). Alternatively, it is preferable to use an insulating material having a function of inhibiting diffusion of oxygen (e.g., at least one of an oxygen atom, an oxygen molecule, and the like) (through which the above oxygen is less likely to pass).

For example, for the insulator 274 and the insulator 222, silicon nitride, silicon nitride oxide, aluminum oxide, hafnium oxide, or the like can be used. Although the insulator 274 and the insulator 222 each have a single-layer structure in the drawing, a stacked-layer structure of two or more layers may be employed. In the case where the insulator 274 and the insulator 222 each have a stacked-layer structure of two or more layers, a stacked-layer structure of silicon nitride or silicon nitride oxide and aluminum oxide or hafnium oxide may be employed.

Providing the insulator 274 can inhibit diffusion of impurities such as water or hydrogen into the transistor 200 side from the insulator 280 and the like through the insulator 274.

Providing the insulator 222 can inhibit diffusion of impurities such as water or hydrogen into the transistor 200 side from the substrate side through the insulator 222. Alternatively, oxygen contained in the insulator 224 or the like can be inhibited from being diffused into the substrate side through the insulator 222.

That is, the transistor 200 is preferably sealed with the insulator 222 and the insulator 274 having a function of inhibiting diffusion of oxygen and impurities such as water or hydrogen.

The insulator 222 and the insulator 224 have a function of a gate insulator. In the structure illustrated in FIG. 1, the metal oxide 226 has a function of a gate insulator.

Here, as described above, oxygen is preferably released from the insulator 224 by heating.

Furthermore, as described above, the insulator 222 preferably contains an element having lower Gibbs energy of formation in an Ellingham diagram than that in the conductor 205 and the insulator 216.

In particular, as the insulator 222, it is preferable to use an insulator containing an oxide of one or both of aluminum and hafnium which is an element having low Gibbs energy of formation in an Ellingham diagram. As the insulator containing an oxide of one or both of aluminum and hafnium, aluminum oxide, hafnium oxide, an oxide containing aluminum and hafnium (hafnium aluminate), or the like is preferably used.

In the case where a structure body in contact with a nitride film contains excess oxygen, the nitride film inhibits diffusion of the excess oxygen. A nitride such as silicon nitride may be used for the insulator 222.

Alternatively, aluminum oxide, bismuth oxide, germanium oxide, niobium oxide, silicon oxide, titanium oxide, tungsten oxide, yttrium oxide, or zirconium oxide may be stacked over these insulators, for example. Alternatively, these insulators may be subjected to nitriding treatment. Silicon oxide, silicon oxynitride, or silicon nitride may be stacked over the insulator.

Note that for the insulator 222, a material that inhibits entry of impurities such as water or hydrogen into the transistor 200 from the substrate side is preferably used. For example, the insulator 222 preferably has a lower diffusion coefficient of hydrogen than the insulator 224. Surrounding the insulator 224, the oxide 230, and the like by the insulator 222 and the insulator 274 can inhibit entry of impurities such as water or hydrogen into the transistor 200 from the outside.

When the insulator 222 is formed using the above material, the insulator 222 functions as a layer that inhibits release of oxygen from the oxide 230 and entry of impurities such as hydrogen from the periphery of the transistor 200 into the oxide 230.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 222. With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is maintained.

Note that the insulator 222 and the insulator 224 may each have a stacked-layer structure of two or more layers. In such cases, without limitation to a stacked-layer structure formed of the same material, a stacked-layer structure formed of different materials may be employed.

For the conductor 240, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 274 is provided in contact with a top surface of the conductor 240 and is preferably formed using a material having a barrier property against oxygen. Providing the insulator 274 can inhibit oxidation of the conductor 240 and an increase in the contact resistance between the transistor 200 and a wiring. Consequently, the transistor 200 can have favorable electrical characteristics and reliability.

In the case where the insulator 280 is an insulator including an excess-oxygen region, excess oxygen contained in the insulator 280 can be inhibited from being absorbed by the conductor 240.

Accordingly, it is preferable that the insulator 274 have a higher capability of inhibiting diffusion of oxygen than the insulator 280. An insulator containing an oxide of one or both of aluminum and hafnium is preferably deposited as the insulator 274, for example. An insulator containing aluminum nitride and silicon nitride may be used as the insulator 274, for example.

The insulator 250 functions as a gate insulator. The insulator 250 is preferably positioned in contact with a top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 224, the insulator 250 is preferably formed using an insulator from which oxygen is released by heating. When the insulator from which oxygen is released by heating is provided as the insulator 250 to be in contact with the top surface of the oxide 230c, oxygen can be effectively supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Although the conductor 260 has a two-layer structure in FIG. 1, a single-layer structure or a stacked-layer structure of three or more layers may be employed.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure; for example, a stacked-layer structure of titanium or titanium nitride and the above conductive material may be employed.

The insulator 280 and the insulator 274 function as interlayer films.

Here, like the insulator 224, the insulator 280 is formed using an insulator that releases oxygen by heating. Since the insulator 280 includes a region in contact with the oxide 230c, in the case where an excess-oxygen region is provided in the insulator 280, excess oxygen can be moved or diffused into the channel formation region of the transistor 200 through the oxide 230c. Accordingly, in the case where an excess-oxygen region is provided in the insulator 280, the description of the insulator 224 can be referred to.

Note that the insulator 280 preferably contains silicon oxide, silicon oxynitride, silicon nitride oxide, silicon oxide to which fluorine is added, silicon oxide to which carbon is added, silicon oxide to which carbon and nitrogen are added, porous silicon oxide, or the like.

In particular, silicon oxide and silicon oxynitride, which have thermal stability, are preferably used for the insulator 280. A material such as silicon oxide, silicon oxynitride, or porous silicon oxide is preferably used, in which case a region including oxygen that is released by heating can be easily formed. The insulator 280 may have a stacked-layer structure of the above materials, such as a stacked-layer structure of silicon oxide deposited by a sputtering method and silicon oxynitride deposited thereover by a CVD method. Furthermore, silicon nitride may be stacked thereover.

<<Modification Example 1 of Semiconductor Device>>

An example of a semiconductor device including the transistor 200 of one embodiment of the present invention is described below with reference to FIG. 2.

Figure 2A:
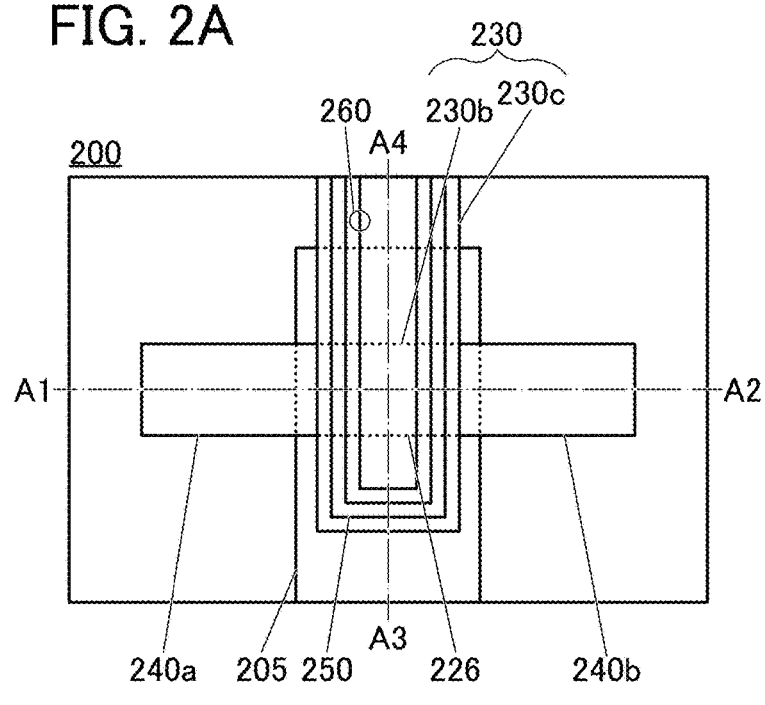
FIG. 2A is a top view of a semiconductor device.
Figure 2C:
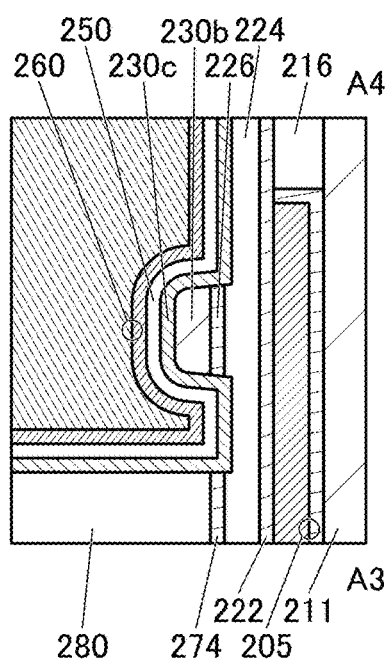
FIG. 2B and FIG. 2C are cross-sectional views of the semiconductor device.
Figure 2B:
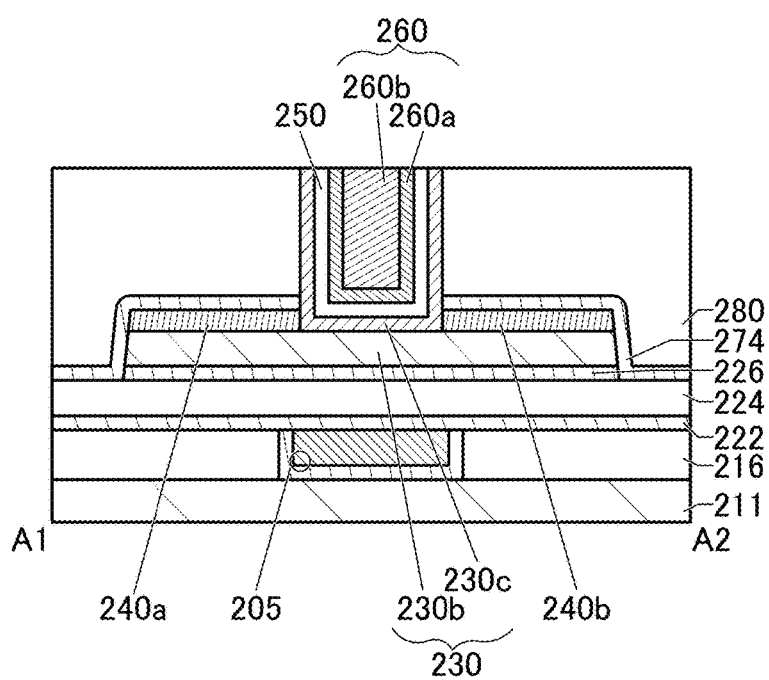

Here, FIG. 2A is a top view. FIG. 2B is a cross-sectional view corresponding to a portion indicated by dashed-dotted line A1-A2 in FIG. 2A. FIG. 2C is a cross-sectional view corresponding to a portion indicated by dashed-dotted line A3-A4 in FIG. 2A. For clarity of the drawing, some components are not illustrated in the top view of FIG. 2A.

The semiconductor device illustrated in FIG. 2 is different from the semiconductor device illustrated in FIG. 1 in the shape of the metal oxide 226. As illustrated in FIG. 2, the metal oxide 226 may be provided so as to have the same projected area as the oxide 230b. That is, the metal oxide 226 is provided only below the oxide 230b.

In the structure illustrated in FIG. 2, the metal oxide 226 is completely separated between the adjacent transistors. Thus, in the structure illustrated in FIG. 2, not only an insulating material but also a semiconductor material can be used for the metal oxide 226.

As a semiconductor material that can be used for the metal oxide 226, gallium oxide, zinc oxide, GZO (gallium zinc oxide), an In—Ga—Zn oxide used as the oxide 230, or an In—Ga—Zn oxide to which a small amount of impurities such as silicon (Si) is added can be used.

Note that in the case where an In—Ga—Zn oxide is used as the metal oxide 226, it is preferable to use an In—Ga—Zn oxide having a higher atomic proportion of Ga in all metal atoms than the In—Ga—Zn oxide used as the oxide 230b.

Specifically, as the metal oxide 226, a metal oxide having In:Ga:Zn=1:3:4 [atomic ratio] or a composition in the vicinity thereof, or 1:1:0.5 [atomic ratio] or a composition in the vicinity thereof may be used.

<<Modification Example 2 of Semiconductor Device>>

An example of a semiconductor device including the transistor 200 of one embodiment of the present invention is described below with reference to FIG. 3.

Figure 3A:
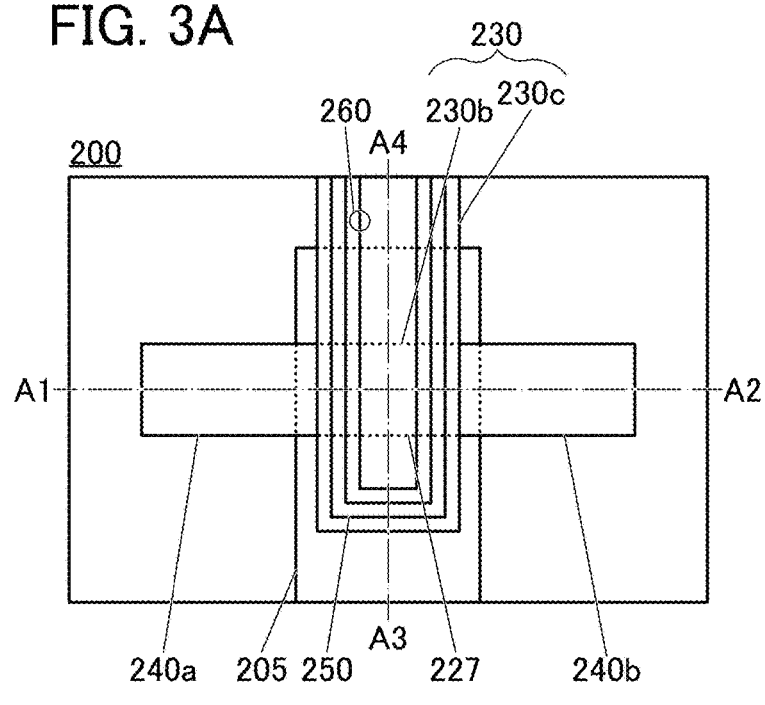
FIG. 3A is a top view of a semiconductor device.
Figure 3C:
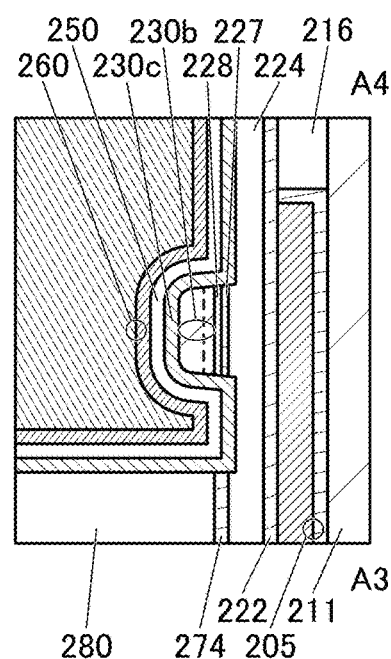
FIG. 3B and FIG. 3C are cross-sectional views of the semiconductor device.
Figure 3B:
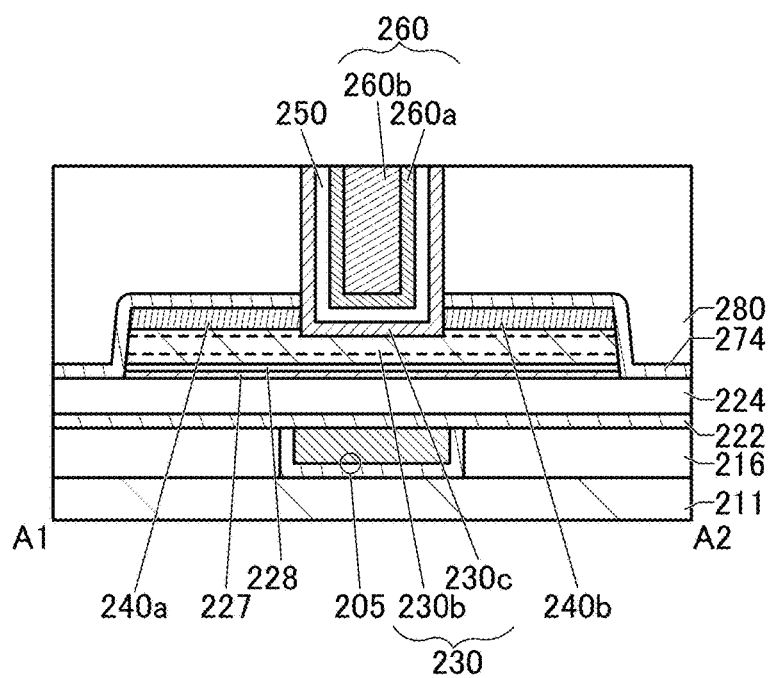

Here, FIG. 3A is a top view. FIG. 3B is a cross-sectional view corresponding to a portion indicated by dashed-dotted line A1-A2 in FIG. 3A. FIG. 3C is a cross-sectional view corresponding to a portion indicated by dashed-dotted line A3-A4 in FIG. 3A. For clarity of the drawing, some components are not illustrated in the top view of FIG. 3A.

For example, as illustrated in FIG. 3, an insulator 228 may be provided over a film 227 that inhibits diffusion of excess oxygen, instead of the metal oxide 226. Providing the insulator 228 can increase the degree of freedom in selecting the material for the film 227.

The insulator 228 may be an oxide containing an element having lower Gibbs energy of formation in an Ellingham diagram than that in the oxide 230. Specifically, for the insulator 228, silicon oxide, silicon oxynitride, silicon nitride oxide, silicon oxide to which fluorine is added, silicon oxide to which carbon is added, silicon oxide to which carbon and nitrogen are added, porous silicon oxide, or the like can be used.

Providing the insulator 228 makes it possible to use, as the film 227 that inhibits diffusion of excess oxygen, an In—Ga—Zn oxide or the like used as the oxide 230. In the case where an In—Ga—Zn oxide is used for the film 227 that inhibits diffusion of excess oxygen, excess oxygen contained in the insulator 224 is diffused into the film 227 that inhibits diffusion of excess oxygen. Meanwhile, excess oxygen diffused into the film 227 that inhibits diffusion of excess oxygen is inhibited from being moved and diffused into the insulator 228 from the film 227 that inhibits diffusion of excess oxygen.

Alternatively, for the film 227 that inhibits diffusion of excess oxygen, a metal oxide containing an element having lower Gibbs energy of formation in an Ellingham diagram than that in the insulator 228 may be used.

Alternatively, for the film 227 that inhibits diffusion of excess oxygen, a nitride such as silicon nitride may be used. In the case where a structure body in contact with a nitride film contains excess oxygen, the nitride film can inhibit diffusion of the excess oxygen.

Note that a stacked-layer structure formed of the insulators positioned between the conductor 205 and the oxide 230b and the film that inhibits diffusion of excess oxygen functions as a gate insulator. Thus, by selecting materials of the insulator 228 and the metal oxide 226 as appropriate, the equivalent oxide thickness (EOT) of the insulator functioning as the gate insulator can be decreased or increased.

Although not illustrated, when the thicknesses of the insulator 228 and the film 227 that inhibits diffusion of excess oxygen are increased, in the channel width direction, a bottom surface of the conductor 260 in a region not overlapping with the oxide 230b can be positioned at a lower level than a bottom surface of the oxide 230b, for example. Since the conductor 260 functioning as the gate covers a side surface and the top surface of the oxide 230b in the channel formation region with the oxide 230c and the insulator 250 therebetween, the electric field generated from the conductor 260 is likely to affect the entire channel formation region formed in the oxide 230b.

With such a structure, the transistor 200 can have a higher on-state current and improved frequency characteristics. In this specification, a transistor structure in which a channel formation region is electrically surrounded by electric fields of the first gate and the second gate is referred to as a surrounded channel (S-channel) structure.

The oxide 230b preferably has a stacked-layer structure of oxide layers (denoted by a dotted line in FIG. 3B and FIG. 3C) which differ in the atomic ratio of metal atoms.

Specifically, in FIG. 3B and FIG. 3C, the oxide 230b includes a first layer in contact with the insulator 228, a second layer over the first layer, and a third layer positioned between the second layer and the conductor 240.

The atomic proportion of the element M in constituent elements in a metal oxide used for the first layer of the oxide 230b is preferably greater than the atomic proportion of the element M in constituent elements in a metal oxide used for the second layer of the oxide 230b. Moreover, the atomic ratio of the element M to In in the metal oxide used for the first layer of the oxide 230b is preferably greater than the atomic ratio of the element M to In in the metal oxide used for the second layer of the oxide 230b. Moreover, the atomic ratio of In to the element M in the metal oxide used for the second layer of the oxide 230b is preferably greater than the atomic ratio In to the element M in the metal oxide used for the first layer of the oxide 230b.

When the first layer of the oxide 230b is provided, impurities can be inhibited from being diffused into the second layer of the oxide 230b from the components formed below the first layer.

The third layer of the oxide 230b preferably has a function of inhibiting transmission of oxygen. That is, when the third layer of the oxide 230b is placed between the conductor 240 and the second layer of the oxide 230b, oxygen in the second layer of the oxide 230b can be inhibited from being extracted by the conductor 240.

A metal oxide containing the element M may be used for the third layer of the oxide 230b. In particular, aluminum, gallium, yttrium, or tin is preferably used as the element M. The third layer of the oxide 230b preferably has a higher concentration of the element M than the second layer of the oxide 230b.

A metal oxide such as an In-M-Zn oxide may be used for the third layer of the oxide 230b. Specifically, the atomic ratio of the element M to In in the metal oxide used for the third layer of the oxide 230b is preferably greater than the atomic ratio of the element M to In in the metal oxide used for the second layer of the oxide 230b. The thickness of the third layer of the oxide 230b is preferably greater than or equal to 0.5 nm and less than or equal to 5 nm, further preferably greater than or equal to 1 nm and less than or equal to 3 nm. The third layer of the oxide 230b preferably has crystallinity. With the third layer of the oxide 230b having crystallinity, release of oxygen in the oxide 230b can be favorably inhibited. When the third layer of the oxide 230b has a hexagonal crystal structure, for example, release of oxygen in the oxide 230b can sometimes be inhibited.

<<Metal Oxide>>

As the oxide 230, a metal oxide functioning as an oxide semiconductor is preferably used. A metal oxide that can be used as the oxide 230 according to the present invention is described below.

The metal oxide preferably contains at least indium or zinc. In particular, indium and zinc are preferably contained. Furthermore, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide is described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above-described defect states may include a trap state. Charges trapped by the trap states in the metal oxide take a long time to disappear and may behave like fixed charges. Thus, a transistor whose channel formation region includes a metal oxide having a high density of trap states has unstable electrical characteristics in some cases.

If the impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in the channel formation region of the oxide semiconductor and the vicinity thereof is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1\times10^{18}$ atoms/cm$^3$, preferably lower than or equal to $2\times10^{16}$ atoms/cm$^3$ in the channel formation region of the oxide semiconductor and the vicinity thereof. Alternatively, the concentration of the above impurities obtained by element analysis using EDX is lower than or equal to 1.0 atomic % in the channel formation region of the oxide semiconductor and the vicinity thereof. When an oxide containing the element M is used as the oxide semiconductor, the concentration ratio of the above impurities to the element M is lower than 0.10, preferably lower than 0.05 in the channel formation region of the oxide semiconductor and the vicinity thereof. Here, the concentration of the element M used in the calculation of the concentration ratio may be a concentration in a region that is the same as the region whose concertation of the above impurities is calculated or may be a concentration in the oxide semiconductor.

A metal oxide with a low impurity concentration has a low density of defect states and thus has a low density of trap states in some cases.

An oxide semiconductor with a low carrier concentration is preferably used for a transistor. In order to reduce the carrier concentration of the oxide semiconductor, the impurity concentration in the oxide semiconductor is reduced so that the density of defect states is reduced. In this specification and the like, a state with a low impurity concentration and a low density of defect states is referred to as a highly purified intrinsic or substantially highly purified intrinsic state. Examples of the impurities in the oxide semiconductor include hydrogen, nitrogen, alkali metal, alkaline earth metal, iron, nickel, and silicon.

The carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet still further preferably lower than $1\times10^{13}$ cm$^{-3}$, yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

According to one embodiment of the present invention, a semiconductor device having favorable reliability can be provided. According to another embodiment of the present invention, a semiconductor device having favorable electrical characteristics can be provided. According to another embodiment of the present invention, a semiconductor device having a high on-state current can be provided. According to another embodiment of the present invention, a semiconductor device that can be miniaturized or highly integrated can be provided. According to another embodiment of the present invention, a semiconductor device with low power consumption can be provided.

<Manufacturing Method of Semiconductor Device>

Next, a method for manufacturing a semiconductor device that includes the transistor 200 according to the present invention illustrated in FIG. 1 is described with reference to FIG. 4 to FIG. 8. In FIG. 4 to FIG. 8, A in each drawing is atop view. Moreover, B of each drawing is a cross-sectional view corresponding to a portion indicated by dashed-dotted line A1-A2 in A, and is also a cross-sectional view of the transistor 200 in the channel length direction. Furthermore, C of each drawing is a cross-sectional view corresponding to a portion indicated by dashed-dotted line A3-A4 in A, and is also a cross-sectional view of the transistor 200 in the channel width direction. Furthermore, D of each drawing is a cross-sectional view corresponding to a portion indicated by dashed-dotted line A5-A6 in A. Note that for simplification of the drawing, some components are not illustrated in the top view of A of each drawing.

First, the substrate 211 is prepared, and the insulator 216 is deposited over the substrate 211. The insulator 216 can be deposited by a sputtering method, a chemical vapor deposition method, a molecular beam epitaxy (MBE) method, a pulsed laser deposition (PLD) method, an ALD method, or the like.

Note that the CVD methods can be classified into a plasma enhanced CVD (PECVD) method using plasma, a thermal CVD method using heat, a photo CVD method using light, and the like. Moreover, the CVD methods can be classified into a metal CVD method and a metal organic CVD method depending on a source gas to be used. In addition, according to the pressure in deposition, the CVD methods can be classified into an atmospheric pressure CVD method, in which deposition is performed under the atmospheric pressure, a low pressure CVD method, in which deposition is performed under pressure lower than the atmospheric pressure.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As the ALD method, a thermal ALD method, in which a precursor and a reactant react with each other only by a thermal energy, a PEALD (Plasma Enhanced ALD) method, in which a reactant excited by plasma is used, and the like can be used.

In an ALD method, one atomic layer can be deposited at a time using self-regulating characteristics of atoms. Thus, an ALD method has advantages such as deposition of an extremely thin film, deposition on a component with a high aspect ratio, deposition of a film with a small number of defects such as pinholes, deposition with good coverage, and low-temperature deposition. In the PEALD method, the use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles released from a target or the like are deposited, a CVD method and an ALD method are deposition methods in which a film is deposited by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method and an ALD method, a film with a certain composition can be deposited depending on the flow rate ratio of the source gases. Moreover, by a CVD method or an ALD method, by changing the flow rate ratio of the source gases during the deposition, a film whose composition is continuously changed can be deposited. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 216, silicon nitride is deposited by a CVD method. The insulator 216 can be deposited by a sputtering method, a CVD method, an MBE method, a PLD method, an ALD method, or the like. In this embodiment, silicon oxide or silicon oxynitride is used for the insulator 216. The insulator 216 is preferably deposited by a deposition method using a gas in which hydrogen atoms are reduced or removed. Thus, the hydrogen concentration of the insulator 216 can be reduced.

Then, an opening reaching the substrate 211 is formed in the insulator 216. A groove and a slit, for example, are included in the category of the opening. A region where an opening is formed may be referred to as an opening portion. Wet etching can be used for the formation of the opening; however, dry etching is preferably used for microfabrication.

After the formation of the opening, a conductive film to be the conductor 205 is deposited. The conductive film preferably includes a conductor that has a function of inhibiting transmission of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In this embodiment, the conductive film to be the conductor 205 has a multilayer structure. First, tantalum nitride is deposited by a sputtering method, and titanium nitride is stacked over the tantalum nitride. Then, a low-resistant conductive material such as copper is deposited by a plating method, a sputtering method, a CVD method, an MBE method, a PLD method, an ALD method, or the like.

When the conductor 205 has a stacked-layer structure including a metal nitride, a metal that is likely to be diffused, such as copper, can be prevented from being diffused to the outside of the conductor 205.

Next, CMP treatment (Chemical Mechanical Polishing) is performed to remove part of the conductive film to be the conductor 205, so that the insulator 216 is exposed. As a result, the conductor 205 remains only in the opening portion. That is, the conductor 205 with a flat top surface can be formed. Note that the insulator 216 is partly removed by the CMP treatment in some cases (see FIG. 4).

Although the conductor 205 is embedded in the opening of the insulator 216 in this embodiment, this embodiment is not limited to this structure. For example, the surface of the conductor 205 may be exposed in the following manner: the conductor 205 is formed over the substrate 211, the insulator 216 is deposited over the conductor 205, and the insulator 216 is subjected to the CMP treatment so that the insulator 216 is partly removed.

Next, the insulator 222 is deposited over the insulator 216 and the conductor 205. A material having relatively low Gibbs energy of formation in an Ellingham diagram is preferably used for the insulator 222.

Specifically, an insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used.

The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, the insulator 224 is deposited over the insulator 222. The insulator 224 can be deposited by a sputtering method, a CVD method, an MBE method, a PLD method, an ALD method, or the like. In this embodiment, silicon oxide or silicon oxynitride is used for the insulator 224.

Note that the insulator 224 is in contact with the oxide 230c in a later step, and thus the hydrogen concentration in the insulator 224 is preferably reduced. Accordingly, the insulator 224 is preferably deposited by a deposition method using a gas in which hydrogen atoms are reduced or removed. Thus, the hydrogen concentration in the insulator 224 can be reduced.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere, an inert gas atmosphere, or an atmosphere containing an oxidizing gas at higher than or equal to 10 ppm, higher than or equal to 1%, or higher than or equal to 10%. The heat treatment may be performed under reduced pressure. Alternatively, the heat treatment may be performed in such a manner that heat treatment is performed in a nitrogen or inert gas atmosphere, and then another heat treatment is performed in an atmosphere containing an oxidizing gas at higher than or equal to 10 ppm, higher than or equal to 1%, or higher than or equal to 10% in order to compensate for released oxygen.

In this embodiment, treatment is performed at 400° C. in a nitrogen atmosphere for one hour, and another treatment is successively performed at 400° C. in an oxygen atmosphere for one hour. By the heat treatment, impurities such as water or hydrogen contained in the insulator 224 can be removed.

Heat treatment may be performed after the insulator 222 is deposited. For the heat treatment, the above-described heat treatment conditions can be used.

Here, in order to provide an excess-oxygen region in the insulator 224, oxygen (at least including any of oxygen radicals, oxygen atoms, and oxygen ions) is introduced into the insulator 224, so that a region containing excess oxygen is formed.

For example, in order to form an excess-oxygen region, oxygen may be supplied to the insulator 224 by one or more methods selected from an ion implantation method, an ion doping method, plasma treatment, and a plasma immersion ion implantation method. In that case, an ion implantation method by which an ionized source gas is subjected to mass separation and then added is preferably used, in which case oxygen can be supplied to the insulator 224 with high controllability.

For example, plasma treatment containing oxygen may be performed under reduced pressure so that an excess-oxygen region can be formed in the insulator 224. For the plasma treatment containing oxygen, an apparatus including a power source for generating high-density plasma using a microwave is preferably used, for example. Alternatively, a power source may be provided to apply a high-frequency wave such as RF to the substrate side. The use of high-density plasma enables high-density oxygen radicals to be generated, and RF application to the substrate side allows the oxygen radicals generated by the high-density plasma to be efficiently introduced into the insulator 224. Alternatively, after plasma treatment containing an inert gas is performed using this apparatus, plasma treatment containing oxygen may be performed to compensate for released oxygen. Note that impurities such as water or hydrogen contained in the insulator 224 can be removed by selecting the conditions of the plasma treatment appropriately. In that case, the heat treatment does not need to be performed.

Specifically, a method for stacking oxides over the insulator 224 using a sputtering apparatus is given as an example of the oxygen introduction treatment. For example, when the deposition in an oxygen gas atmosphere using a sputtering apparatus is employed as a means for depositing the oxide, oxygen can be introduced into the insulator 224 while the oxide is deposited.

In this embodiment, the metal oxide 226 to be deposited over the insulator 224 is preferably deposited by a sputtering method in an oxygen gas atmosphere. Oxygen can be added to the insulator 224 at the same time as depositing the metal oxide 226 is deposited over the insulator 224.

Figure 4A:
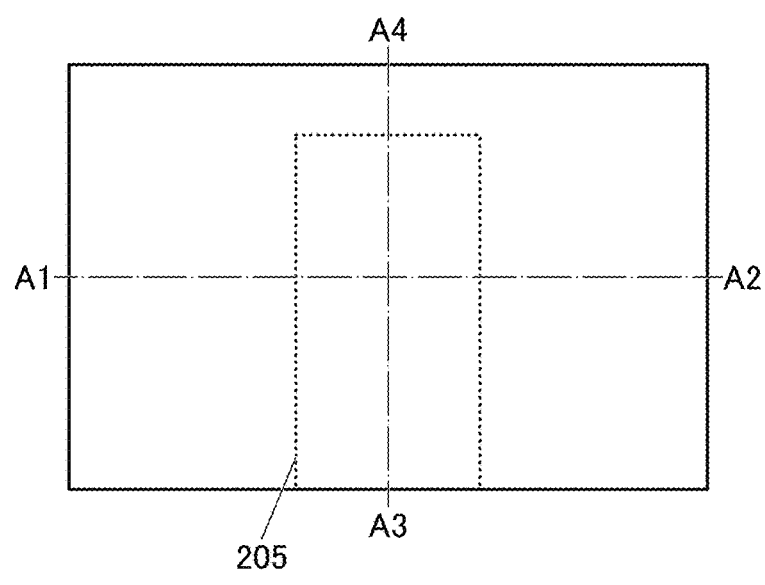
FIG. 4A is a top view illustrating a method for manufacturing a semiconductor device.
Figure 4C:
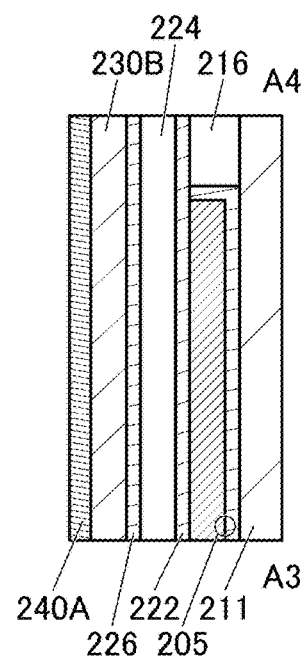
FIG. 4B and FIG. 4C are cross-sectional views illustrating the method for manufacturing the semiconductor device.
Figure 4B:
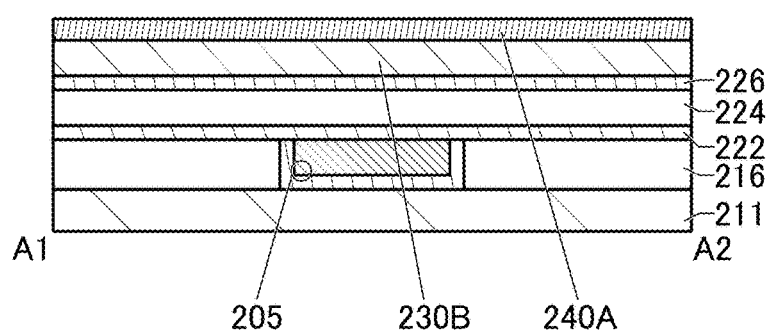

Next, an oxide film 230B is deposited over an insulator 226 (see FIG. 4). The oxide film 230B can be deposited by a sputtering method, a CVD method, an MBE method, a PLD method, an ALD method, or the like.

For example, in the case where the oxide film 230B is deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, a target of the above-described In-M-Zn oxide can be used.

Next, heat treatment may be performed. For the heat treatment, the above-described heat treatment conditions can be used. Through the heat treatment, impurities such as water or hydrogen in the oxide film 230B can be removed, for example. In this embodiment, treatment is performed at 400° C. in a nitrogen atmosphere for one hour, and another treatment is successively performed at 400° C. in an oxygen atmosphere for one hour.

Next, a conductive film 240A is deposited over the oxide film 230B (see FIG. 4). The conductive film 240A can be deposited by a sputtering method, a CVD method, an MBE method, a PLD method, an ALD method, or the like.

Figure 5A:
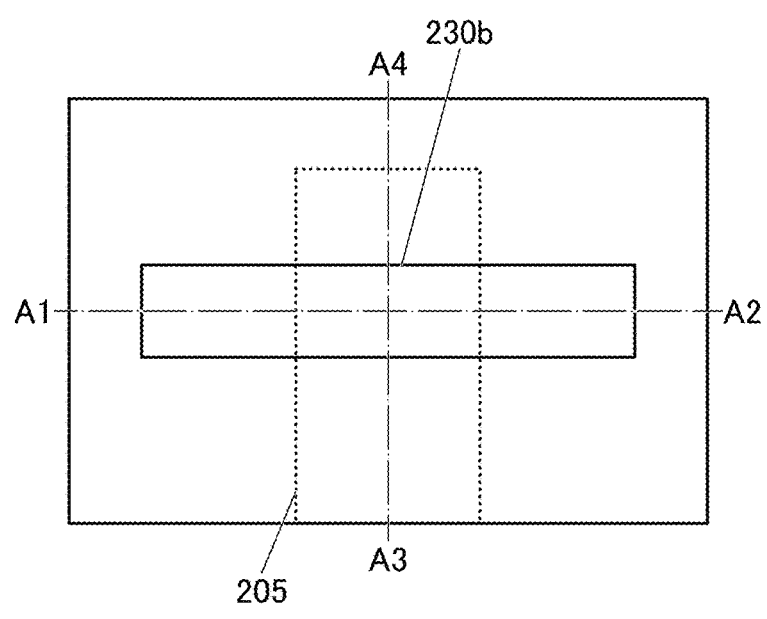
FIG. 5A is a top view illustrating a method for manufacturing a semiconductor device.
Figure 5C:
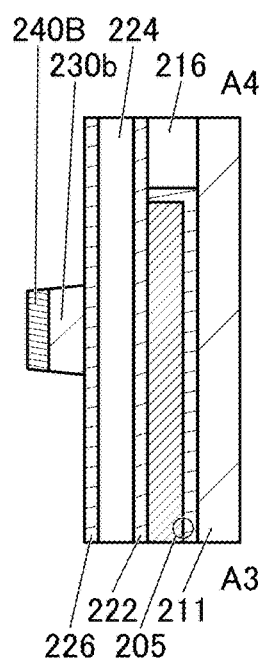
FIG. 5B and FIG. 5C are cross-sectional views illustrating the method for manufacturing the semiconductor device.
Figure 5B:
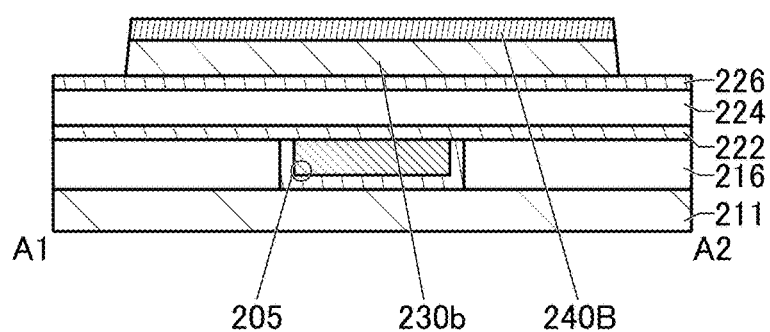

Next, the oxide film 230B and the conductive film 240A are processed to have an island shape by a lithography method to form the oxide 230b and a conductive layer 240B (see FIG. 5). Here, the oxide 230b and the conductive layer 240B are formed to at least partly overlap with the conductor 205. A dry etching method or a wet etching method can be used for the processing. Processing by a dry etching method is suitable for microfabrication. Note that in this step, the thickness of the metal oxide 226 in a region which does not overlap with the oxide 230b is reduced in some cases.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film 240A, forming a resist mask thereover, and then etching the hard mask material. The etching of the conductive film 240A and the like may be performed after removing the resist mask or with the resist mask remaining. In the latter case, the resist mask sometimes disappears during the etching. The hard mask may be removed by etching after the etching of the conductive film 240A and the like. Meanwhile, the hard mask is not necessarily removed when the hard mask material does not affect subsequent steps or can be utilized in the subsequent steps.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

It is preferable that the side surfaces of the oxide 230b and the conductive layer 240B be substantially perpendicular to a top surface of the insulator 222. When the side surfaces of the oxide 230b and the conductive layer 240B are substantially perpendicular to the top surface of the insulator 222, a plurality of transistors 200 can be provided in a smaller area and with a higher density. Note that without being limited thereto, a structure may be employed in which an angle formed by the side surfaces of the oxide 230b and the conductive layer 240B and the top surface of the insulator 222 is a small angle.

Figure 6A:
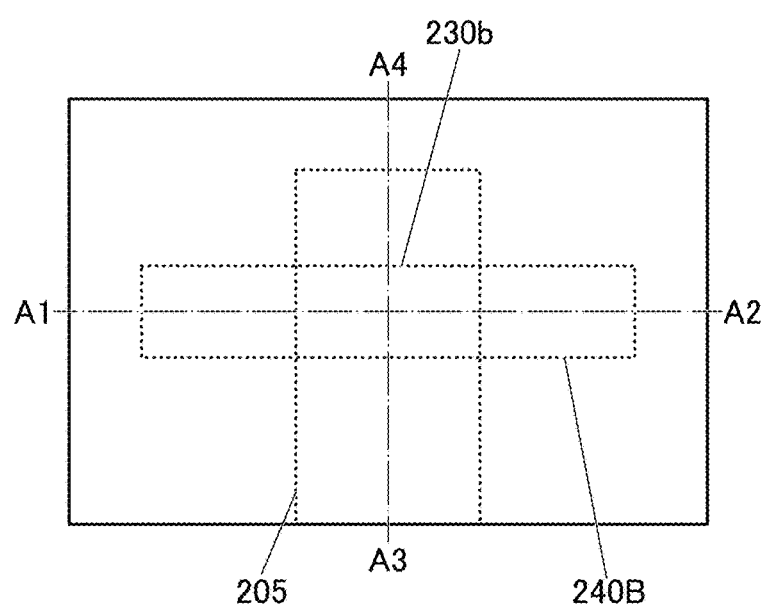
FIG. 6A is a top view illustrating a method for manufacturing a semiconductor device.
Figure 6C:
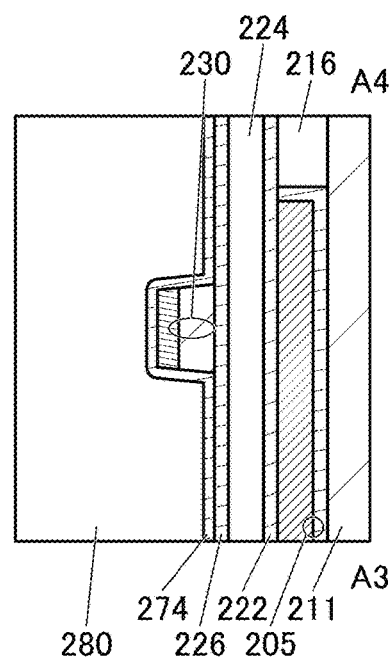
FIG. 6B and FIG. 6C are cross-sectional views illustrating the method for manufacturing the semiconductor device.
Figure 6B:
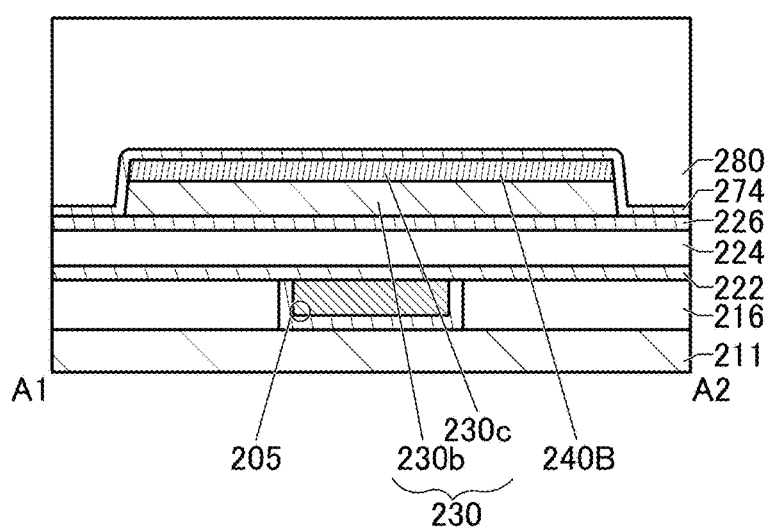

Next, the insulator 274 and the insulator 280 are deposited over the metal oxide 226, the oxide 230b, and the conductive layer 240B (see FIG. 6). The insulator 274 can be deposited by a sputtering method, a CVD method, an MBE method, a PLD method, an ALD method, or the like.

In this embodiment, for the insulator 274, aluminum oxide is deposited by a sputtering method. When aluminum oxide is deposited by a sputtering method, oxygen can be injected into the insulator 224. Alternatively, for the insulator 274, silicon nitride may be deposited by a sputtering method.

The insulator 280 can be deposited by a sputtering method, a CVD method, an MBE method, a PLD method, an ALD method, or the like.

For example, as the insulator 280, a silicon oxide film is deposited by a sputtering method and another silicon oxide film is deposited thereover by a PEALD method or a thermal ALD method. The insulator 280 is preferably deposited by the deposition method using the gas in which hydrogen atoms are reduced or removed. Thus, the hydrogen concentration of the insulator 280 can be reduced.

Next, the insulator 280 is subjected to CMP treatment, so that the insulator 280 having a flat top surface is formed (see FIG. 6). Note that in a manner similar to that of the insulator 224, aluminum oxide may be deposited over the insulator 280 by a sputtering method, for example, and the aluminum oxide may be subjected to CMP until the insulator 280 is reached.

Figure 7A:
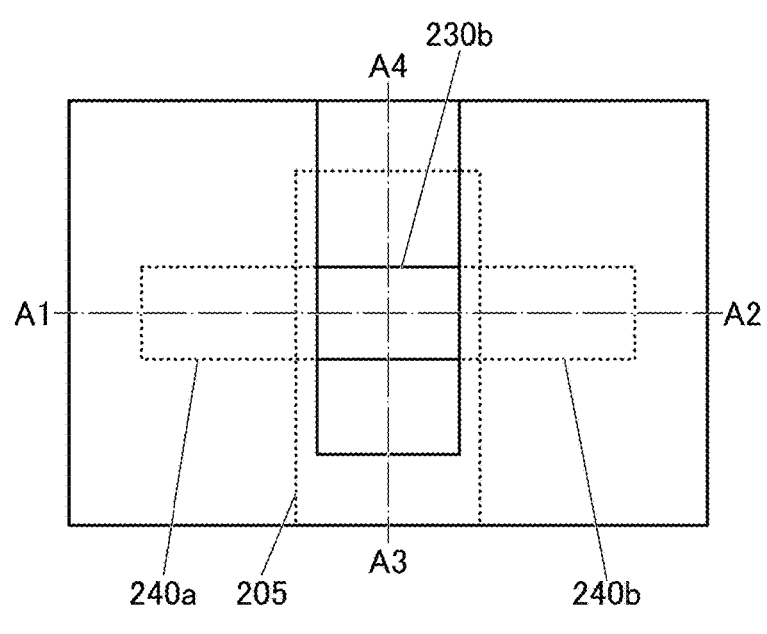
FIG. 7A is a top view illustrating a method for manufacturing a semiconductor device.
Figure 7C:
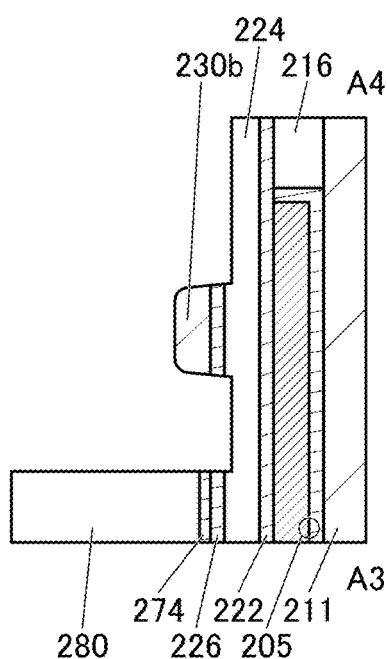
FIG. 7B and FIG. 7C are cross-sectional views illustrating the method for manufacturing the semiconductor device.
Figure 7B:
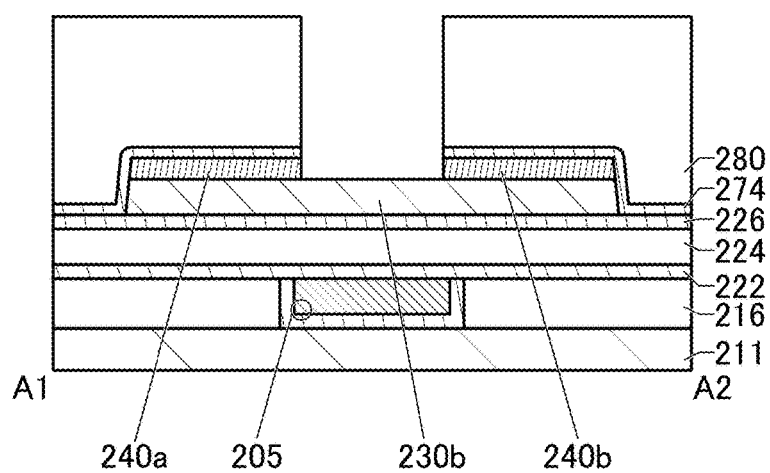

Then, part of the insulator 280, part of the insulator 274, part of the conductive layer 240B, and part of the metal oxide 226 are processed to form an opening reaching the oxide 230b and the insulator 224 (see FIG. 7).

Note that the opening is preferably formed to overlap with the conductor 205. The conductor 240a and the conductor 240b are formed by the formation of the opening.

The part of the insulator 280, the part of the insulator 274, the part of the conductive layer 240B, and the part of the metal oxide 226 can be processed by a dry etching method or a wet etching method. Processing by a dry etching method is suitable for microfabrication. The processing may be performed under different conditions. For example, the part of the insulator 280 may be processed by a dry etching method, the part of the insulator 274 may be processed by a wet etching method, the part of the conductive layer 240B may be processed by a dry etching method, and the metal oxide 226 may be processed by a wet etching method.

In some cases, the treatment such as the dry etching performed thus far causes the attachment or diffusion of impurities due to an etching gas or the like to a surface or an inside of the oxide 230b or the like. Examples of the impurities include fluorine and chlorine.

In order to remove the above impurities and the like, cleaning is preferably performed. Examples of the cleaning method include wet cleaning using a cleaning solution or the like, plasma treatment using plasma, and cleaning by heat treatment, and any of these cleanings may be performed in appropriate combination.

The wet cleaning can be performed using an aqueous solution in which oxalic acid, phosphoric acid, ammonia water, hydrofluoric acid, or the like is diluted with carbonated water or pure water. Alternatively, ultrasonic cleaning using pure water or carbonated water can be performed.

After the etching or the cleaning, heat treatment may be performed. The heat treatment is performed at a temperature higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at higher than or equal to 10 ppm, higher than or equal to 1%, or higher than or equal to 10%. For example, the heat treatment is preferably performed in an oxygen atmosphere. This provides oxygen to the oxide 230b, and reduces oxygen vacancies Vo. The heat treatment may be performed under reduced pressure. Alternatively, the heat treatment may be performed in such a manner that heat treatment is performed in an oxygen atmosphere, and then another heat treatment is successively performed in a nitrogen atmosphere without exposure to air.

Figure 8A:
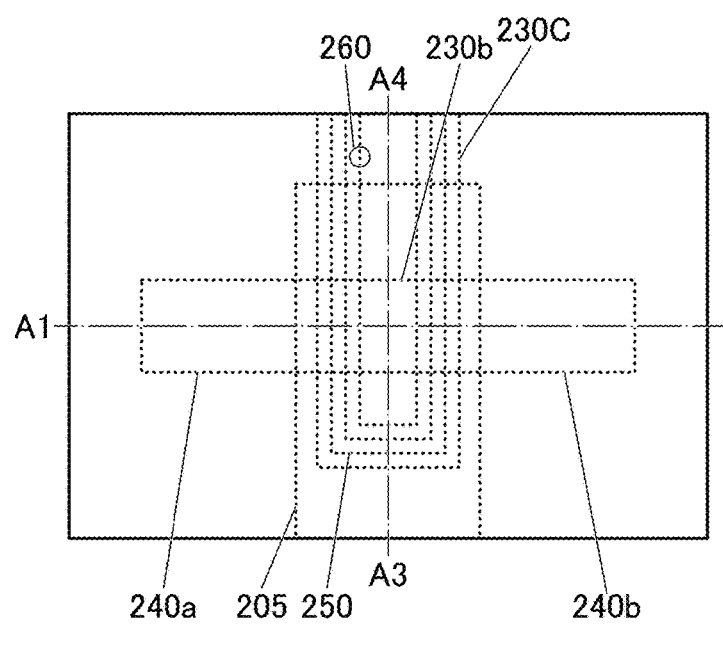
FIG. 8A is a top view illustrating a method for manufacturing a semiconductor device.
Figure 8C:
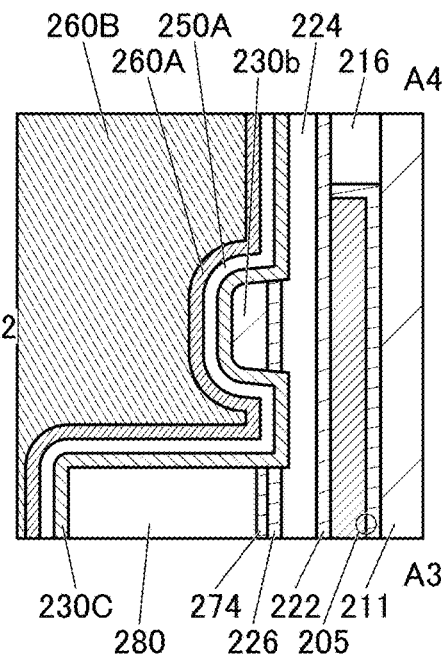
FIG. 8B and FIG. 8C are cross-sectional views illustrating the method for manufacturing the semiconductor device.
Figure 8B:
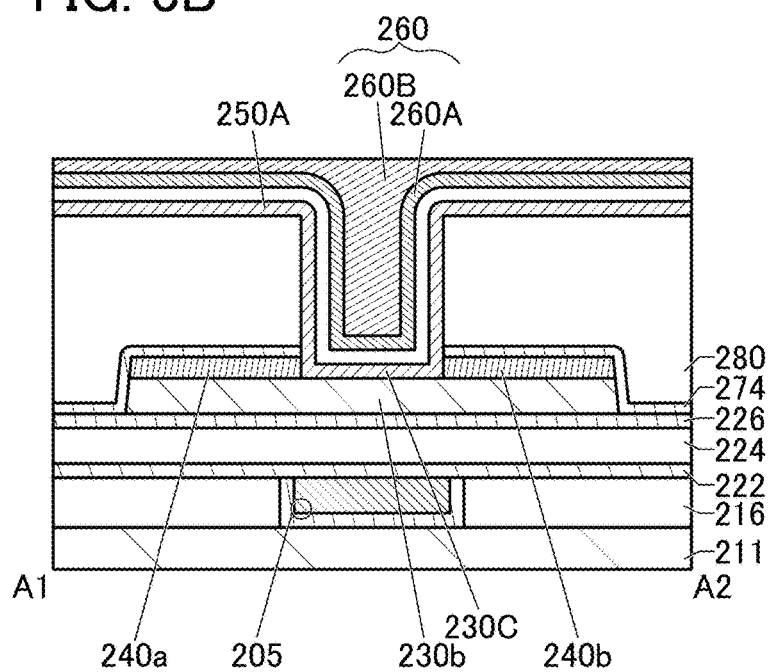

Next, an oxide film 230C is deposited (see FIG. 8). Heat treatment may be performed before deposition of the oxide film 230C, and it is preferable that the heat treatment be performed under reduced pressure and that the oxide film 230C be successively deposited without exposure to the air. The heat treatment is preferably performed in an atmosphere containing oxygen. The heat treatment can remove moisture and hydrogen adsorbed onto the surface of the oxide 230b and the like, and further can reduce the moisture concentration and the hydrogen concentration of the oxide 230b. The heat treatment is preferably performed at a temperature higher than or equal to 100° C. and lower than or equal to 400° C., further preferably higher than or equal to 150° C. and lower than or equal to 350° C. In this embodiment, the heat treatment is performed at 200° C. under reduced pressure.

Here, it is preferable that the oxide film 230C be provided in contact with at least part of a top surface of the insulator 224, part of the top surface of the oxide 230b, part of side surfaces of the conductor 240, part of side surfaces of the insulator 274, and part of side surfaces of the insulator 280. When the oxide film 230C is in contact with the insulator 224, the excess oxygen contained in the insulator 224 can be moved or diffused into the oxide 230b through the oxide film 230C.

The oxide film 230C can be deposited by a sputtering method, a CVD method, an MBE method, a PLD method, an ALD method, or the like. The atomic ratio of Ga to In in the oxide film 230C is preferably greater than the atomic ratio of Ga to In in the oxide film 230B. In this embodiment, the oxide film 230C is deposited by a sputtering method using a target with In:Ga:Zn=1:3:4 [atomic ratio].

Note that the oxide film 230C may have a stacked-layer structure. For example, the oxide film 230C may be deposited by a sputtering method using a target of In:Ga:Zn=4:2:4.1 [atomic ratio] and successively deposited using a target of In:Ga:Zn=1:3:4 [atomic ratio].

In the deposition of the oxide film 230C, part of oxygen contained in the sputtering gas is sometimes supplied to the oxide 230b. Alternatively, in the deposition of the oxide film 230C, part of oxygen contained in the sputtering gas is supplied to the insulator 280 in some cases. Therefore, the proportion of oxygen contained in the sputtering gas for the oxide film 230C is preferably higher than or equal to 70%, further preferably higher than or equal to 80%, still further preferably 100%.

Next, heat treatment may be performed. The heat treatment may be performed under reduced pressure, and deposition of an insulating film 250A may be successively performed without exposure to the air. The heat treatment can remove moisture and hydrogen adsorbed onto the surface of the oxide film 230C and the like, and further can reduce the moisture concentration and the hydrogen concentration of the oxide 230b and the oxide film 230C. The heat treatment is preferably performed at a temperature higher than or equal to 100° C. and lower than or equal to 400° C. In this embodiment, the heat treatment is performed at 200° C.

Next, the insulating film 250A is deposited over the oxide film 230C (see FIG. 8). The insulating film 250A can be deposited by a sputtering method, a CVD method, an MBE method, a PLD method, an ALD method, or the like. The insulating film 250A is preferably deposited by the deposition method using the gas in which hydrogen atoms are reduced or removed. Thus, the hydrogen concentration of the insulating film 250A can be reduced. The hydrogen concentration is preferably reduced because the insulating film 250A becomes the insulator 250 that is in contact with the oxide 230c in a later step.

Next, an oxygen gas may be made into a plasma state with a microwave or a high-frequency wave such as RF to form oxygen radicals. That is, plasma treatment may be performed on the insulator 280, the insulating film 250A, and the oxide 230b in an atmosphere containing oxygen. Such treatment is sometimes referred to as oxygen plasma treatment below. The formed oxygen radicals can supply oxygen to the insulator 280 and the oxide 230b. In the case where the plasma treatment is performed on the insulator 280 and the oxide 230b in an atmosphere containing oxygen, the oxide 230 may be less likely to be irradiated with a microwave or a high-frequency wave such as RF.

Note that for the oxygen plasma treatment, a microwave treatment apparatus including a power source for generating high-density plasma using a microwave is preferably used, for example. The microwave treatment apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the insulator 280 and the oxide 230. The oxygen plasma treatment is preferably performed under reduced pressure, and the pressure is set to be 60 Pa or higher, preferably 133 Pa or higher, further preferably 200 Pa or higher, and still further preferably 400 Pa or higher. Furthermore, the oxygen flow rate ($O_2/O_2+Ar$) is lower than or equal to 50%, preferably higher than or equal to 10% and lower than or equal to 30%. The treatment is performed at approximately 400° C., for example. After the oxygen plasma treatment, heat treatment may be successively performed without exposure to the air.

Next, a conductive film 260A and a conductive film 260B are deposited (see FIG. 8). The conductive film 260A and the conductive film 260B can be deposited by a sputtering method, a CVD method, an MBE method, a PLD method, an ALD method, or the like. A CVD method is preferably used, for example. In this embodiment, the conductive film 260A is deposited by an ALD method, and the conductive film 260B is deposited by a CVD method.

Then, the oxide film 230C, the insulating film 250A, the conductive film 260A, and the conductive film 260B are polished by CMP treatment until the insulator 280 is exposed, so that the oxide 230c, the insulator 250, and the conductor 260 (the conductor 260a and the conductor 260b) are formed (see FIG. 1).

Through the above process, the semiconductor device including the transistor 200 illustrated in FIG. 1 can be manufactured. As illustrated in FIG. 4 to FIG. 8, with the use of the method for manufacturing the semiconductor device described in this embodiment, the transistor 200 can be formed.

<<Modification Example 1 of Semiconductor Device>>

An example of a semiconductor device including the transistor 200 of one embodiment of the present invention is described below with reference to FIG. 9.

Figure 9A:
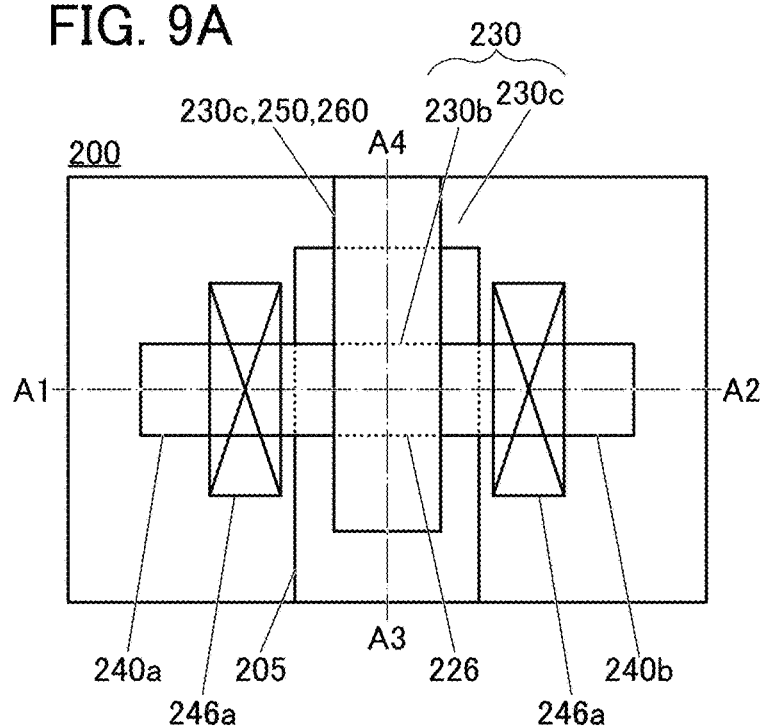
FIG. 9A is a top view illustrating a method for manufacturing a semiconductor device.
Figure 9C:
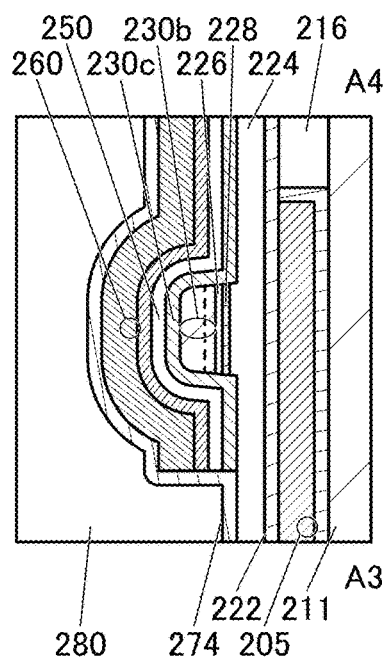
FIG. 9B and FIG. 9C are cross-sectional views illustrating the method for manufacturing the semiconductor device.
Figure 9B:
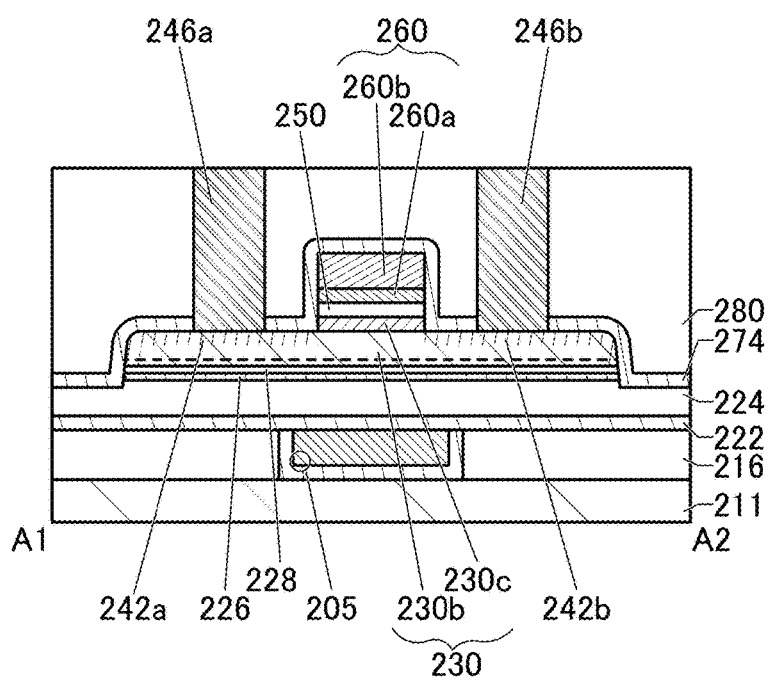

Here, FIG. 9A is a top view. FIG. 9B is a cross-sectional view corresponding to a portion indicated by dashed-dotted line A1-A2 in FIG. 9A. FIG. 9C is a cross-sectional view corresponding to a portion indicated by dashed-dotted line A3-A4 in FIG. 9A. For clarity of the drawing, some components are not illustrated in the top view of FIG. 9A.

The semiconductor device illustrated in FIG. 9 is different from the semiconductor device illustrated in FIG. 3 in the shape of the transistor.

Specifically, after the oxide 230b is formed, an oxide film to be the oxide 230c, an insulating film to be the insulator 250, and a conductive film to be the conductor 260 are deposited. Then, the conductor 260 functioning as a gate electrode, the insulator 250 functioning as a gate insulator, and the oxide 230c are processed using a mask, whereby the structure illustrated in FIG. 9 can be obtained.

As illustrated in FIG. 9, the conductor 240 functioning as a source electrode or a drain electrode is not necessarily provided.

Here, when hydrogen or nitrogen is added to an oxide semiconductor, the carrier density is increased. Furthermore, hydrogen added to an oxide semiconductor reacts with oxygen bonded to a metal atom to be water, and thus forms an oxygen vacancy in some cases. Entry of hydrogen into the oxygen vacancy increases carrier density. Furthermore, bonding of part of hydrogen to oxygen bonded to a metal atom causes generation of an electron serving as a carrier in some cases. That is, the oxide semiconductor to which nitrogen or hydrogen is added becomes n-type and has a reduced resistance.

In particular, in the transistor 200 illustrated in FIG. 9, the resistance of the oxide 230b can be reduced in a self-aligned manner using the conductor 260 functioning as a gate electrode as a mask. That is, when the plurality of transistors 200 are formed simultaneously, variations in electrical characteristics of the transistors can be reduced. The channel length of the transistor 200 is determined depending on the width of the conductor 260; the transistor 200 can be miniaturized when the conductor 260 has the minimum feature width.

Specifically, impurities such as nitrogen may be supplied to the oxide 230b by one or more methods selected from an ion implantation method, an ion doping method, plasma treatment, and plasma immersion ion implantation method using the conductor 260 as a mask.

When the insulator 274 is deposited over the oxide 230b and the conductor 260 over the oxide 230b, the resistance of the oxide 230 can be selectively reduced. That is, with the use of an insulator containing nitrogen or hydrogen as the insulator 274, the resistance of the oxide 230b in regions in contact with the insulator 274 can be reduced.

FIG. 9 illustrates a conductor 246 (a conductor 246a and a conductor 246b) functioning as a plug that electrically connects the transistor and another structure body. When the conductor 246 is in contact with the oxide 230b, the conductor 246 might extract oxygen in the oxide 230b. Accordingly, it is highly possible that oxygen vacancies are generated in regions of the oxide 230b that are in contact with the conductor 246.

Since the resistance of the oxide 230b in the regions in contact with the conductor 246 is reduced by generation of oxygen vacancies, a low ohmic contact can be made between the oxide 230b and the conductor 246. Meanwhile, when the metal oxide 226 or the like is provided between the oxide 230b and the insulator 224 as described above, the channel formation region of the oxide 230b can be kept as a high resistance region, and thus an off-state current can be reduced.

<<Modification Example 2 of Semiconductor Device>>

An example of a semiconductor device including the transistor 200 of one embodiment of the present invention is described below with reference to FIG. 10.

Figure 10A:
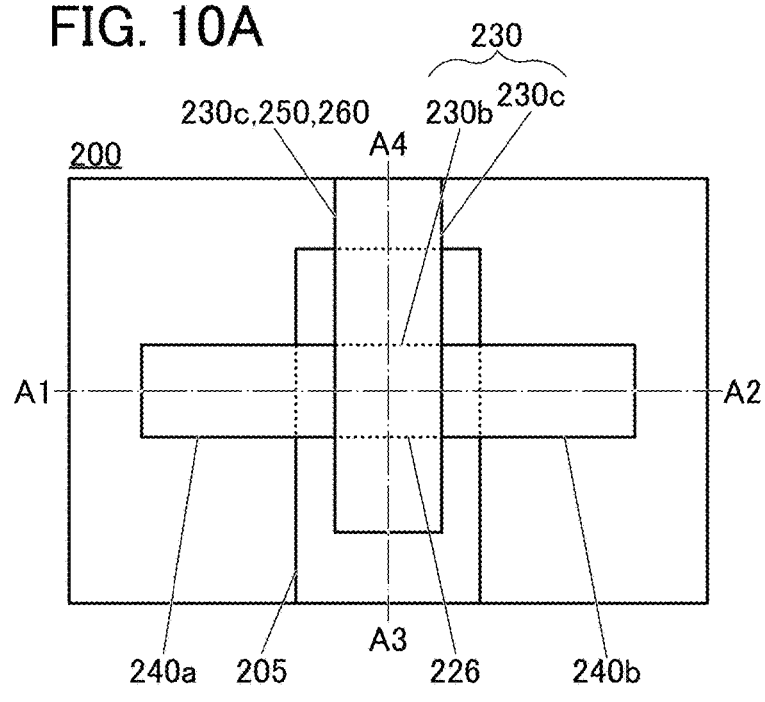
FIG. 10A is a top view illustrating a method for manufacturing a semiconductor device.
Figure 10C:
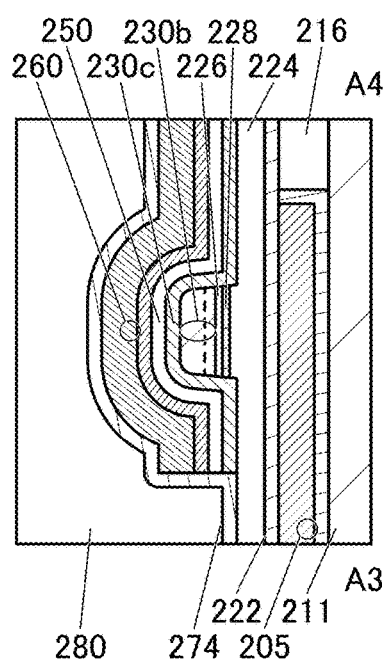
FIG. 10B and FIG. 10C are cross-sectional views illustrating the method for manufacturing the semiconductor device.
Figure 10B:
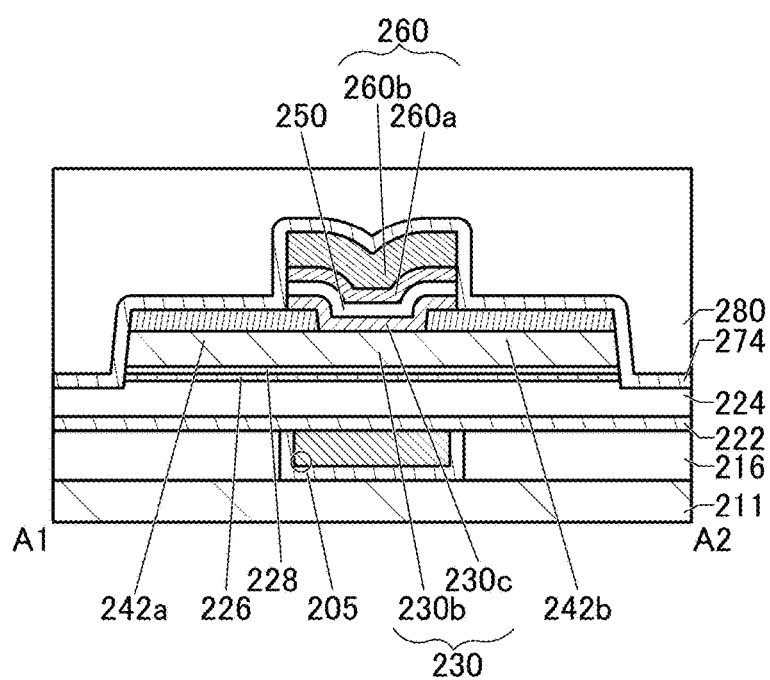

Here, FIG. 10A is a top view. FIG. 10B is a cross-sectional view corresponding to a portion indicated by dashed-dotted line A1-A2 in FIG. 10A. FIG. 10C is a cross-sectional view corresponding to a portion indicated by dashed-dotted line A3-A4 in FIG. 10A. For clarity of the drawing, some components are not illustrated in the top view of FIG. 10A.

The semiconductor device illustrated in FIG. 10 is different from the semiconductor device illustrated in FIG. 3 in the shape of the transistor.

Specifically, after the oxide 230b and the conductive layer 240B are formed, the conductive layer 240B is processed to be separated into the conductor 240a and the conductor 240b.

Then, the oxide film to be the oxide 230c, the insulating film to be the insulator 250, and the conductive film to be the conductor 260 are deposited. Subsequently, processing is performed using a mask, so that the conductor 260 functioning as a gate electrode, the insulator 250 functioning as a gate insulator, and the oxide 230c illustrated in FIG. 10 can be formed.

At least part of this embodiment can be implemented in combination with the other embodiments and examples described in this specification as appropriate.

Embodiment 2

In this embodiment, one embodiment of a semiconductor device is described with reference to FIG. 11 and FIG. 12.

[Memory Device 1]

Figure 11:
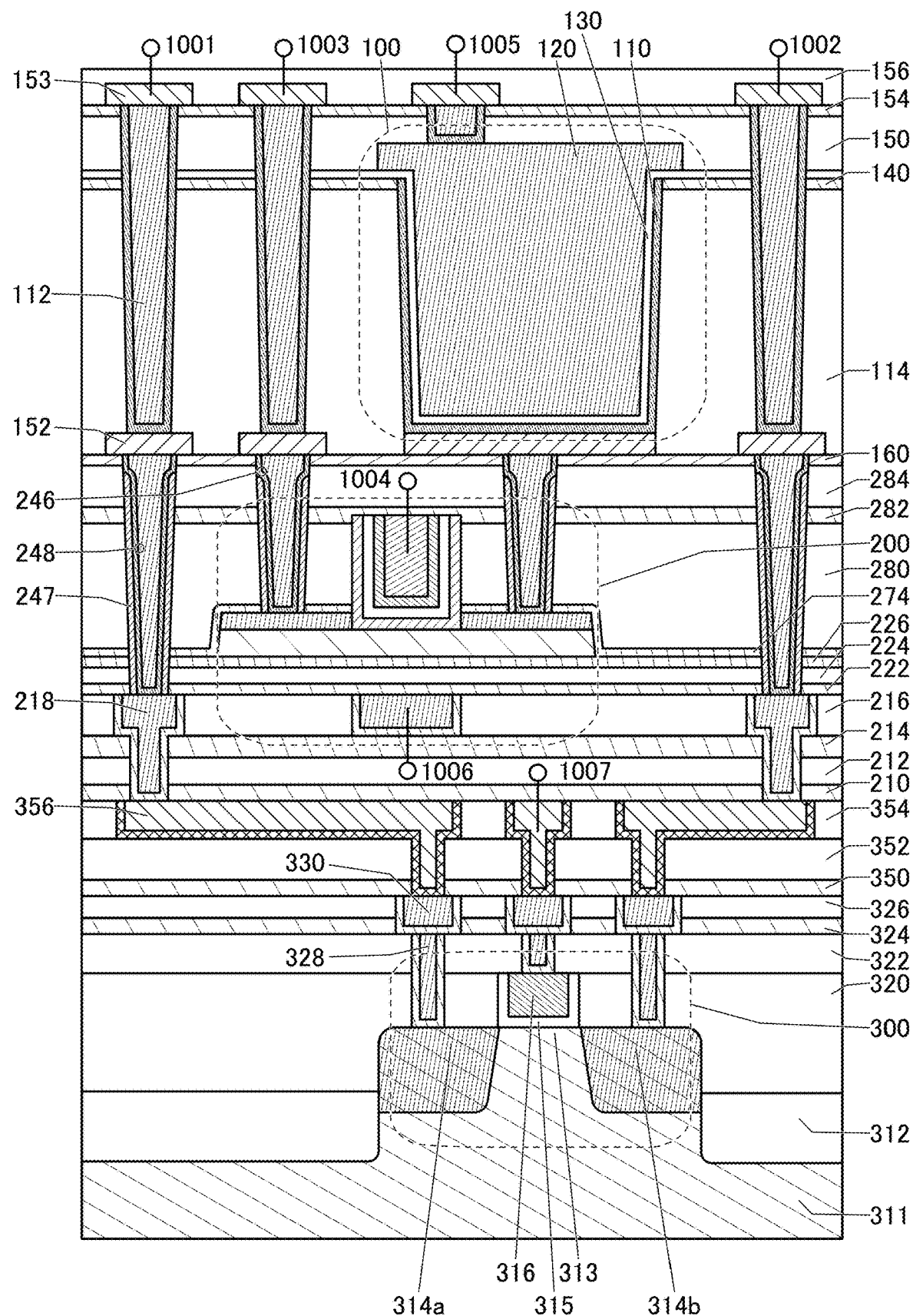
FIG. 11 is a cross-sectional view illustrating a structure of a memory device.

FIG. 11 illustrates an example of a semiconductor device (memory device) in which a capacitor of one embodiment of the present invention is used. In the semiconductor device of one embodiment of the present invention, the transistor 200 is provided above a transistor 300, and a capacitor 100 is provided above the transistor 200. At least part of the capacitor 100 or the transistor 300 preferably overlaps with the transistor 200. Accordingly, an area occupied by the capacitor 100, the transistor 200, and the transistor 300 in a top view can be reduced, whereby the semiconductor device of this embodiment can be miniaturized or highly integrated. The semiconductor device of this embodiment can be applied to logic circuits typified by a CPU (Central Processing Unit) and a GPU (Graphics Processing Unit) and memory circuits typified by a DRAM (Dynamic Random Access Memory) and an NVM (Non-Volatile Memory), for example.

The transistor 200 described in the above embodiment can be used as the transistor 200. Therefore, for the transistor 200 and layers including the transistor 200, the description in the above embodiment can be referred to.

The transistor 200 is a transistor whose channel is formed in a semiconductor layer including an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device. The transistor 200 exhibits favorable electrical characteristics at high temperatures, in comparison with a transistor including silicon in a semiconductor layer. For example, the transistor 200 has favorable electrical characteristics even in the temperature range of 125° C. to 150° C. Moreover, the transistor 200 has an on/off ratio of 10 digits or larger in the temperature range of 125° C. to 150° C. In other words, in comparison with a transistor including silicon in a semiconductor layer, the transistor 200 excels in characteristics such as an on-state current and frequency characteristics at higher temperatures.

In the semiconductor device illustrated in FIG. 11, a wiring 1001 is electrically connected to a source of the transistor 300, a wiring 1002 is electrically connected to a drain of the transistor 300, and a wiring 1007 is electrically connected to a gate of the transistor 300. A wiring 1003 is electrically connected to one of the source and the drain of the transistor 200, a wiring 1004 is electrically connected to a first gate of the transistor 200, and a wiring 1006 is electrically connected to a second gate of the transistor 200. The other of the source and the drain of the transistor 200 is electrically connected to one electrode of the capacitor 100, and a wiring 1005 is electrically connected to the other electrode of the capacitor 100.

The semiconductor device illustrated in FIG. 11 has characteristics of being capable of retaining charge stored in the one electrode of the capacitor 100 by switching of the transistor 200; thus, writing, retention, and reading of data can be performed. The transistor 200 is an element in which a back gate is provided in addition to the source, the gate (top gate), and the drain. That is, the transistor 200 is a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. By contrast, in the semiconductor device illustrated in FIG. 11, data rewriting is performed by charging or discharging of electrons with the transistor and the capacitor; thus, the semiconductor device has characteristics such as high write endurance and a few structure changes.

Furthermore, by arranging the semiconductor devices illustrated in FIG. 11 in a matrix, a memory cell array can be formed. In this case, the transistor 300 can be used for a read circuit, a driver circuit, or the like that is connected to the memory cell array. As described above, the semiconductor device illustrated in FIG. 11 constitutes the memory cell array. When the semiconductor device in FIG. 11 is used as a memory element, for example, an operating frequency of 200 MHz or higher is achieved at a driving voltage of 2.5 V and an evaluation environment temperature ranging from −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is positioned over the semiconductor region 313, and the conductor 316 is positioned over the insulator 315. The transistors 300 formed in the same layer are electrically isolated from one another by an insulator 312 functioning as an element isolation insulating layer. The insulator 312 can be formed using an insulator similar to an insulator 326 or the like described later. The transistor 300 may be a p-channel transistor or an n-channel transistor.

In the substrate 311, a region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) using GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as the gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to obtain both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 11, the semiconductor region 313 (part of the substrate 311) in which the channel is formed has a convex shape. Furthermore, the conductor 316 is provided so as to cover a side surface and a top surface of the semiconductor region 313 with the insulator 315 positioned therebetween. Such a transistor 300 is also referred to as a FIN-type transistor because it utilizes a convex portion of the semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 11 is an example and the structure is not limited thereto; an appropriate transistor is used in accordance with a circuit structure or a driving method.

As illustrated in FIG. 11, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device in FIG. 11, a silicon-based semiconductor material and an oxide semiconductor can be used in different layers. The semiconductor device illustrated in FIG. 11 can be manufactured in a process similar to that employing a manufacturing apparatus that is used in the case of a silicon-based semiconductor material, and can be highly integrated.

<Capacitor 100>

The capacitor 100 includes an insulator 114 over an insulator 160, an insulator 140 over the insulator 114, a conductor 110 positioned in an opening formed in the insulator 114 and the insulator 140, an insulator 130 over the conductor 110 and the insulator 140, a conductor 120 over the insulator 130, and an insulator 150 over the conductor 120 and the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. The capacitor 100 has a structure in which the upper electrode and the lower electrode face each other with the dielectric positioned therebetween on a side surface as well as the bottom surface of the opening in the insulator 114 and the insulator 140; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used for the insulator 280 can be used as the insulator 114 and the insulator 150. The insulator 140 preferably functions as an etching stopper at the time of forming the opening in the insulator 114 and is formed using an insulator that can be used as an insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 110 is positioned in contact with the opening formed in the insulator 140 and the insulator 114. A top surface of the conductor 110 is preferably substantially level with a top surface of the insulator 140. A conductor 152 provided over the insulator 160 is in contact with a bottom surface of the conductor 110. The conductor 110 is preferably deposited by an ALD method, a CVD method, or the like; for example, a conductor that can be used as the conductor 205 is used.

The insulator 130 is positioned to cover the conductor 110 and the insulator 140. The insulator 130 is preferably deposited by an ALD method or a CVD method, for example. The insulator 130 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

For the insulator 130, a material with high dielectric strength, such as silicon oxynitride, or a high dielectric constant (high-k) material is preferably used. Alternatively, a stacked-layer structure using a material with high dielectric strength and a high dielectric constant (high-k) material may be employed.

As an insulator of a high dielectric constant (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 130 has a large thickness. When the insulator 130 has a large thickness, leakage current generated between the conductor 110 and the conductor 120 can be inhibited.

Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator with high dielectric strength can increase the dielectric strength and inhibit electrostatic breakdown of the capacitor 100.

The conductor 120 is positioned to fill the opening formed in the insulator 140 and the insulator 114. The conductor 120 is electrically connected to the wiring 1005 through a conductor 112 and a conductor 153. The conductor 120 is preferably deposited by an ALD method, a CVD method, or the like and is formed using a conductor that can be used as the conductor 205, for example.

Since the transistor 200 has a structure in which an oxide semiconductor is used, the transistor 200 is highly compatible with the capacitor 100. Specifically, since the transistor 200 using an oxide semiconductor has a low off-state current, a combination of the transistor 200 and the capacitor 100 enables stored data to be retained for a long time.

<Wiring Layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and the insulator 326 are stacked over the transistor 300 in this order as interlayer films. Moreover, a conductor 328, a conductor 330, and the like that are electrically connected to the conductor 153 functioning as a terminal are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 11, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

An insulator 210, an insulator 212, the insulator 214, and the insulator 216 are stacked in this order over the insulator 354 and the conductor 356. A conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the transistor 300.

The conductor 112, conductors (the conductor 120 and the conductor 110) included in the capacitor 100, and the like are embedded in the insulator 114, the insulator 140, the insulator 130, the insulator 150, and an insulator 154. Note that the conductor 112 functions as a plug or a wiring that electrically connects the capacitor 100, the transistor 200, or the transistor 300 to the conductor 153 functioning as a terminal.

The conductor 153 is provided over the insulator 154, and the conductor 153 is covered with an insulator 156. Here, the conductor 153 is in contact with a top surface of the conductor 112 and functions as a terminal of the capacitor 100, the transistor 200, or the transistor 300.

Examples of an insulator that can be used for an interlayer film include an oxide, a nitride, an oxynitride, a nitride oxide, a metal oxide, a metal oxynitride, and a metal nitride oxide, each of which has an insulating property. For example, when a material with a low relative permittivity is used for the insulator functioning as an interlayer film, the parasitic capacitance generated between wirings can be reduced. Accordingly, a material is preferably selected depending on the function of an insulator.

For example, for the insulator 320, the insulator 322, the insulator 326, the insulator 352, the insulator 354, the insulator 212, the insulator 114, the insulator 150, the insulator 156, and the like, an insulator with low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

It is preferable that the resistivity of an insulator provided over or under the conductor 152 or the conductor 153 be higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. The resistivity of the insulator provided over or under the conductor 152 or the conductor 153 is preferably within the above range because the insulator can disperse charges accumulated between the transistor 200, the transistor 300, the capacitor 100, and wirings such as the conductor 152 while maintaining the insulating property, and thus, poor characteristics and electrostatic breakdown of the transistor and the semiconductor device including the transistor due to the charges can be inhibited. For such an insulator, silicon nitride or silicon nitride oxide can be used. For example, the resistivity of the insulator 160 or the insulator 154 can be set within the above range.

When a transistor using an oxide semiconductor is surrounded by insulators having a function of inhibiting transmission of oxygen and impurities such as hydrogen, the electrical characteristics of the transistor can be stable. Thus, an insulator having a function of inhibiting transmission of oxygen and impurities such as hydrogen is used for the insulator 324, the insulator 350, the insulator 210, and like.

As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

As the conductors that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, the conductor 152, the conductor 153, and the like, a single layer or stacked layers of a conductive material such as a metal material, an alloy material, a metal nitride material, a metal oxide material, and the like that are formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, an insulator 247 is preferably provided between the insulators 224 and 280 containing excess oxygen and the conductors 246 and 248 in FIG. 11. An insulator 282 is preferably formed using a material having a barrier property against oxygen and impurities. Since the insulator 247 is provided in contact with the insulator 282, the conductor 248 and the transistor 200 can be sealed by the insulators having a barrier property.

That is, the excess oxygen contained in the insulator 224 and the insulator 280 can be inhibited from being absorbed by the conductor 246 and the conductor 248 when the insulator 247 is provided. In addition, by including the insulator 247, the diffusion of hydrogen, which is an impurity, into the transistor 200 through the conductor 246 and the conductor 248 can be inhibited.

Here, the conductor 246 and the conductor 248 function as a plug or a wiring that is electrically connected to the transistor 200 or the transistor 300.

Specifically, the insulator 247 is provided in contact with a side wall of an opening in an insulator 284, the insulator 282, and the insulator 280, and the conductor 246 and the conductor 248 are formed in contact with the side surface of the insulator 247. The conductor 240 is located on at least part of the bottom portion of the opening, and the conductor 248 is in contact with the conductor 240.

For the conductor 246 and the conductor 248, a conductive material containing tungsten, copper, or aluminum as its main component is preferably used. In addition, the conductor 246 and the conductor 248 may each have a stacked-layer structure. Although the transistor 200 having a structure in which the conductor 246 and the conductor 248 each have a stacked-layer structure of two layers is illustrated, the present invention is not limited thereto. For example, the conductor 246 and the conductor 248 may each be provided as a single layer or to have a stacked-layer structure of three or more layers.

In the case where the conductor 246 and the conductor 248 each have a stacked-layer structure, a conductive material having a function of inhibiting transmission of impurities such as water or hydrogen is preferably used for a conductor that is in contact with the insulator 224, the insulator 280, the insulator 282, and the insulator 284 with the insulator 247 therebetween. In particular, in the conductor 246, the conductor in contact with the conductor 240 is preferably formed using a conductive material having a function of inhibiting transmission of impurities such as water or hydrogen. For example, tantalum, tantalum nitride, titanium, titanium nitride, ruthenium, ruthenium oxide, or the like is preferably used. The conductive material having a function of inhibiting transmission of impurities such as water or hydrogen may be used as a single layer or stacked layers. The use of the conductive material can prevent oxygen added to the insulator 224 and the insulator 280 from being absorbed by the conductor 246 and the conductor 248. Moreover, impurities such as water or hydrogen contained in a layer above the insulator 284 can be inhibited from being diffused into the oxide 230 through the conductor 246 and the conductor 248.

As the insulator 247, for example, an insulator that can be used as the insulator 214 or the like may be used. The insulator 247 can inhibit diffusion of impurities such as water or hydrogen contained in the insulator 224, the insulator 280, and the like into the oxide 230 through the conductor 248. In addition, oxygen contained in the insulator 224 and the insulator 280 can be prevented from being absorbed by the conductor 246 and the conductor 248.

The conductor 152 functioning as a wiring may be positioned in contact with top surfaces of the conductor 246 and the conductor 248. For the conductor functioning as a wiring, a conductive material containing tungsten, copper, or aluminum as its main component is preferably used. Furthermore, the conductor may have a stacked-layer structure; for example, a stacked-layer structure of titanium or titanium nitride and any of the above conductive materials may be employed. Note that the conductor may be formed to be embedded in an opening provided in an insulator.

The above is the description of the structure example. With the use of this structure, a semiconductor device using a transistor including an oxide semiconductor can be miniaturized or highly integrated. Alternatively, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided.

[Memory Device 2]

Figure 12:
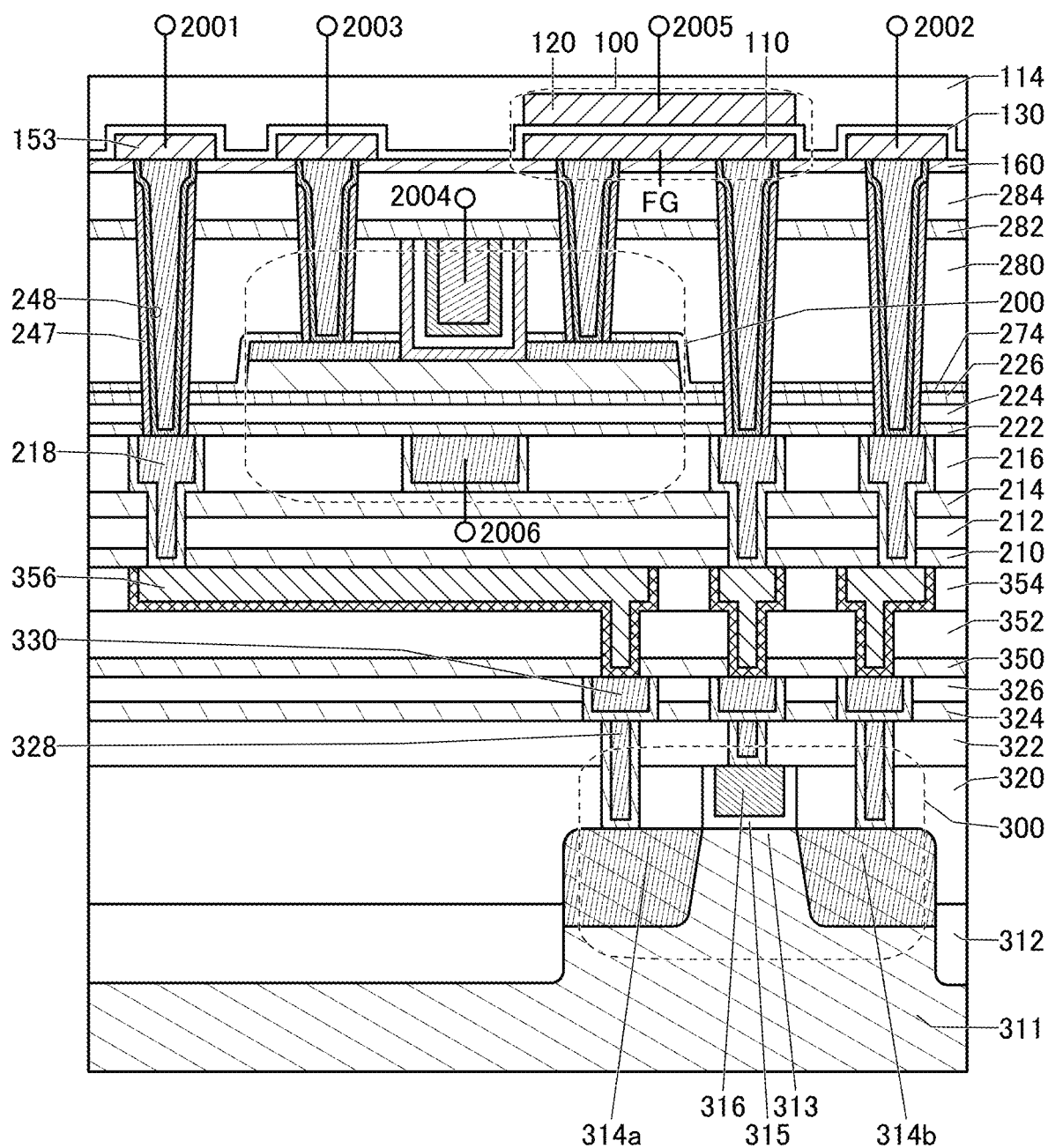
FIG. 12 is a cross-sectional view illustrating a structure of a memory device.

FIG. 12 illustrates an example of a semiconductor device (memory device) using the semiconductor device of one embodiment of the present invention. Like the semiconductor device illustrated in FIG. 11, the semiconductor device illustrated in FIG. 12 includes the transistor 200, the transistor 300, and the capacitor 100. Note that the semiconductor device illustrated in FIG. 12 differs from the semiconductor device illustrated in FIG. 11 in that the capacitor 100 is a planar capacitor and that the transistor 200 is electrically connected to the transistor 300.

In the semiconductor device of one embodiment of the present invention, the transistor 200 is provided above the transistor 300, and the capacitor 100 is provided above the transistor 300 and the transistor 200. At least part of the capacitor 100 or the transistor 300 preferably overlaps with the transistor 200. Accordingly, an area occupied by the capacitor 100, the transistor 200, and the transistor 300 in a top view can be reduced, whereby the semiconductor device of this embodiment can be miniaturized or highly integrated.

Note that the transistor 200 and the transistor 300 mentioned above can be used as the transistor 200 and the transistor 300, respectively. Therefore, the above description can be referred to for the transistor 200, the transistor 300, and the layers including them.

In the semiconductor device illustrated in FIG. 12, a wiring 2001 is electrically connected to the source of the transistor 300, and a wiring 2002 is electrically connected to the drain of the transistor 300. A wiring 2003 is electrically connected to one of the source and the drain of the transistor 200, a wiring 2004 is electrically connected to the first gate of the transistor 200, and a wiring 2006 is electrically connected to the second gate of the transistor 200. The gate of the transistor 300 and the other of the source and the drain of the transistor 200 are electrically connected to one electrode of the capacitor 100, and a wiring 2005 is electrically connected to the other electrode of the capacitor 100. Note that a node where the gate of the transistor 300, the other of the source and the drain of the transistor 200, and the one electrode of the capacitor 100 are connected to one another is hereinafter referred to as a node FG in some cases.

The semiconductor device illustrated in FIG. 12 is capable of retaining the potential of the gate of the transistor 300 (the node FG) by switching of the transistor 200; thus, data writing, retention, and reading can be performed.

By arranging the semiconductor devices illustrated in FIG. 12 in a matrix, a memory cell array can be formed.

The layer including the transistor 300 has the same structure as that in the semiconductor device illustrated in FIG. 11, and therefore, the above description can be referred to for the structure below the insulator 354.

The insulator 210, the insulator 212, the insulator 214, and the insulator 216 are positioned over the insulator 354. Here, an insulator having a function of inhibiting transmission of oxygen and impurities such as hydrogen is used as the insulator 210, like the insulator 350 and the like.

The conductor 218 is embedded in the insulator 210, the insulator 212, the insulator 214, and the insulator 216. The conductor 218 functions as a plug or a wiring that is electrically connected to the capacitor 100, the transistor 200, or the transistor 300. For example, the conductor 218 is electrically connected to the conductor 316 functioning as the gate electrode of the transistor 300.

Note that the conductor 248 functions as a plug or a wiring that is electrically connected to the transistor 200 or the transistor 300. For example, the conductor 248 electrically connects the conductor 240b functioning as the other of the source and the drain of the transistor 200 and the conductor 110 functioning as one electrode of the capacitor 100 through the conductor 248.

The planar capacitor 100 is provided above the transistor 200. The capacitor 100 includes the conductor 110 functioning as a first electrode, the conductor 120 functioning as a second electrode, and the insulator 130 functioning as a dielectric. Note that as the conductor 110, the conductor 120, and the insulator 130, those described above in Memory device 1 can be used.

The conductor 153 and the conductor 110 are provided in contact with the top surface of the conductor 248. The conductor 153 is in contact with the top surface of the conductor 248 and functions as a terminal of the transistor 200 or the transistor 300.

The conductor 153 and the conductor 110 are covered with the insulator 130, and the conductor 120 is positioned to overlap with the conductor 110 with the insulator 130 therebetween. In addition, the insulator 114 is positioned over the conductor 120 and the insulator 130.

Although FIG. 12 illustrates an example in which a planar capacitor is used as the capacitor 100, the semiconductor device of this embodiment is not limited thereto. For example, the capacitor 100 may be a cylinder capacitor 100 like that illustrated in FIG. 11.

[Memory Device 3]

Figure 13:
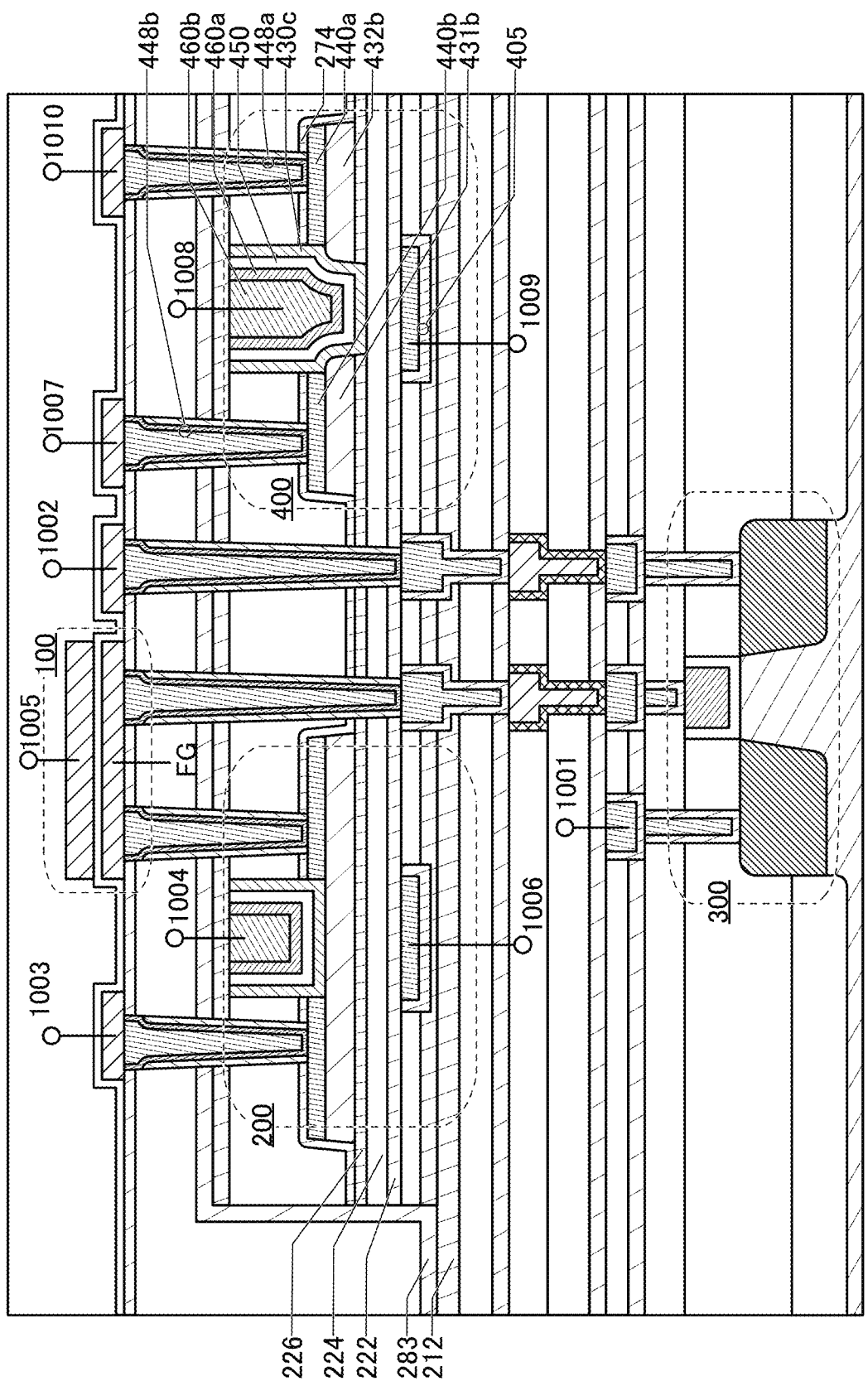
FIG. 13 is a cross-sectional view illustrating a structure of a memory device.

FIG. 13 illustrates an example of a memory device using the semiconductor device of one embodiment of the present invention. The memory device illustrated in FIG. 13 includes a transistor 400 in addition to the semiconductor device including the transistor 200, the transistor 300, and the capacitor 100 illustrated in FIG. 12.

The transistor 400 can control a second gate voltage of the transistor 200. For example, a first gate and a second gate of the transistor 400 are diode-connected to a source of the transistor 400, and the source of the transistor 400 is connected to the second gate of the transistor 200. When a negative potential of the second gate of the transistor 200 is retained in this structure, a first gate-source voltage and a second gate-source voltage of the transistor 400 become 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

Hence, in FIG. 13, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. The gate of the transistor 300 and the other of the source and the drain of the transistor 200 are electrically connected to one electrode of the capacitor 100, and the wiring 1005 is electrically connected to the other electrode of the capacitor 100. The wiring 1007 is electrically connected to the source of the transistor 400, a wiring 1008 is electrically connected to the gate of the transistor 400, a wiring 1009 is electrically connected to a back gate of the transistor 400, and a wiring 1010 is electrically connected to a drain of the transistor 400. The wiring 1006, the wiring 1007, the wiring 1008, and the wiring 1009 are electrically connected to each other.

When the memory devices illustrated in FIG. 13 are arranged in a matrix like the memory devices illustrated in FIG. 11 and FIG. 12, a memory cell array can be formed. Note that one transistor 400 can control the second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 (a conductor 460a and a conductor 460b) functioning as a first gate electrode, a conductor 405 (a conductor 405a and a conductor 405b) functioning as a second gate electrode, the insulator 222, the insulator 224, and an insulator 450 functioning as a gate insulating layer, an oxide 430c including a region where a channel is formed, a conductor 440a and an oxide 431b functioning as one of a source and a drain, and a conductor 440b and an oxide 432b functioning as the other of the source and the drain.

In the transistor 400, the conductor 405 is in the same layer as the conductor 205. The oxide 431b and the oxide 432b are in the same layer as the oxide 230b. The conductor 440 is in the same layer as the conductor 240. The oxide 430c is in the same layer as the oxide 230c. The insulator 450 is in the same layer as the insulator 250. The conductor 460 is in the same layer as the conductor 260.

Note that the components formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen or water are reduced, as in the oxide 230 or the like. Accordingly, the threshold voltage of the transistor 400 can be higher than 0 V, the off-state current can be reduced, and the drain current at the time when the second gate voltage and the first gate voltage are 0 V can be extremely low.

This embodiment can be implemented in an appropriate combination with the structures described in the other embodiments and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), is described with reference to FIG. 14 and FIG. 15. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 14A:
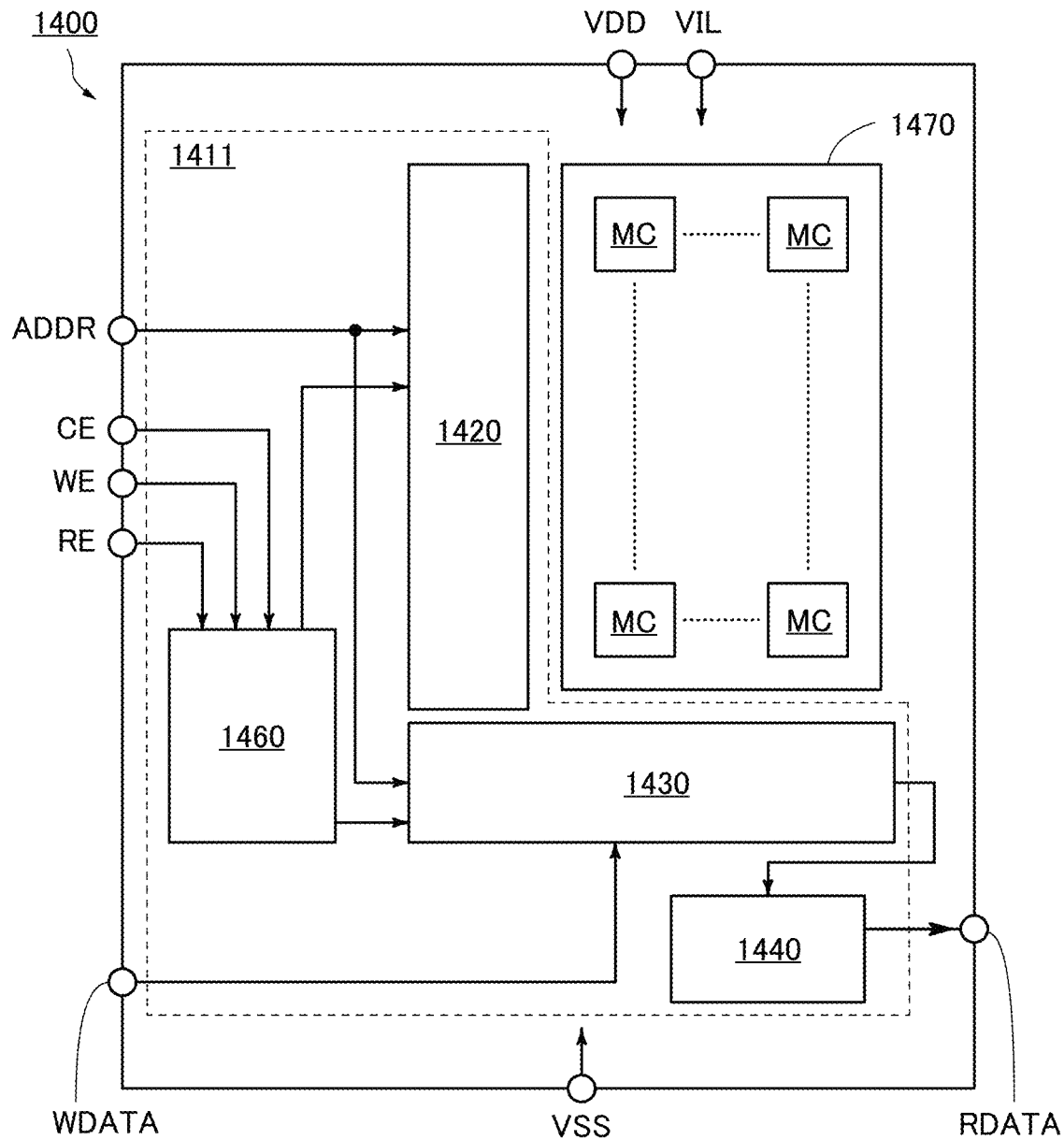
FIG. 14A is a block diagram illustrating a structure example of a memory device.

FIG. 14A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the input signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of wirings that connect the memory cell array 1470 to the row circuit 1420 depends on the structure of the memory cell MC, the number of memory cells MC in a column, and the like. The number of wirings that connect the memory cell array 1470 to the column circuit 1430 depends on the structure of the memory cell MC, the number of memory cells MC in a row, and the like.

Figure 14B:
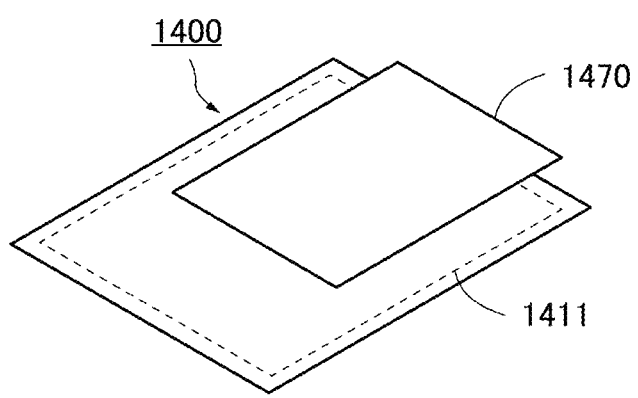
FIG. 14B is a perspective view of the memory device.

Note that FIG. 14A illustrates an example in which the peripheral circuit 1411 and the memory cell array 1470 are formed on the same plane; however, this embodiment is not limited thereto. For example, as illustrated in FIG. 14B, the memory cell array 1470 may be provided to overlap part of the peripheral circuit 1411. For example, the sense amplifier may be provided below the memory cell array 1470 so that they overlap with each other.

FIG. 15 illustrates structure examples of a memory cell applicable to the memory cell MC.

<<DOSRAM>>

Figure 15A:
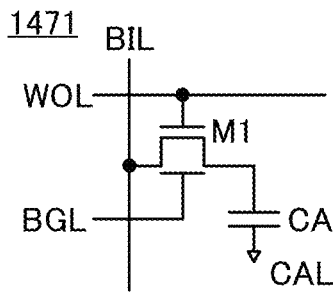
FIG. 15A to FIG. 15H are circuit diagrams illustrating structure examples of a memory device.
Figure 15B:
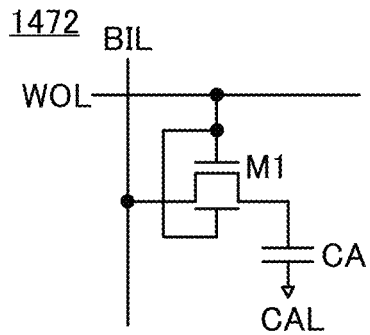
Figure 15C:
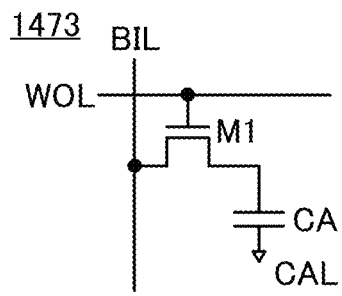
Figure 15D:
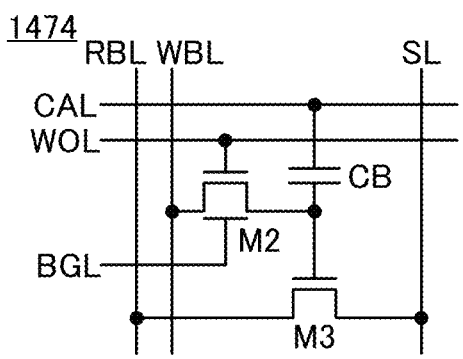
Figure 15E:
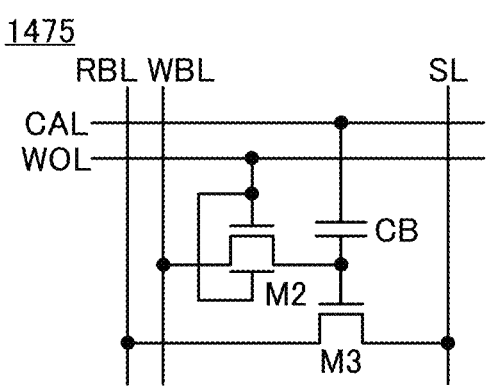
Figure 15F:
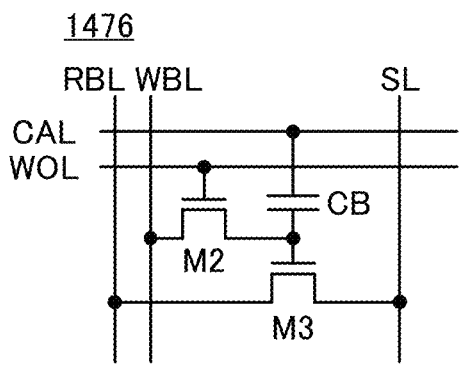
Figure 15G:
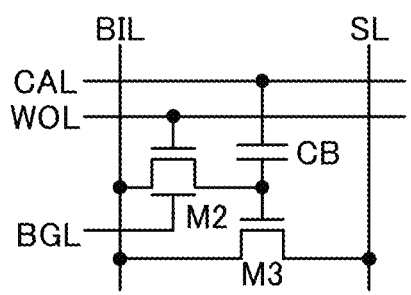

FIG. 15A to FIG. 15C illustrate circuit structure examples of a memory cell of a DRAM. In this specification and the like, a DRAM using a memory cell including one OS transistor and one capacitor is referred to as DOSRAM in some cases. A memory cell 1471 illustrated in FIG. 15A includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit structure can be changed. For example, as in a memory cell 1472 illustrated in FIG. 15B, the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 15C.

In the case where the semiconductor device described in the above embodiment is used for the memory cell 1471 and the like, the transistor described in the above embodiment can be used as the transistor M1. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, owing to an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

<<NOSRAM>>

FIG. 15D to FIG. 15G illustrate circuit structure examples of a gain-cell memory cell including two transistors and one capacitor. A memory cell 1474 illustrated in FIG. 15D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. Applying a given potential to the wiring BGL can increase or decrease the threshold voltage of the transistor M2.

The memory cell MC is not limited to the memory cell 1474, and the circuit structure can be changed as appropriate. For example, as in a memory cell 1475 illustrated in FIG. 15E, the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 illustrated in FIG. 15F. Alternatively, for example, in the memory cell MC, the wiring WBL and the wiring RBL may be combined into one wiring BIL, as in a memory cell 1477 illustrated in FIG. 15G.

In the case where the semiconductor device described in the above embodiment is used for the memory cell 1474 and the like, the transistor described in the above embodiment can be used as the transistor M2. When an OS transistor is used as the transistor M2, the leakage current of the transistor M2 can be extremely low. Accordingly, with the use of the transistor M2, written data can be retained for a long time, and thus the frequency of the refresh operation for the memory cell can be decreased. In addition, refresh operation of the memory cell can be unnecessary. In addition, owing to an extremely low leakage current, multi-level data or analog data can be retained in the memory cell 1474. The same applies to the memory cells 1475 to 1477.

Note that the transistor M3 may be a transistor containing silicon in a channel formation region (hereinafter also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistor M2 and the transistor M3, the circuit of the memory cell array 1470 can be formed using only n-channel transistors.

Figure 15H:
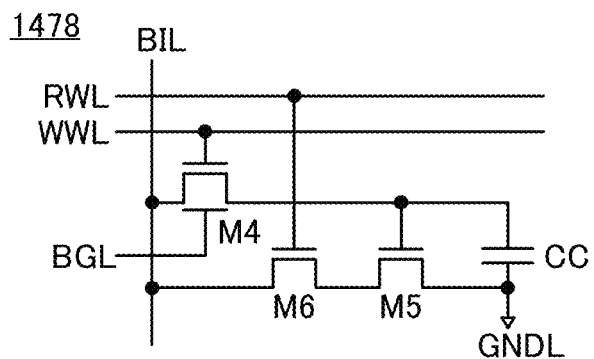

FIG. 15H illustrates an example of a gain-cell memory cell of one capacitor for three transistors. A memory cell 1478 illustrated in FIG. 15H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 may include no back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in the above embodiment is used for the memory cell 1478, the transistor described in the above embodiment can be used as the transistor M4. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments, examples, and the like.

Embodiment 4

In this embodiment, an example of a chip 1200 on which the semiconductor device of the present invention is mounted is described with reference to FIG. 16. A plurality of circuits (systems) are mounted on the chip 1200. A technique for integrating a plurality of circuits (systems) into one chip is referred to as system on chip (SoC) in some cases.

Figure 16A:
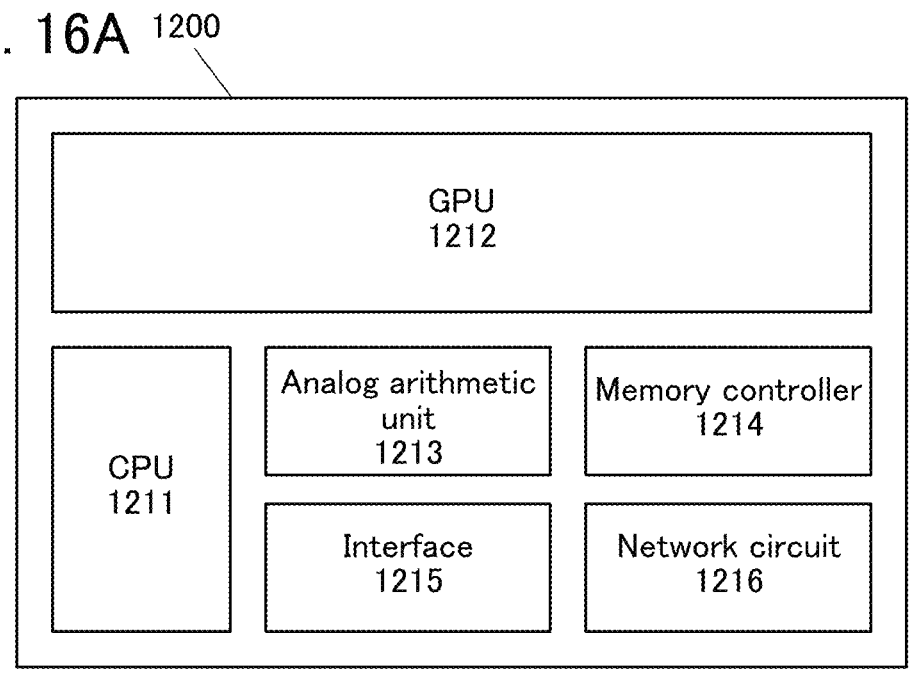
FIG. 16A is a block diagram illustrating a structure example of a memory device.

As illustrated in FIG. 16A, the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 16B:
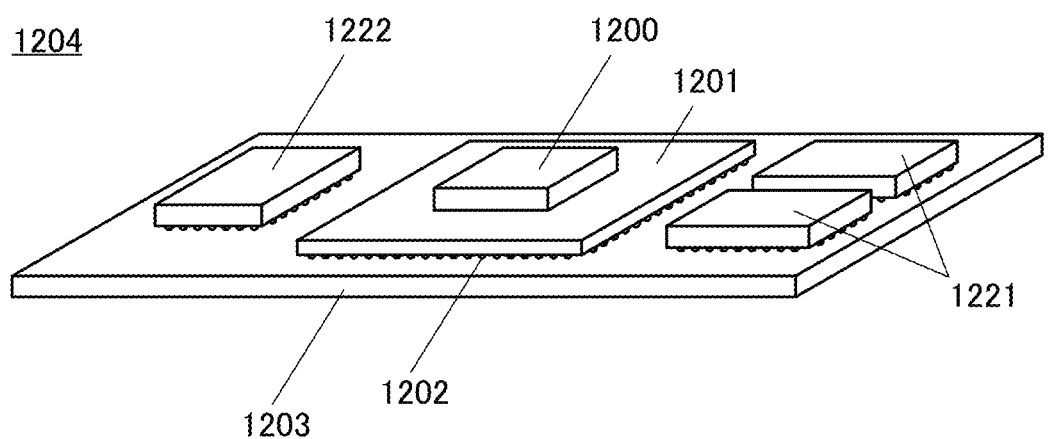
FIG. 16B is a perspective view of the memory device.

A bump (not illustrated) is provided on the chip 1200, and as illustrated in FIG. 16B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can execute a method in a deep neural network (DNN), a convolutional neural network (CNN), a recurrent neural network (RNN), an autoencoder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments, examples, and the like.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 17 schematically illustrates some structure examples of removable memory devices. The semiconductor device described in the above embodiment is processed into a packaged memory chip and used in a variety of storage devices and removable memories, for example.

Figure 17A:
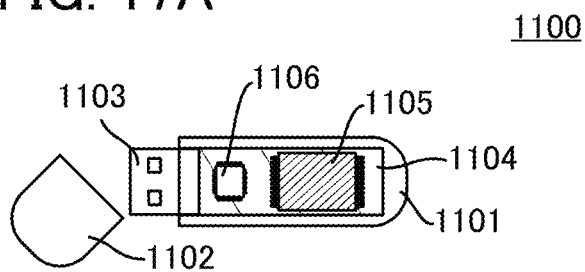
FIG. 17A to FIG. 17E are schematic diagrams of memory devices of one embodiment of the present invention.

FIG. 17A is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

Figure 17B:
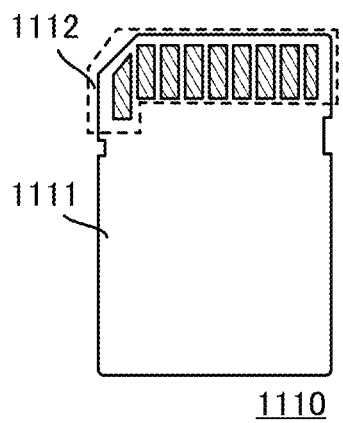
Figure 17C:
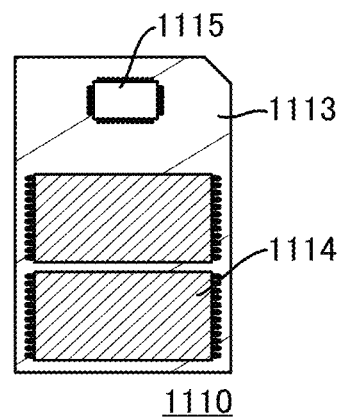

FIG. 17B is a schematic external diagram of an SD card, and FIG. 17C is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. In this case, data can be read from and written in the memory chip 1114 by radio communication between a host device and the SD card 1110. The semiconductor device described in the above embodiment can be incorporated in the memory chip 1114 or the like on the substrate 1113.

Figure 17D:
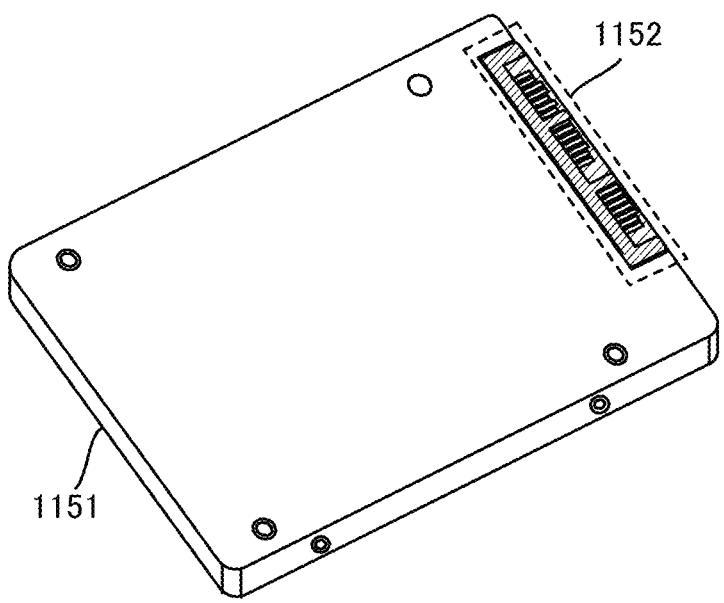
Figure 17E:
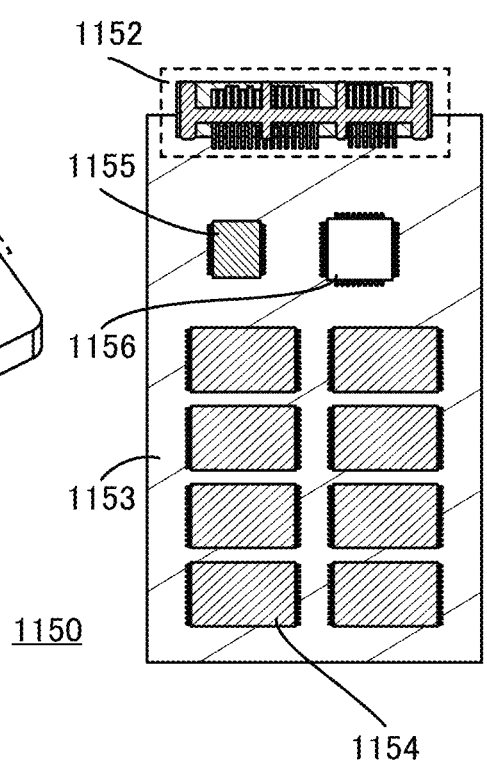

FIG. 17D is a schematic external diagram of an SSD, and FIG. 17E is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, examples, and the like.

Embodiment 6

In this embodiment, a display device and a display module are described as examples of a semiconductor device including the transistor disclosed in this specification and the like.

The transistor using an oxide semiconductor, which is described using the transistor 200 or the like, is also referred to as an OS transistor below in some cases.

<Display Device>

Figure 18A:
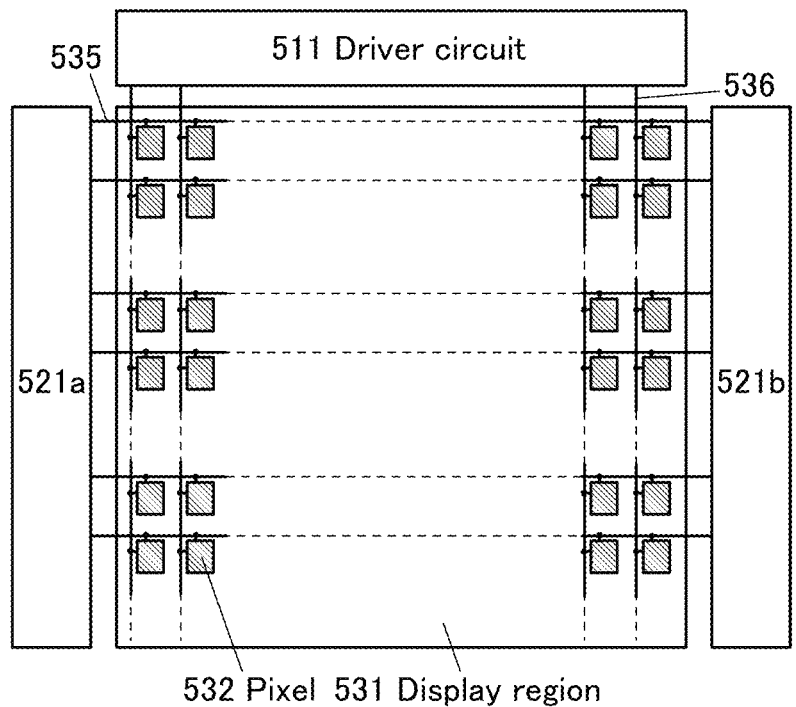
FIG. 18A is a diagram illustrating an example of a display device.

An example of a display device in which the above transistor can be used is described. FIG. 18A is a block diagram illustrating a structure example of a display device 500.

The display device 500 illustrated in FIG. 18A includes a driver circuit 511, a driver circuit 521a, a driver circuit 521b, and a display region 531. Note that the driver circuit 511, the driver circuit 521a, and the driver circuit 521b are collectively referred to as a "driver circuit" or a "peripheral driver circuit" in some cases.

The driver circuit 521a and the driver circuit 521b can function as scan line driver circuits, for example. The driver circuit 511 can function as a signal line driver circuit, for example. Note that one of the driver circuit 521a and the driver circuit 521b may be omitted. Some sort of circuit may be provided to face the driver circuit 511 with the display region 531 placed therebetween.

The display device 500 illustrated in FIG. 18A as an example includes p wirings 535 that are arranged substantially parallel to each other and whose potentials are controlled by the driver circuit 521a and/or the driver circuit 521b, and q wirings 536 that are arranged substantially parallel to each other and whose potentials are controlled by the driver circuit 511 (p and q are each a natural number of 1 or more). The display region 531 includes a plurality of pixels 532 arranged in a matrix. The pixel 532 includes a pixel circuit 534 and a display element.

When three pixels 532 function as one pixel, full-color display can be achieved. The three pixels 532 each control the transmittance, reflectance, amount of emitted light, or the like of red light, green light, or blue light. The light colors controlled by the three pixels 532 are not limited to the combination of red, green, and blue and may be yellow, cyan, and magenta.

A pixel 532 that controls white light may be added to the pixels controlling red light, green light, and blue light so that the four pixels 532 may collectively function as one pixel. The addition of the pixel 532 controlling white light can increase the luminance of the display region. When the number of pixels 532 functioning as one pixel is increased and red, green, blue, yellow, cyan, and magenta are used in appropriate combination, the range of color reproduction can be widened.

Using the pixels arranged in a matrix of 1920×1080, the display device 500 that can achieve display with a resolution of what is called full high definition (also referred to as "2K resolution", "2K1K", "2K", or the like) can be obtained. For example, using the pixels arranged in a matrix of 3840×2160, the display device 500 that can achieve display with a resolution of what is called ultra high definition (also referred to as "4K resolution", "4K2K", "4K", or the like) can be obtained. For example, using the pixels arranged in a matrix of 7680×4320, the display device 500 that can achieve display with a resolution of what is called super high definition (also referred to as "8K resolution", "8K4K", "8K", or the like) can be obtained. By increasing the number of pixels, the display device 500 that can achieve display with 16K or 32K resolution can be obtained.

A wiring 535_g in the g-th row (g is a natural number of 1 top) is electrically connected to q pixels 532 arranged in the g-th row among the plurality of pixels 532 arranged in p rows and q columns in the display region 531. A wiring 536_h in the h-th column (h is a natural number of 1 to q) is electrically connected top pixels 532 arranged in the h-th column among the plurality of pixels 532 arranged in p rows and q columns.

[Display Element]

The display device 500 can employ various modes or include various display elements. Examples of display elements include an EL (electroluminescence) element (an organic EL element, an inorganic EL element, or an EL element containing organic and inorganic materials), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using MEMS (micro electro mechanical systems), a digital micromirror device (DMD), a DMS (digital micro shutter), MIRASOL (registered trademark), an IMOD (interferometric modulation) element, a MEMS shutter display element, an optical-interference-type MEMS display element, an electrowetting element, a piezoelectric ceramic display, a display element using a carbon nanotube, and the like, which are elements including a display medium whose contrast, luminance, reflectance, transmittance, or the like is changed by an electrical or magnetic effect. Alternatively, quantum dots may be used as the display element.

Examples of display devices using EL elements include an EL display. Examples of display devices using electron emitters include a field emission display (FED), an SED-type flat panel display (SED: Surface-conduction Electron-emitter Display), and the like. Examples of display devices using quantum dots include a quantum dot display and the like. Examples of display devices using liquid crystal elements include a liquid crystal display (a transmissive liquid crystal display, a transflective liquid crystal display, a reflective liquid crystal display, a direct-view liquid crystal display, or a projection liquid crystal display) and the like. Examples of display devices using electronic ink, Electronic Liquid Powder (registered trademark), or an electrophoretic element include electronic paper and the like. The display device may be a plasma display panel (PDP). Alternatively, the display device may be a retina scanning-type projection device.

Note that in the case of achieving a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as an SRAM can be provided under the reflective electrodes. Thus, the power consumption can be further reduced.

Note that in the case where an LED is used, graphene or graphite may be provided under an electrode or a nitride semiconductor of the LED. Graphene or graphite may be a multilayer film in which a plurality of layers are stacked. Providing graphene or graphite as described above facilitates deposition of a nitride semiconductor, such as an n-type GaN semiconductor layer containing crystals, thereover. Furthermore, a p-type GaN semiconductor layer containing crystals or the like can be provided thereover to form the LED. Note that an AlN layer may be provided between graphene or graphite and the n-type GaN semiconductor layer containing crystals. The GaN semiconductor layer included in the LED chip may be deposited by MOCVD. Note that when graphene is provided, the GaN semiconductor layer included in the LED can be deposited by a sputtering method.

FIG. 18B, FIG. 18C, FIG. 19A, and FIG. 19B illustrate circuit structure examples that can be used for the pixel 532.

[Example of Pixel Circuit for Light-Emitting Display Device]

Figure 18B:
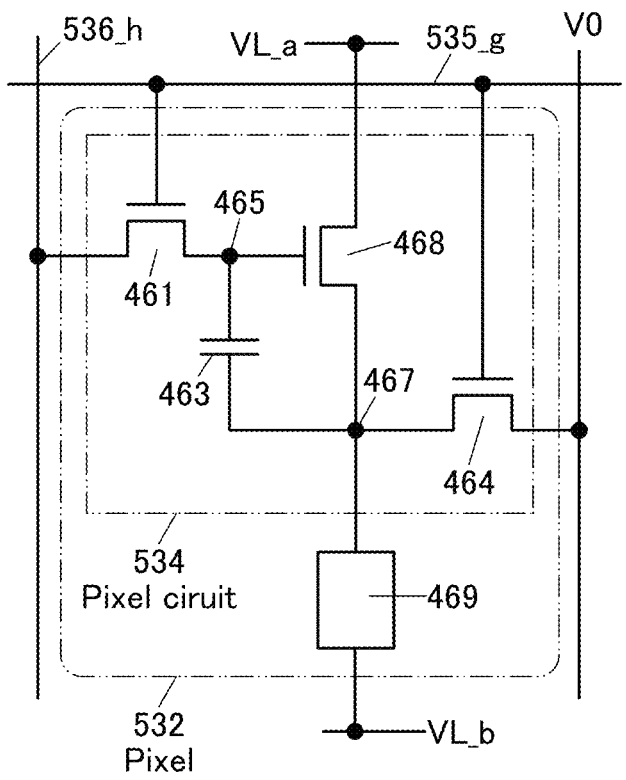
FIG. 18B and FIG. 18C are diagrams illustrating circuit structure examples of a pixel.

The pixel circuit 534 illustrated in FIG. 18B includes a transistor 461, a capacitor 463, a transistor 468, and a transistor 464. The pixel circuit 534 illustrated in FIG. 18B is electrically connected to a light-emitting element 469 that can function as a display element.

OS transistors can be used as the transistor 461, the transistor 468, and the transistor 464. It is particularly preferable to use an OS transistor as the transistor 461.

One of a source and a drain of the transistor 461 is electrically connected to the wiring 536_h. Furthermore, a gate of the transistor 461 is electrically connected to the wiring 535_g. A video signal is supplied from the wiring 536_h.

The transistor 461 has a function of controlling writing of a video signal to a node 465.

One of a pair of electrodes of the capacitor 463 is electrically connected to the node 465, and the other is electrically connected to a node 467. The other of the source and the drain of the transistor 461 is electrically connected to the node 465.

The capacitor 463 has a function of a storage capacitor for retaining data written to the node 465.

One of a source and a drain of the transistor 468 is electrically connected to a potential supply line VL_a, and the other is electrically connected to the node 467. Furthermore, a gate of the transistor 468 is electrically connected to the node 465.

One of a source and a drain of the transistor 464 is electrically connected to a potential supply line VO, and the other is electrically connected to the node 467. Furthermore, a gate of the transistor 464 is electrically connected to the wiring 535_g.

One of an anode and a cathode of the light-emitting element 469 is electrically connected to a potential supply line VL_b, and the other is electrically connected to the node 467.

As the light-emitting element 469, an organic electroluminescent element (also referred to as an organic EL element) can be used, for example. Note that the light-emitting element 469 is not limited thereto; an inorganic EL element formed of an inorganic material may be used, for example.

A high power supply potential VDD is supplied to one of the potential supply line VL_a and the potential supply line VL_b, and a low power supply potential VSS is supplied to the other, for example.

In the display device 500 including the pixel circuits 534 in FIG. 18B, the pixels 532 are sequentially selected row by row by the driver circuit 521a and/or the driver circuit 521b, and then the transistor 461 and the transistor 464 are brought into an on state and a video signal is written to the node 465.

The pixel 532 in which data has been written to the node 465 is brought into a holding state when the transistor 461 and the transistor 464 are brought into an off state. Furthermore, the amount of current flowing between the source electrode and the drain electrode of the transistor 468 is adjusted in accordance with the potential of the data written to the node 465, and the light-emitting element 469 emits light with a luminance corresponding to the amount of flowing current. This operation is sequentially performed row by row; thus, an image can be displayed.

Figure 19A:
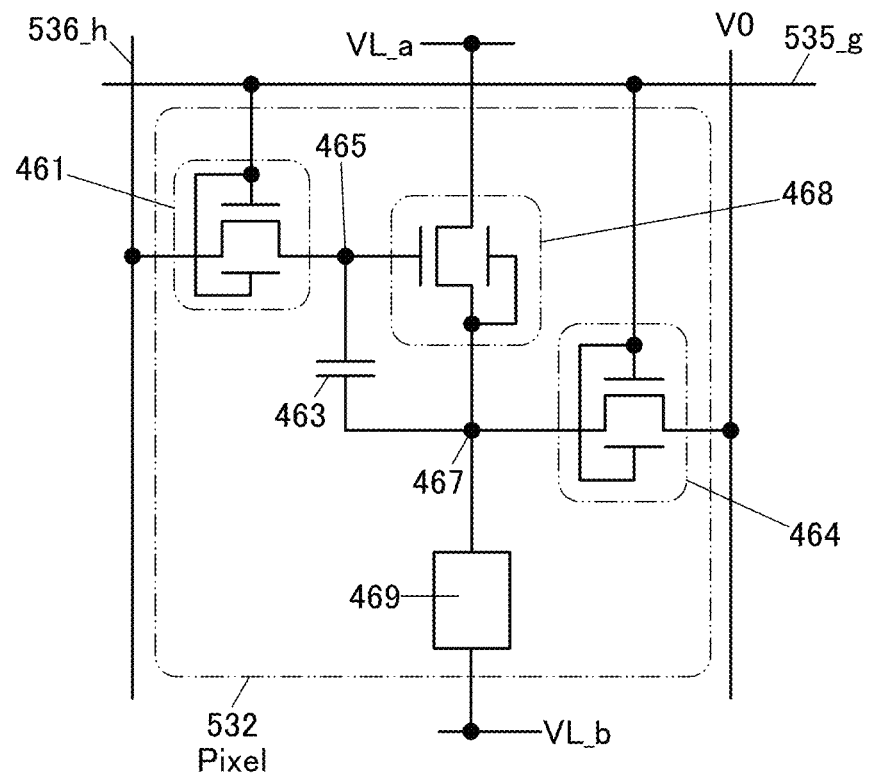
FIG. 19A and FIG. 19B are diagrams illustrating circuit structure examples of a pixel.

As illustrated in FIG. 19A, a transistor having a backgate may be used as the transistor 461, the transistor 464, and the transistor 468. In each of the transistor 461 and the transistor 464 illustrated in FIG. 19A, the gate is electrically connected to the backgate. Thus, the gate and the backgate always have the same potential. The backgate of the transistor 468 is electrically connected to the node 467. Thus, the backgate always has the same potential as the node 467.

The OS transistor described above can be used as at least one of the transistor 461, the transistor 468, and the transistor 464.

[Example of Pixel Circuit for Liquid Crystal Display Device]

Figure 18C:
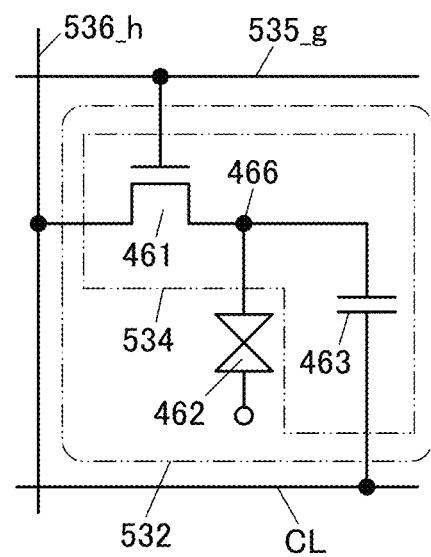

The pixel circuit 534 illustrated in FIG. 18C includes the transistor 461 and the capacitor 463. The pixel circuit 534 illustrated in FIG. 18C is electrically connected to a liquid crystal element 462 that can function as a display element. It is preferable to use an OS transistor as the transistor 461.

The potential of one of a pair of electrodes of the liquid crystal element 462 is set as appropriate according to the specifications of the pixel circuit 534. For example, the one of the pair of electrodes of the liquid crystal element 462 may be supplied with a common potential, or may have the same potential as a capacitor line CL which is described later. Alternatively, a potential supplied to the one of the pair of electrodes of the liquid crystal element 462 may vary among the pixels 532. The other of the pair of electrodes of the liquid crystal element 462 is electrically connected to a node 466. The alignment state of the liquid crystal element 462 depends on data written to the node 466.

As a driving method of the display device including the liquid crystal element 462, for example, a TN (Twisted Nematic) mode, an STN (Super Twisted Nematic) mode, a VA mode, an ASM (Axially Symmetric Aligned Micro-cell) mode, an OCB (Optically Compensated Birefringence) mode, an FLC (Ferroelectric Liquid Crystal) mode, an AFLC (AntiFerroelectric Liquid Crystal) mode, an MVA mode, a PVA (Patterned Vertical Alignment) mode, an IPS mode, an FFS mode, a TBA (Transverse Bend Alignment) mode, and the like may be used. Examples of a driving method of the display device include, in addition to the above driving methods, an ECB (Electrically Controlled Birefringence) mode, a PDLC (Polymer Dispersed Liquid Crystal) mode, a PNLC (Polymer Network Liquid Crystal) mode, and a guest-host mode. However, not limited to the above, a variety of driving methods of display devices can be used.

When the liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

A liquid crystal exhibiting a blue phase for which an alignment film is not needed may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for 5 weight % or more is used for the liquid crystal layer in order to improve the temperature range. The liquid crystal composition that contains a liquid crystal exhibiting the blue phase and a chiral material has a short response time of 1 msec or less, and has optical isotropy, which makes the alignment process unneeded and has the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, the productivity of the liquid crystal display device can be increased.

Moreover, it is possible to use a method called domain multiplication or multi-domain design, in which a pixel (pixel) is divided into some regions (subpixels) and molecules are aligned in different directions in their respective regions.

The specific resistivity of a liquid crystal material is greater than or equal to $1\times10^1$ Ω·cm, preferably greater than or equal to $1\times10^{11}$ Ω·cm, further preferably greater than or equal to 1×10$^{12}$ Ω·cm. Note that a value of the specific resistivity in this specification is a value measured at 20° C.

In the pixel circuit 534 in the g-th row and the h-th column, one of the source and the drain of the transistor 461 is electrically connected to the wiring 536_h, and the other is electrically connected to the node 466. The gate of the transistor 461 is electrically connected to the wiring 535_g. A video signal is supplied from the wiring 536_h. The transistor 461 has a function of controlling writing of a video signal to the node 466.

One of the pair of electrodes of the capacitor 463 is electrically connected to a wiring to which a particular potential is supplied (hereinafter, the capacitor line CL), and the other is electrically connected to the node 466. Note that the potential value of the capacitor line CL is set as appropriate according to the specifications of the pixel circuit 534. The capacitor 463 has the function of a storage capacitor for retaining data written to the node 466.

In the display device 500 including the pixel circuits 534 in FIG. 18C, for example, the pixel circuits 534 are sequentially selected row by row by the driver circuit 521a and/or the driver circuit 521b, and then the transistor 461 is brought into an on state and a video signal is written to the node 466.

The pixel circuit 534 in which the video signal has been written to the node 466 is brought into a holding state when the transistor 461 is brought into an off state. This operation is sequentially performed row by row; thus, an image can be displayed on the display region 531.

Figure 19B:
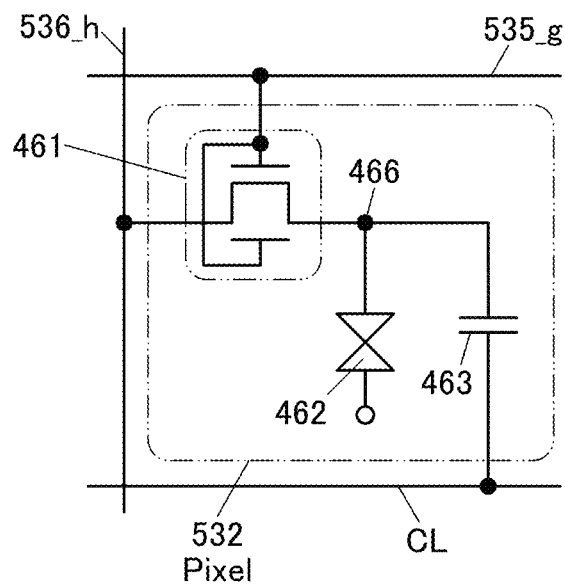

As illustrated in FIG. 19B, a transistor having a backgate may be used as the transistor 461. In the transistor 461 illustrated in FIG. 19B, the gate is electrically connected to the backgate. Thus, the gate and the backgate always have the same potential.

[Structure Example of Peripheral Circuit]

Figure 20A:
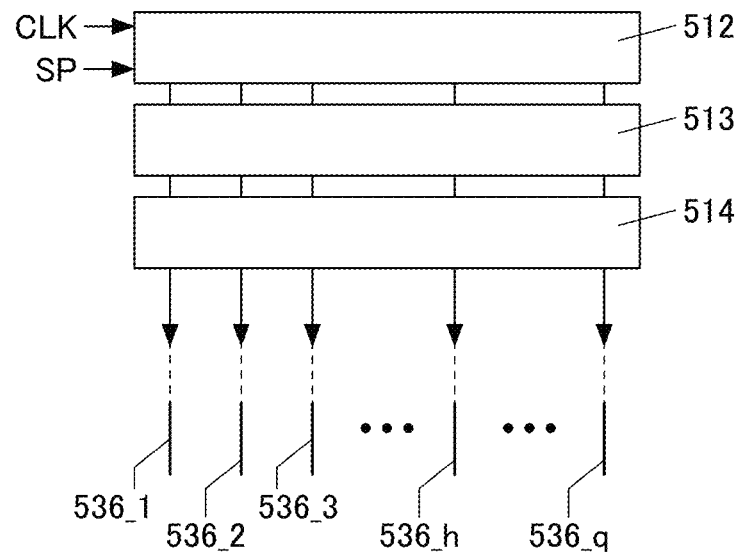
FIG. 20A and FIG. 20B are diagrams illustrating structure examples of a driver circuit.
Figure 20B:
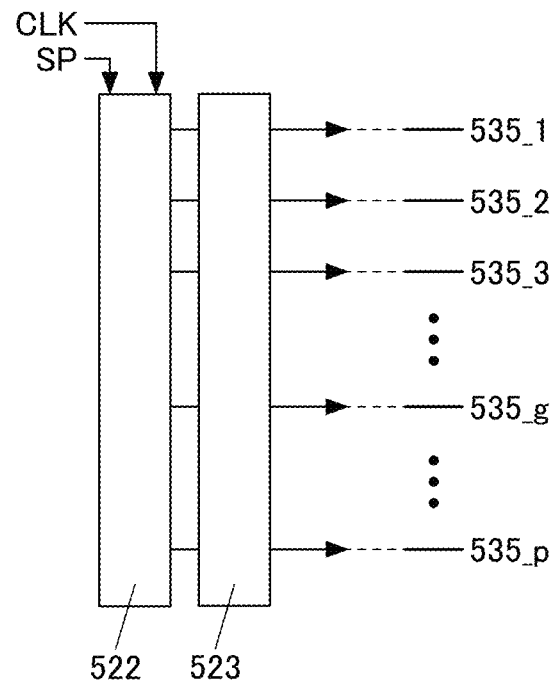

FIG. 20A illustrates a structure example of the driver circuit 511. The driver circuit 511 includes a shift register 512, a latch circuit 513, and a buffer 514. FIG. 20B illustrates a structure example of the driver circuit 521a. The driver circuit 521a includes a shift register 522 and a buffer 523. The driver circuit 521b can have a structure similar to that of the driver circuit 521a.

A start pulse SP, a clock signal CLK, and the like are input to the shift register 512 and the shift register 522.

[Structure Example of Display Device]

With the use the OS transistor described in the above embodiment, some or all of driver circuits that include shift registers can be integrally formed over the same substrate as a pixel portion, whereby a system-on-panel can be formed.

Figure 21A:
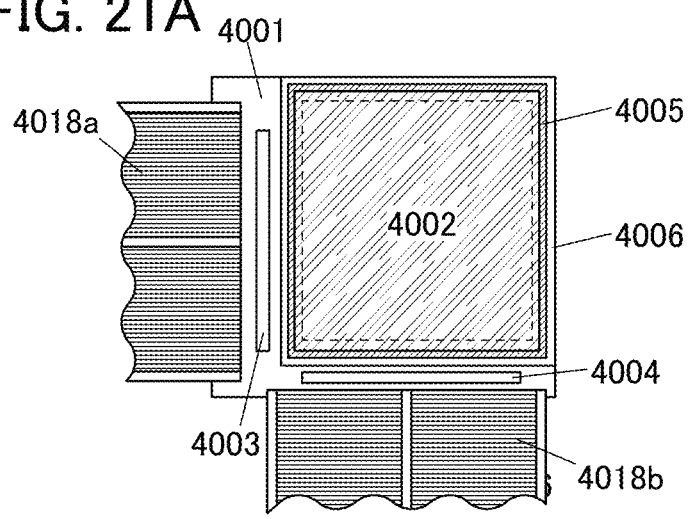
FIG. 21A to FIG. 21C are diagrams illustrating examples of a display device.

In this embodiment, a structure example of a display device using a liquid crystal element and a structure example of a display device using an EL element are described. In FIG. 21A, a sealant 4005 is provided so as to surround a pixel portion 4002 provided over a first substrate 4001, and the pixel portion 4002 is sealed by the sealant 4005 and a second substrate 4006. In FIG. 21A, a signal line driver circuit 4003 and a scan line driver circuit 4004 that are formed using a single crystal semiconductor or a polycrystalline semiconductor over a substrate separately prepared are mounted in a region different from the region surrounded by the sealant 4005 over the first substrate 4001. Various signals and potentials given to the signal line driver circuit 4003, the scan line driver circuit 4004, or the pixel portion 4002 are supplied from an FPC 4018a (Flexible Printed Circuit) and an FPC 4018b.

Figure 21B:
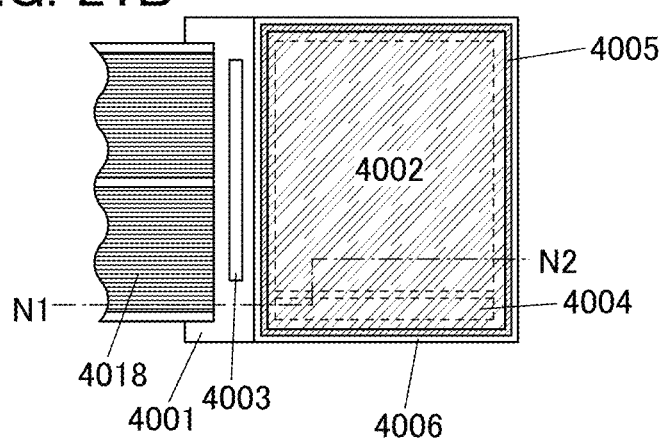
Figure 21C:
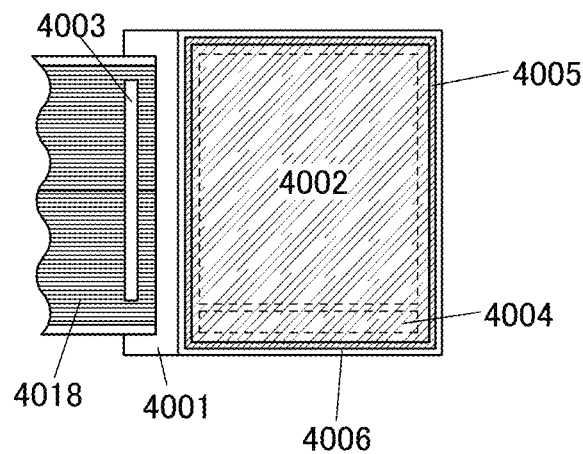

In FIG. 21B and FIG. 21C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Thus, the pixel portion 4002 and the scan line driver circuit 4004 are sealed together with a display element by the first substrate 4001, the sealant 4005, and the second substrate 4006. In FIG. 21B and FIG. 21C, the signal line driver circuit 4003 that is formed using a single crystal semiconductor or a polycrystalline semiconductor over a substrate separately prepared is mounted in a region different from the region surrounded by the sealant 4005 over the first substrate 4001. In FIG. 21B and FIG. 21C, various signals and potentials given to the signal line driver circuit 4003, the scan line driver circuit 4004, or the pixel portion 4002 are supplied from the FPC 4018.

Although FIG. 21B and FIG. 21C illustrate the examples in which the signal line driver circuit 4003 is formed separately and mounted on the first substrate 4001, the structure is not limited thereto. The scan line driver circuit may be separately formed and then mounted, or only part of the signal line driver circuit or part of the scan line driver circuit may be separately formed and then mounted.

Note that there is no particular limitation on the connection method of the separately formed driver circuit; wire bonding, COG (Chip On Glass), TCP (Tape Carrier Package), COF (Chip On Film), or the like can be used. FIG. 21A illustrates an example in which the signal line driver circuit 4003 and the scan line driver circuit 4004 are mounted by COG, FIG. 21B illustrates an example in which the signal line driver circuit 4003 is mounted by COG, and FIG. 21C illustrates an example in which the signal line driver circuit 4003 is mounted by TCP.

In some cases, the display device includes a panel in which the display element is sealed, and a module in which an IC or the like including a controller is mounted on the panel.

The pixel portion and the scan line driver circuit provided over the first substrate include a plurality of transistors, and the OS transistor described in the above embodiment can be used.

FIG. 22A and FIG. 22B are cross-sectional views illustrating cross-sectional structures of portions indicated by the chain line N1-N2 in FIG. 21B. FIG. 22A is an example of a liquid crystal display device using a liquid crystal element as the display element. FIG. 22B is an example of a light-emitting display device (also referred to as an "EL display device") using a light-emitting element as the display element.

The display devices illustrated in FIG. 22A and FIG. 22B each include an electrode 4015, and the electrode 4015 is electrically connected to a terminal included in the FPC 4018 through an anisotropic conductor 4019. The electrode 4015 is electrically connected to a wiring 4014 in an opening formed in an insulator 4112, an insulator 4111, and an insulator 4110.

The electrode 4015 is formed of the same conductor as a first electrode layer 4030, and the wiring 4014 is formed of the same conductor as source electrodes and drain electrodes of a transistor 4010 and a transistor 4011.

The pixel portion 4002 and the scan line driver circuit 4004 provided over the first substrate 4001 include a plurality of transistors, and in FIG. 22A and FIG. 22B, the transistor 4010 included in the pixel portion 4002 and the transistor 4011 included in the scan line driver circuit 4004 are illustrated as examples. The insulator 4112 is provided over the transistor 4010 and the transistor 4011 in FIG. 22A, and a partition wall 4510 is formed over the insulator 4112 in FIG. 22B.

The transistor 4010 and the transistor 4011 are provided over an insulator 4102. The transistor 4010 and the transistor 4011 each include an electrode 4017 formed over an insulator 4103, and the insulator 4112 is formed over the electrode 4017. Note that the electrode 4017 can function as a back gate electrode.

The transistor described in the above embodiment can be used as the transistor 4010 and the transistor 4011. It is preferable to use OS transistors as the transistor 4010 and the transistor 4011. A change in the electrical characteristics of OS transistors is inhibited and thus the OS transistors are electrically stable. Accordingly, the display devices of this embodiment illustrated in FIG. 22A and FIG. 22B can be highly reliable display devices.

In the OS transistor, a current value in an off state (off-state current value) can be made small. Accordingly, the retention time of an electrical signal such as an image signal can be made longer, and a writing interval can also be set longer in a power-on state. Accordingly, the frequency of refresh operation can be reduced, which leads to an effect of reducing power consumption.

The OS transistor can have relatively high field-effect mobility and is thus capable of high-speed operation. Consequently, when the above OS transistor is used in a driver circuit portion or the pixel portion of the display device, high-quality images can be obtained. Moreover, the driver circuit portion or the pixel portion can be separately formed over the same substrate, so that the number of components of the display device can be reduced.

The display devices illustrated in FIG. 22A and FIG. 22B each include a capacitor 4020. The capacitor 4020 includes an electrode 4021 formed in the same step as a gate electrode of the transistor 4010, and an electrode formed in the same step as a source electrode and a drain electrode thereof. The electrodes overlap with each other with the insulator 4103 therebetween.

In general, the capacitance of a capacitor provided in a pixel portion of the display device is set in consideration of leakage current or the like of a transistor provided in the pixel portion so that charge can be held for a predetermined period. The capacitance of the capacitor may be set in consideration of off-state current of the transistor or the like.

For example, when an OS transistor is used for the pixel portion of the liquid crystal display device, the capacitance of the capacitor can be ⅓ or smaller or ⅕ or smaller of the liquid crystal capacitance. Moreover, using an OS transistor can omit the formation of a capacitor.

The transistor 4010 provided in the pixel portion 4002 is electrically connected to the display element. In FIG. 22A, a liquid crystal element 4013 that is a display element includes the first electrode layer 4030, a second electrode layer 4031, and a liquid crystal layer 4008. An insulator 4032 and an insulator 4033 having a function of alignment films are provided to sandwich the liquid crystal layer 4008. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulator and is provided to adjust a distance (cell gap) between the first electrode layer 4030 and the second electrode layer 4031. Note that a spherical spacer may be used.

In the display device, a black matrix (light-blocking layer), an optical member (optical substrate) such as a polarizing member, a retardation member, or an anti-reflection member, and the like may be provided. For example, circular polarization may be employed by using a polarizing substrate and a retardation substrate. In addition, a backlight, a side light, or the like may be used as a light source.

The display devices illustrated in FIG. 22A and FIG. 22B include the insulator 4111 and an insulator 4104. As the insulator 4111 and the insulator 4104, insulators through which an impurity element does not easily transmit are used. A semiconductor layer of the transistor is sandwiched between the insulator 4111 and the insulator 4104, whereby entry of impurities from the outside can be prevented. Moreover, when the insulator 4111 and the insulator 4104 are in contact with each other outside the pixel portion 4002, the effect of preventing entry of impurities from the outside can be enhanced.

The insulator 4104 can be formed using a material and a method similar to those for the insulator 222, for example. The insulator 4111 can be formed using a material and a method similar to those for the insulator 274, for example.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected from the anode side and electrons are injected from the cathode side into the EL layer. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. The carriers (electrons and holes) are recombined, and thus, a light-emitting organic compound forms an excited state, and light is emitted when the excited state returns to a ground state. Owing to such a mechanism, this light-emitting element is referred to as a current-excitation light-emitting element.

Note that in addition to the light-emitting compound, the EL layer may include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions. Note that the description is made here using an organic EL element as a light-emitting element.

In order that light emitted from the light-emitting element can be extracted, at least one of the pair of electrodes is transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

A light-emitting element 4513 that is a display element is electrically connected to the transistor 4010 provided in the pixel portion 4002. The structure of the light-emitting element 4513 is a stacked-layer structure of the first electrode layer 4030, a light-emitting layer 4511, and the second electrode layer 4031; however, the structure is not limited thereto. The structure of the light-emitting element 4513 can be changed as appropriate depending on, for example, the direction in which light is extracted from the light-emitting element 4513.

The partition wall 4510 is formed using an organic insulating material or an inorganic insulating material. It is particularly preferable that a photosensitive resin material be used, and an opening portion be formed over the first electrode layer 4030 such that a side surface of the opening portion is formed to be an inclined surface having continuous curvature.

The light-emitting layer 4511 may be formed using a single layer or a plurality of layers stacked.

A protective layer may be formed over the second electrode layer 4031 and the partition wall 4510 in order to prevent entry of oxygen, hydrogen, moisture, carbon dioxide, and the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be formed. In a space that is sealed by the first substrate 4001, the second substrate 4006, and the sealant 4005, a filler 4514 is provided for sealing. In this manner, it is preferable that packaging (sealing) be performed with a protective film (such as a laminate film or an ultraviolet curable resin film) or a cover material with high air-tightness and little degasification to prevent exposure to the outside air.

As the filler 4514, an ultraviolet curable resin or a thermosetting resin as well as an inert gas such as nitrogen or argon can be used; and PVC (polyvinyl chloride), an acrylic resin, polyimide, an epoxy resin, a silicone resin, PVB (polyvinyl butyral), EVA (ethylene vinyl acetate), or the like can be used. In addition, a drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. In addition, a drying agent may be contained in the sealant 4005.

In addition, if necessary, an optical film such as a polarizing plate, a circularly polarizing plate (including an elliptically polarizing plate), a retardation plate (a λ/4 plate or a λ/2 plate), or a color filter may be provided as appropriate on a light-emitting surface of the light-emitting element. Furthermore, the polarizing plate or the circularly polarizing plate may be provided with an anti-reflection film. For example, anti-glare treatment that can reduce glare by diffusing reflected light with projections and depressions on a surface can be performed.

When the light-emitting element has a microcavity structure, light with high color purity can be extracted. Furthermore, when a microcavity structure and a color filter are used in combination, glare can be reduced and visibility of a displayed image can be increased.

The first electrode layer and the second electrode layer (also referred to as a pixel electrode layer, a common electrode layer, a counter electrode layer, or the like) for applying voltage to the display element have light-transmitting properties or light-reflecting properties, which depends on the direction in which light is extracted, the position where the electrode layer is provided, and the pattern structure of the electrode layer.

For the first electrode layer 4030 and the second electrode layer 4031, a light-transmitting conductive material such as an indium oxide containing tungsten oxide, an indium zinc oxide containing tungsten oxide, an indium oxide containing titanium oxide, an indium tin oxide, an indium tin oxide containing titanium oxide, an indium zinc oxide, or an indium tin oxide to which silicon oxide is added can be used.

The first electrode layer 4030 and the second electrode layer 4031 can be formed using one or more kinds of metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and metal nitrides thereof.

A conductive composition containing a conductive high molecule (also referred to as conductive polymer) can be used for the first electrode layer 4030 and the second electrode layer 4031. As the conductive high molecule, what is called a π-electron conjugated conductive high molecule can be used. Examples include polyaniline or a derivative thereof, polypyrrole or a derivative thereof, polythiophene or a derivative thereof, and a copolymer of two or more kinds of aniline, pyrrole, and thiophene or a derivative thereof.

Since the transistor is easily broken owing to static electricity or the like, a protective circuit for protecting the driver circuit is preferably provided. The protective circuit is preferably formed using a nonlinear element.

With the use of the transistor described in the above embodiment, it is possible to provide a highly reliable display device. With the use of the transistor described in the above embodiment, it is possible to further increase the reliability of the display device. With the use of the transistor described in the above embodiment, it is possible to provide a display device that has a high resolution, a large size, and high display quality. Furthermore, a display device with low power consumption can be provided.

<Display Module>

Figure 23:
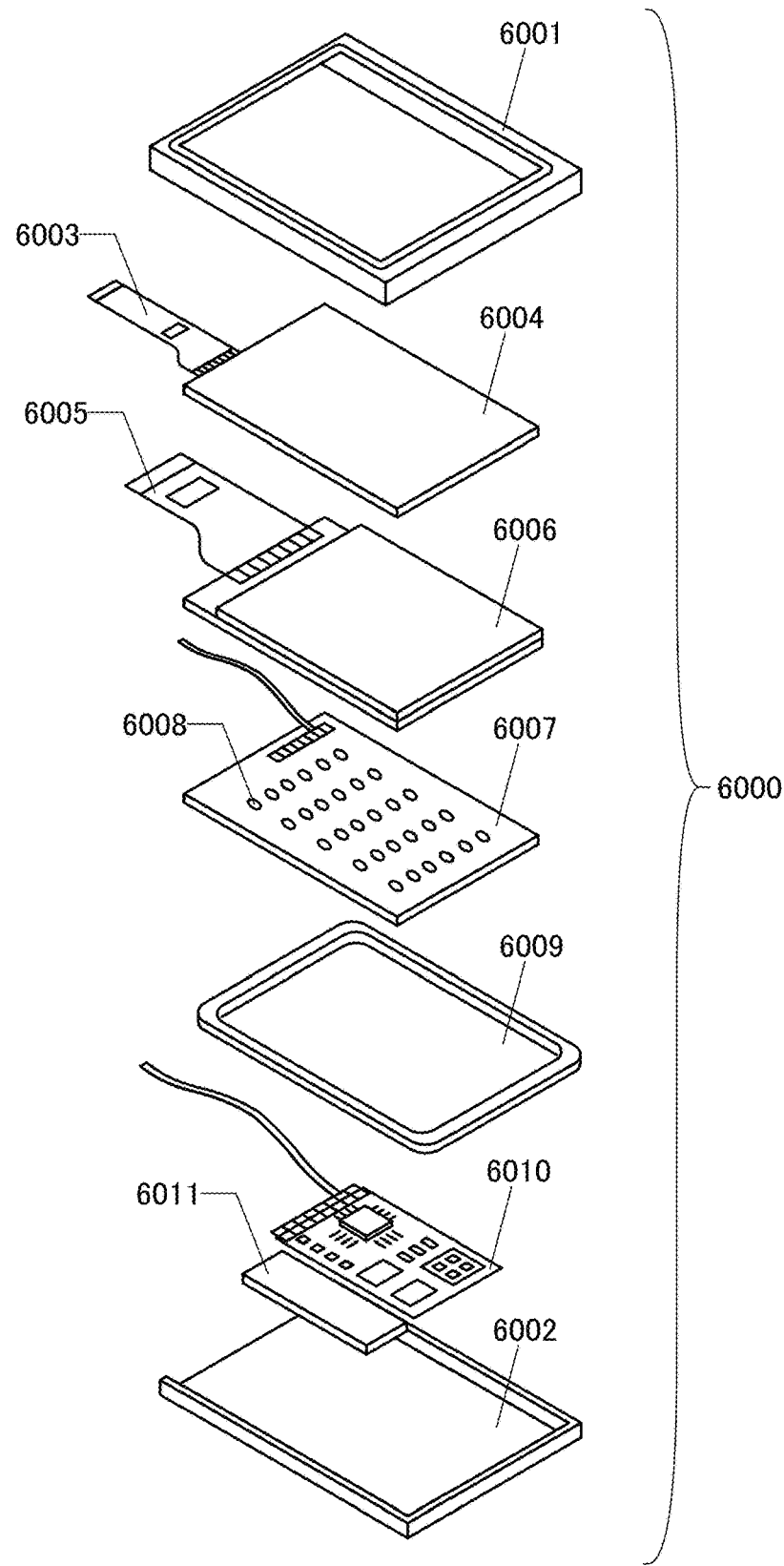
FIG. 23 is a diagram illustrating an example of a display module.

A display module is described as an example of a semiconductor device using the above-described OS transistor. In a display module 6000 illustrated in FIG. 23, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, and an integrated circuit mounted on the printed circuit board 6010. For example, the above-described display device can be used for the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive or capacitive touch sensor and can be formed to overlap with the display panel 6006. A touch sensor function can be added to the display panel 6006. For example, an electrode for a touch sensor can be provided in each pixel of the display panel 6006 so that a capacitive touch panel function is added. Alternatively, a photosensor can be provided in each pixel of the display panel 6006 so that an optical touch sensor function is added, for example. In the case where the touch sensor 6004 do not need to be provided, the touch sensor 6004 can be omitted.

The backlight unit 6007 includes a light source 6008. A structure may be employed in which the light source 6008 is provided at an end portion of the backlight unit 6007 and a light diffusing plate is used. When a light-emitting display device or the like is used for the display panel 6006, the backlight unit 6007 can be omitted.

The frame 6009 has a function of protecting the display panel 6006 and a function of an electromagnetic shield for blocking electromagnetic waves generated from the printed circuit board 6010 side. The frame 6009 may also have a function of a radiator plate.

The printed circuit board 6010 includes a power supply circuit, a signal processing circuit for outputting a video signal and a clock signal, and the like. As a power supply for supplying power to the power supply circuit, the battery 6011 or a commercial power supply may be used. Note that the battery 6011 can be omitted when a commercial power supply is used as the power supply.

The display module 6000 can be additionally provided with a member such as a polarizing plate, a retardation plate, or a prism sheet.

This embodiment can be implemented in an appropriate combination with the structures described in the other embodiments and the like.

Embodiment 7

The semiconductor device of one embodiment of the present invention can be used as a processor such as a CPU and a GPU or a chip. FIG. 24 illustrates specific examples of electronic devices including processors such as a CPU and a GPU, or a chip of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 24 illustrates examples of electronic devices.

[Information Terminal]

Figure 24A:
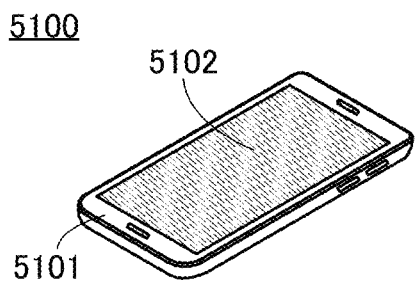
FIG. 24A to FIG. 24H are diagrams illustrating electronic devices.

FIG. 24A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 24B:
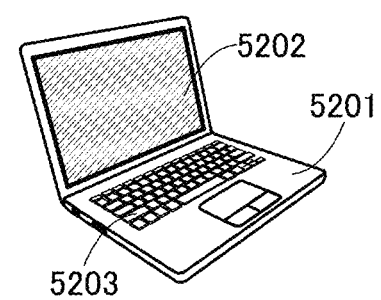

FIG. 24B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 24A and FIG. 24B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 24C:
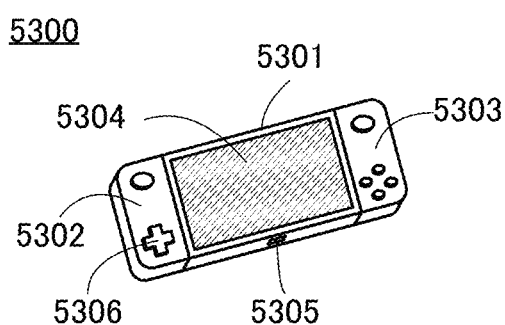

FIG. 24C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can perform a game at the same time. The chip described in the above embodiment can be incorporated into the chip provided on a substrate in the housing 5301, the housing 5302 and the housing 5303.

Figure 24D:
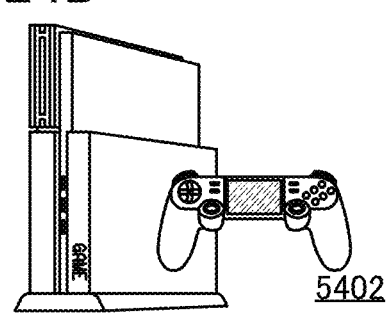

FIG. 24D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is used in the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, questions posed by the player, the progress of the game, time, and actions and words of game characters can be changed for various expressions.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 24C and FIG. 24D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 24E:
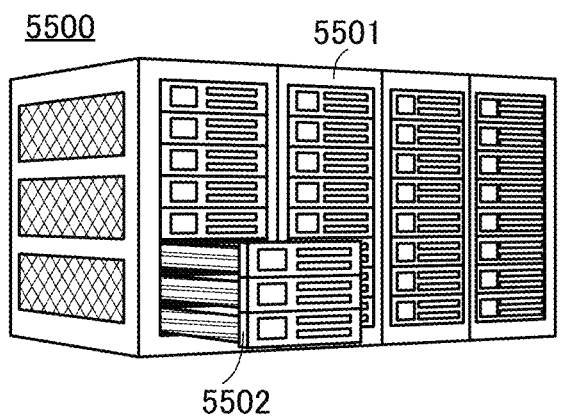
Figure 24F:
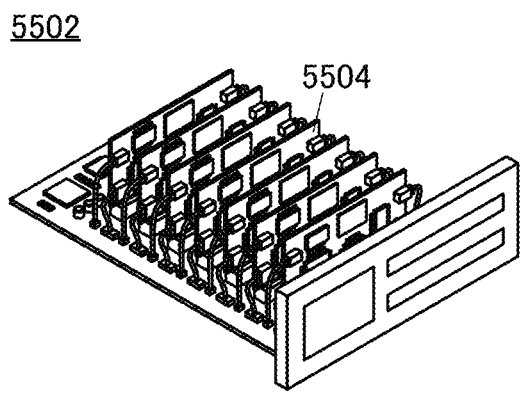

FIG. 24E illustrates a supercomputer 5500 as an example of a large computer. FIG. 24F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is illustrated as an example of a large computer in FIG. 24E and FIG. 24F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be used in an automobile, which is a moving vehicle, and the periphery of a driver's seat in the automobile.

Figure 24G:
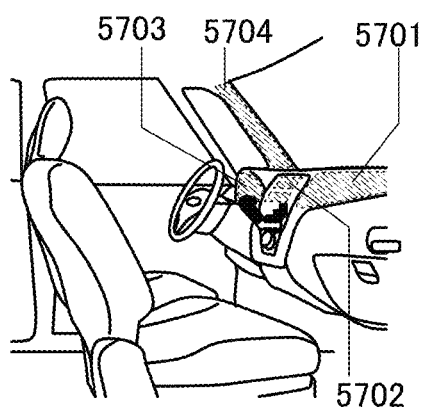

FIG. 24G illustrates an area around a windshield inside an automobile, which is an example of a moving vehicle. FIG. 24G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. In addition, display of an image that complements the area that cannot be seen makes it possible to confirm safety more naturally and comfortably. The display panel 5704 can also be used as a lighting device.

Since the GPU or the chip of one embodiment of the present invention can be used as a component of artificial intelligence, the chip can be used for an automatic driving system of the automobile, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Household Appliance]

Figure 24H:
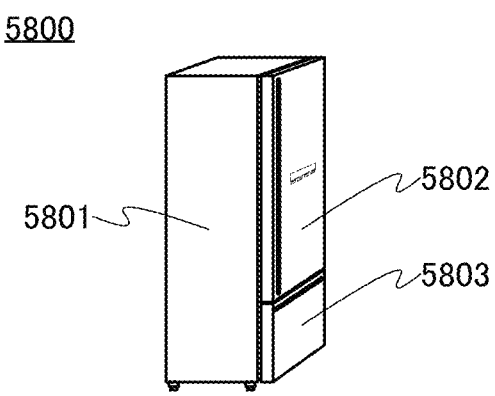

FIG. 24H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and the food expiration dates, for example, a function of automatically adjusting the temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic device and the functions of the electronic device, the application example of the artificial intelligence and its effects, and the like described in this embodiment can be combined as appropriate with the description of another electronic device.

This embodiment can be implemented in an appropriate combination with the structures described in the other embodiments, examples, and the like.

Example 1

In this example, eight kinds of samples, i.e., Sample 1A, Sample 1B, Sample 1C, Sample 1D, Sample 1E, Sample 1F, Sample 1G, and Sample 1H, were fabricated, and TDS analysis was performed.

<Structure and Fabrication Method of Samples>

Sample 1A to Sample 1H relating to one embodiment of the present invention are described below.

First, FIG. 25A illustrates a structure of Sample 1B to Sample 1D. Sample 1A to Sample 1D each include a substrate 900, an insulator 902 over the substrate 900, an insulator 904 containing excess oxygen over the insulator 902, an oxide semiconductor 906 over the insulator 904 containing excess oxygen, and a metal layer 908 over the oxide semiconductor 906.

Next, FIG. 25B illustrates a structure of Sample 1E to Sample 1H. Sample 1E to Sample 1H each include the substrate 900, the insulator 902 over the substrate 900, the insulator 904 containing excess oxygen over the insulator 902, the oxide semiconductor 906 over the insulator 904 containing excess oxygen, an oxide 907 over the oxide semiconductor 906, and the metal layer 908 over the oxide 907. Note that as the oxide 907, an oxide of an element having lower Gibbs energy of formation in an Ellingham diagram than that in the oxide semiconductor 906 was used.

Here, Sample 1B to Sample 1D and Sample 1E to Sample 1H include the metal layers 908 with different materials and deposition methods. The presence or absence of the oxide 907 and the materials and deposition methods of the metal layers 908 in samples are shown in the table below.

Note that Sample 1A had the structure illustrated in FIG. 25A without the metal layer 908. Moreover, Sample 1E had the structure illustrated in FIG. 25B without the metal layer 908.

TABLE 1

| Sample name | Presence or absence of 907 | Material and thickness [nm] of 908 | Deposition method of 908 |
|---|---|---|---|
| Sample 1A | Absent | — | — |
| Sample 1B | Absent | TaN: 20 [nm] | Sputtering method |
| Sample 1C | Absent | TiN\W: 10\30 [nm] | Sputtering method |
| Sample 1D | Absent | TiN\W: 5\250 [nm] | CVD method |
| Sample 1E | Present | — | — |
| Sample 1F | Present | TaN: 20 [nm] | Sputtering method |
| Sample 1G | Present | TiN\W: 10\30 [nm] | Sputtering method |
| Sample 1H | Present | TiN\W: 5\250 [nm] | CVD method |

Methods for fabricating the samples are described.

First, a silicon substrate was prepared as the substrate 900. Then, a 100-nm-thick thermal oxide film was formed as the insulator 902 over the substrate 900.

Next, the insulator 904 containing excess oxygen was deposited over the insulator 902. A silicon oxynitride film was formed to a thickness of 300 nm by a plasma CVD method. As deposition conditions, silane ($SiH_4$) at a flow rate of 2.3 sccm and dinitrogen monoxide ($N_2O$) at a flow rate of 800 sccm were used. The deposition was performed under the conditions where the pressure in a reaction chamber was 40 Pa, the deposition temperature was 400° C., and a high-frequency (RF) power of 50 W (27.12 MHz) was applied.

Then, oxygen ions ($^{16}O$) were implanted into the silicon oxynitride film by an ion implantation method. The conditions for the oxygen ion implantation were as follows: an acceleration voltage was 60 kV and a dosage was $2.0 \times 10^{16}$ ions/$cm^2$.

Next, as the oxide semiconductor 906, an In—Ga—Zn oxide was deposited by a sputtering method. Note that the oxide semiconductor 906 had a two-layer structure. As a first layer of the oxide semiconductor 906, a 5-nm-thick In—Ga—Zn oxide was deposited using a target with In:Ga:Zn=1:3:4 [atomic ratio]. As a second layer of the oxide semiconductor 906, a 15-nm-thick In—Ga—Zn oxide was deposited using a target with In:Ga:Zn=4:2:4.1 [atomic ratio].

Then, after heat treatment was performed under a nitrogen atmosphere at 400° C. for one hour, the atmosphere was replaced by an oxygen atmosphere and heat treatment was performed in the oxygen atmosphere at 400° C. for one hour.

Here, in each of Sample 1E to Sample 1H, as the oxide 907, a 10-nm-thick silicon oxide film was deposited over the oxide semiconductor 906. As deposition conditions, silane ($SiH_4$) at a flow rate of 1 sccm and dinitrogen monoxide ($N_2O$) at a flow rate of 800 sccm were used. The deposition was performed under the conditions where the pressure in the reaction chamber was 200 Pa, the deposition temperature was 350° C., and a high-frequency (RF) power of 150 W (60 MHz) was applied.

Next, in Sample 1B to Sample 1D, as the metal layers 908, the metal layers 908 shown in the above table were deposited over the oxide semiconductors 906. In Sample 1F to Sample 1H, as the metal layers 908, the metal layers 908 shown in the above table were deposited over the oxides 907.

Here, in Sample 1B to Sample 1D and Sample 1F to Sample 1H, a substrate that was not subjected to heat treatment (a substrate showing a state before heating) and a substrate that was subjected to heat treatment assumed as treatment involving heating (a substrate showing a state after heating) were prepared to examine a change in the amount of excess oxygen contained in the insulator 904 due to treatment involving heating in a subsequent step. Note that as the heat treatment, heat treatment was performed at 400° C. in a nitrogen atmosphere for four hours.

Through the above steps, the samples of this example were fabricated.

<TDS Measurement Results of Samples>

In each of Sample 1A to Sample 1H, after the metal layer 908, the oxide 907, and the oxide semiconductor 906 were removed, the amount of released oxygen from the insulator 904 was measured. In the TDS analysis, the amount of a released gas with a mass-to-charge ratio m/z of 32, which corresponds to an oxygen molecule, was measured. TDSWA1000S produced by ESCO Ltd. was used as a TDS analysis apparatus, and a temperature rising rate was 30° C./min. FIG. 26 shows the measurement results.

Figure 26A:
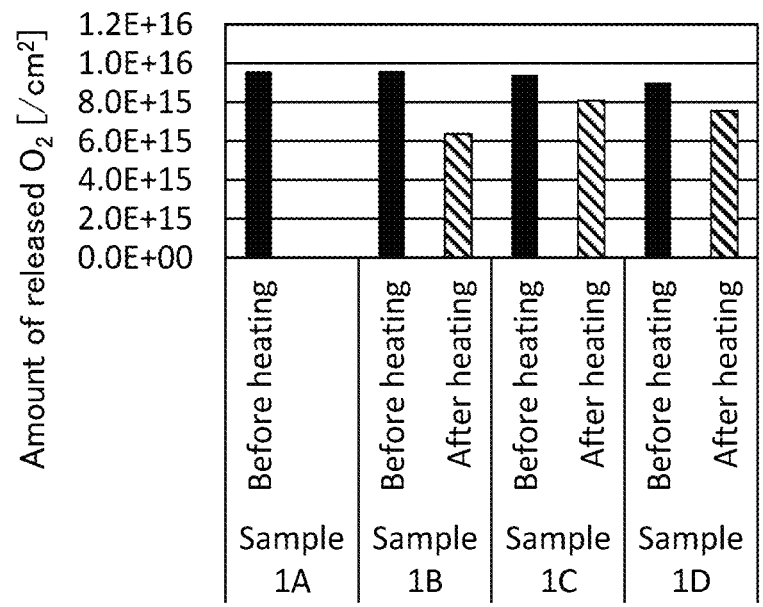
FIG. 26A and FIG. 26B are diagrams each showing TDS analysis results of samples of an example.

FIG. 26A shows the amount of released oxygen ($O_2$) [/cm$^2$] when Sample 1A to Sample 1D were heated to 500° C. Accordingly, the vertical axis in FIG. 26A represents the amount of released oxygen ($O_2$) [/cm$^2$]. Note that for Sample 1B to Sample 1D, the amount of oxygen (02) [/cm$^2$] before and after the heat treatment is shown.

Figure 26B:
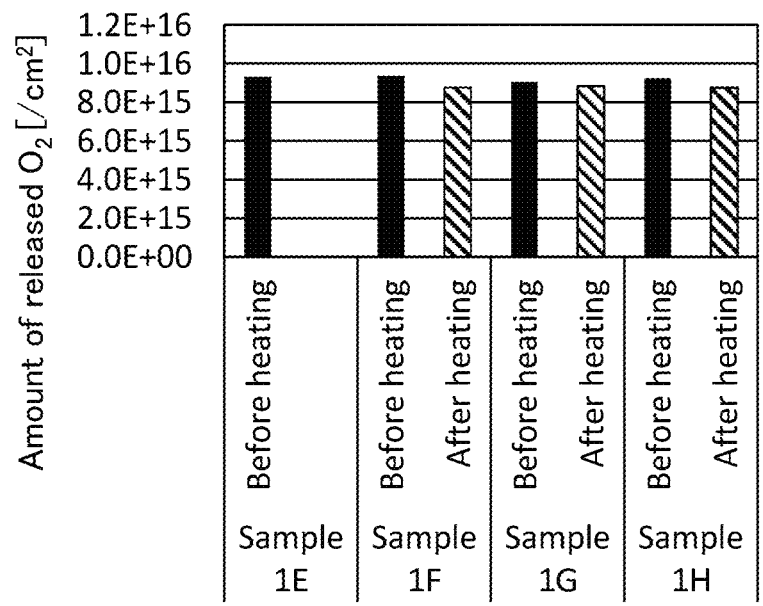

FIG. 26B shows the amount of released oxygen ($O_2$) [/cm$^2$] when Sample 1E to Sample 1H were heated to 500° C. Accordingly, the vertical axis in FIG. 26B represents the amount of released oxygen ($O_2$) [/cm$^2$]. Note that for Sample 1F to Sample 1H, the amount of oxygen ($O_2$) [/cm$^2$] before and after the heat treatment is shown.

Note that the lower limit in the temperature range was the temperature at which release of a gas was observed (approximately 40° C. or higher). Thus, the amount of a released gas at the lower measurement limit or below is not included.

FIG. 26A shows that in the structure in which the insulator 904 containing excess oxygen, the oxide semiconductor 906 over the insulator 904 containing excess oxygen, and the metal layer 908 over the oxide semiconductor 906 are included, excess oxygen in the insulator 904 containing excess oxygen was reduced by performing heat treatment.

By contrast, FIG. 26B shows that in the structure in which the insulator 904 containing excess oxygen, the oxide semiconductor 906 over the insulator 904 containing excess oxygen, the oxide 907 over the oxide semiconductor 906, and the metal layer 908 over the oxide 907 are included, a difference in the amount of excess oxygen in the insulator 904 containing excess oxygen between before and after the heat treatment became smaller.

Accordingly, it was found from FIG. 26A that excess oxygen in the insulator 904 is moved into the oxide semiconductor 906 from the insulator 904. Moreover, it was found that the excess oxygen that has moved into the oxide semiconductor 906 is moved into the metal layer 908.

FIG. 26A and FIG. 26B showed that movement of excess oxygen contained in the insulator 904 into the oxide 907 from the oxide semiconductor 906 is inhibited.

That is, in an Ellingham diagram, it is considered that at an interface between an oxide of an element having relatively high Gibbs energy of formation (corresponding to the oxide semiconductor 906) and an oxide of an element having relatively low Gibbs energy of formation (corresponding to the oxide 907), movement of oxygen into the oxide of the element having relatively high Gibbs energy of formation from the oxide of the element having relatively low Gibbs energy of formation is inhibited.

From the above, it was found that the metal layer 908 absorbs excess oxygen in the insulator 904 through the oxide semiconductor 906 by heat treatment. Meanwhile, it was found that when the oxide 907 is positioned between the oxide semiconductor 906 and the metal layer 908, the movement of excess oxygen in the insulator 904 into the metal layer 908 can be inhibited.

From the above, it was found that when a structure in which a film containing excess oxygen, a film that inhibits oxygen diffusion, an oxide film of an element having lower Gibbs energy of formation in an Ellingham diagram than that in an oxide semiconductor, a film containing an oxide semiconductor, and a film that absorbs oxygen are stacked sequentially is employed, absorption of excess oxygen in the film containing excess oxygen by the film that absorbs oxygen can be inhibited.

When the film that absorbs oxygen and the oxide semiconductor are provided to be in contact with each other, it is highly possible that oxygen vacancies are generated in the oxide semiconductor. In the case where oxygen vacancies are generated in the oxide semiconductor, the oxide semiconductor tends to take an oxygen element from the oxide that is in contact with the oxide semiconductor. However, in the case where the oxide is an oxide of an element having lower Gibbs energy of formation in an Ellingham diagram than that in the oxide semiconductor, it is considered that movement of oxygen into the oxide semiconductor from the oxide can be inhibited.

The structure described above in this example can be used in an appropriate combination with the other examples or the other embodiments.

Example 2

In this example, a semiconductor device including a plurality of regions each of which included a plurality of transistors 200 illustrated in FIG. 1 (hereinafter referred to as transistor formation regions) were fabricated, and the electrical characteristics of a given transistor 200 was measured. Here, in the transistor formation region, the density of the transistors 200 was set to 2.9/μm$^2$. The channel length and channel width of the transistor 200 were each designed to be 60 nm.

Note that the transistor 200 illustrated in FIG. 1, which was fabricated in this example, was Sample 2A. As a comparative example, a semiconductor device in which the transistors 200 having the structure illustrated in FIG. 1 and not provided with the metal oxide 226 were arranged in a layout similar to that of Sample 2A was fabricated, and the semiconductor device was Sample 2B.

<Fabrication Method of Samples>

The fabrication method of the transistor 200 illustrated in FIG. 1, which was fabricated in this example, is described below.

The conductor 205 was formed in such a manner that a tungsten film was deposited by a sputtering method and processed.

As the insulator 222, a 20-nm-thick hafnium oxide film was deposited by an ALD method.

As the insulator 224, a 30-nm-thick silicon oxynitride film was deposited. As deposition conditions, silane ($SiH_4$) at a flow rate of 1 sccm and dinitrogen monoxide ($N_2O$) at a flow rate of 800 sccm were used. The deposition was performed under the conditions where the pressure in a reaction chamber was 40 Pa, the deposition temperature was 400° C., and a high-frequency (RF) power of 150 W (60 MHz) was applied.

As the metal oxide 226, a 3-nm-thick aluminum oxide film was deposited. Here, an oxide film was formed as the metal oxide 226 by a sputtering method in an atmosphere containing oxygen, whereby excess oxygen was injected into the insulator 224. Note that the aluminum oxide film was deposited by a sputtering method using an $Al_2O_3$ target in a mixed atmosphere of oxygen ($O_2$) and argon (Ar). The deposition was performed under the conditions where the pressure in the reaction chamber was 0.4 Pa, the deposition temperature was 250° C., and the deposition power was 2.5 kW (RF).

The oxide 230b had a stacked-layer structure including two layers. As the first oxide 230b, an In—Ga—Zn oxide was deposited by a sputtering method using a target with In:Ga:Zn=4:2:4.1 [atomic ratio]. Next, as the second oxide 230b, an In—Ga—Zn oxide was deposited over the first oxide 230b by a sputtering method using a target with In:Ga:Zn=1:3:4 [atomic ratio]. Note that the first oxide 230b and the second oxide 230b were successively deposited.

The oxide 230c had a stacked-layer structure including two layers. As the first oxide 230c, an In—Ga—Zn oxide was deposited by a sputtering method using a target with In:Ga:Zn=4:2:4.1 [atomic ratio]. Next, as the second oxide 230c, an In—Ga—Zn oxide was deposited over the first oxide 230c by a sputtering method using a target with In:Ga:Zn=1:3:4 [atomic ratio]. Note that the first oxide 230c and the second oxide 230c were successively deposited.

As the insulator 250, a 10-nm-thick silicon oxide film was deposited. As deposition conditions, silane ($SiH_4$) at a flow rate of 1 sccm and dinitrogen monoxide ($N_2O$) at a flow rate of 800 sccm were used. The deposition was performed under the conditions where the pressure in the reaction chamber was 200 Pa, the deposition temperature was 350° C., and a high-frequency (RF) power of 150 W (60 MHz) was applied.

The conductor 260 was formed in such a manner that a titanium nitride film and a tungsten film were successively deposited by a CVD method and processed.

Through the above steps, the transistor 200 was fabricated.

<Cross-Sectional Observation of Transistor 200>

Next, a cross section of the transistor 200 in Sample 2A in the channel width direction was observed. Note that the cross-sectional observation was performed with a scanning transmission electron microscope (STEM). As an apparatus for the observation, HD-2700 manufactured by Hitachi High-Technologies Corporation was used.

Figure 28:
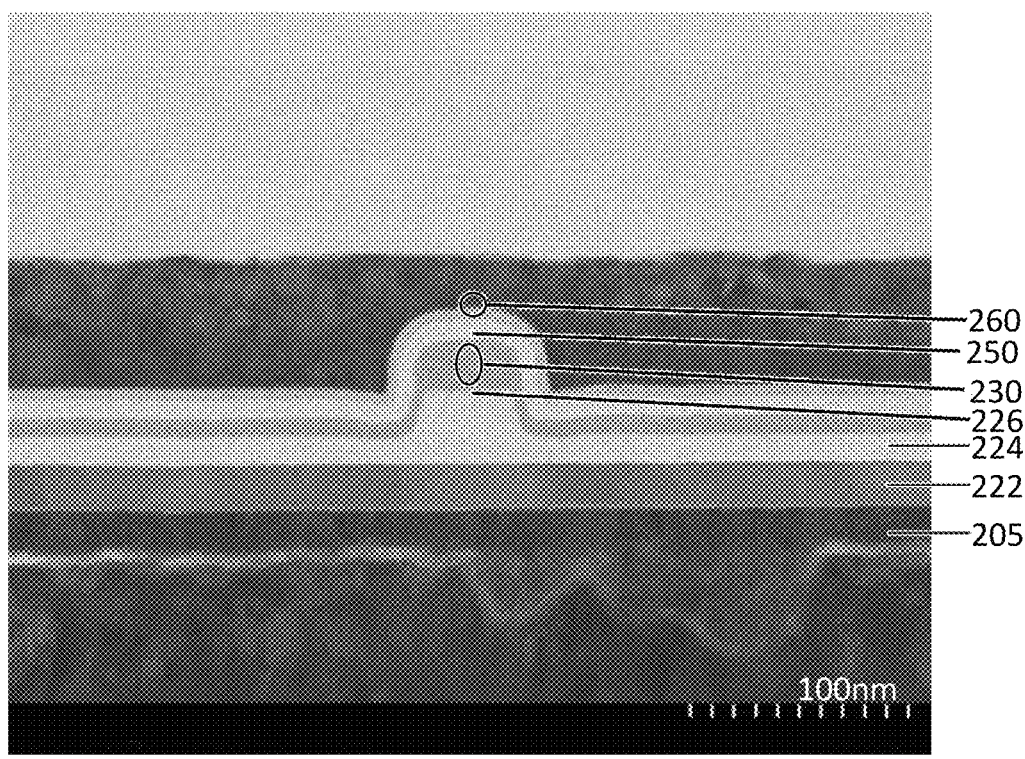
FIG. 28 is a diagram showing a cross section of a transistor fabricated in an example.

FIG. 28 shows the cross-sectional STEM observation result of Sample 2A. FIG. 28 showed that a structure in which the insulator 224 and the oxide 230b are not in contact with each other, and the oxide 230c and the insulator 224 are in direct contact with each other can be obtained.

<Electrical Characteristics of Transistors>

As electrical characteristics of a transistor portioned in the center portion of the transistor region of each of Sample 2A and Sample 2B and a transistor positioned in an end portion of the region, the Id-Vg characteristics and the field-effect mobilities (hereinafter collectively also referred to as electrical characteristics) were measured.

Figure 27:
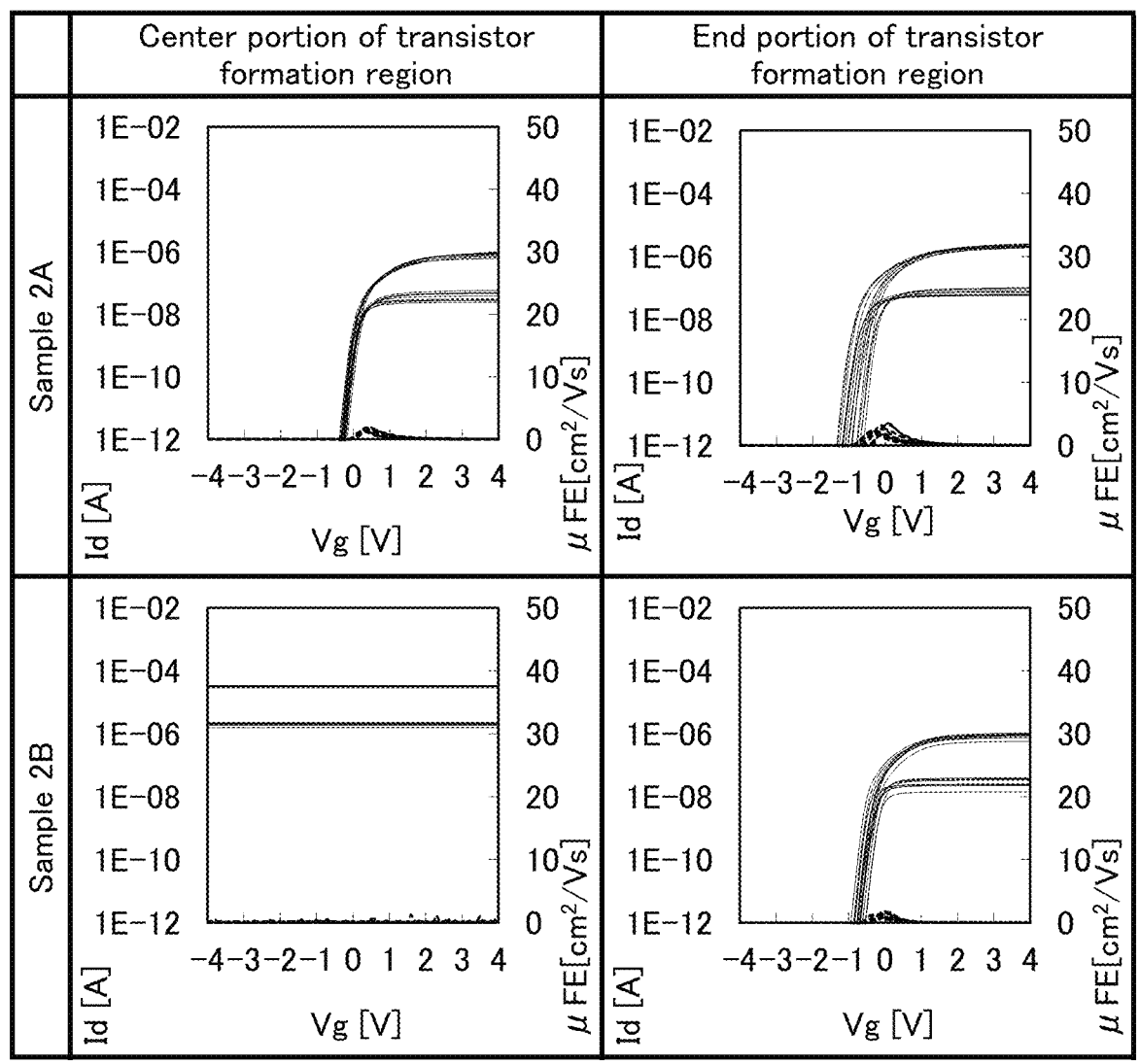
FIG. 27 shows graphs showing electrical characteristics of transistors fabricated in an example.

FIG. 27 shows initial Id-Vg characteristics and the field-effect mobility of the transistors positioned in those regions in the samples.

Note that in the measurement of the Id-Vg characteristics, a change in a current between the conductor 240a and the conductor 240b (hereinafter also referred to as a drain current (Id)) when a potential applied to the conductor 260 of the transistor 200 (hereinafter also referred to as a gate potential (Vg)) is changed from a first value to a second value is measured.

Here, a change in a drain current (Id) when a voltage (hereinafter also referred to as a drain voltage) that was a difference between a potential applied to the conductor 240a (hereinafter also referred to as a source potential Vs) and a potential applied to the conductor 240b (hereinafter also referred to as a drain potential Vd) was set to +0.1 V or +1.2 V and a voltage (hereinafter also referred to as a gate voltage) that was a difference between the source potential and the gate potential was changed from −4.0 V to +4.0 V was measured.

Note that in this measurement, the potential of the conductor 205 (hereinafter also referred to as a back gate potential (Vbg)) that functions as a second gate electrode (back gate electrode) was set to 0.0 V.

Each of the graphs of the electrical characteristics shows Id when Vd is 1.2 V and Id when Vd is 0.1 V. A dotted line represents field-effect mobility. In each of the graphs of the electrical characteristics, a first vertical axis represents Id [A], a second vertical axis represents field-effect mobility ($\mu FE$ [$cm^2/Vs$]), and the horizontal axis represents Vg [V]. The field-effect mobility was calculated from the value measured at Vd=1.2 V.

According to the results shown in FIG. 27, in Sample 2A, favorable transistor characteristics were obtained in both the center portion and the end portion of the transistor formation region. By contrast, in Sample 2B that is the comparative example, transistor characteristics were not obtained in the center portion of the transistor formation region.

<Considerations of Measurement Results>

In Sample 2B, excess oxygen in the insulator 224 was probably absorbed by the conductor 240 through the oxide 230b. That is, it is considered that in Sample 2B, the conductor 240 absorbed oxygen from the oxide 230 while the excess oxygen in the insulator 224 was diffused into the oxygen vacancies generated in the oxide 230.

In particular, it is considered that in Sample 2B, the amount of oxygen extracted from the oxide 230 by the conductor 240 became greater than the amount of excess oxygen diffused into the oxide 230 from the insulator 224 in the center portion of the transistor formation region where transistors are dense. Thus, since excess oxygen in the insulator 224 was insufficient and carriers were generated by the oxygen vacancies generated in the oxide 230, transistor characteristics were not able to be obtained.

In Sample 2B, in the end portion of the transistor formation region where the transistors are sparse, the amount of excess oxygen in the insulator 224 per transistor becomes greater than that in the center portion of the transistor formation region. That is, the amount of oxygen extracted from the oxide 230 by the conductor 240 becomes less than or equal to the amount of the excess oxygen diffused into the oxide 230 from the insulator 224, and excess oxygen compensates for the oxygen vacancies generated in the oxide 230, whereby generation of carriers was able to be inhibited.

Meanwhile, Sample 2A has a structure in which the oxide 230b and the insulator 224 are not in direct contact with each other. That is, since the metal oxide 226 is interposed, excess oxygen in the insulator 224 is not diffused into the oxide 230b. Accordingly, oxidation of the conductor 240 due to diffusion of excess oxygen through the oxide 230b was able to be inhibited.

In Sample 2A, to a channel formation region of the transistor 200 (corresponding to a region where the oxide 230c and the oxide 230b overlap with each other), excess oxygen contained in the insulator 224 is diffused through the oxide 230c that is in contact with the insulator 224 to ensure oxygen vacancies generated in the channel formation region, so that generation of carriers was able to be inhibited.

In particular, transistor characteristics were able to be obtained even in the center portion of the transistor formation region where the transistors are dense. That is, in the oxide 230b, excess oxygen contained in the insulator 224 was inhibited from being diffused into a region overlapping with the conductor 240, whereby excess oxygen contained in the insulator 224 was not insufficient even in the region where the transistors are dense. It is considered that when excess oxygen was efficiently supplied to the channel formation region of the transistor 200 and thereby was able to compensate for oxygen vacancies.

With this structure, excess oxygen can be efficiently supplied to the channel formation region of the transistor 200. In the structure, the amount of excess oxygen to be supplied to the channel formation region can be controlled with the thickness or deposition conditions of the insulator 224. Accordingly, the design flexibility of a semiconductor device with this structure can be increased.

As described above, providing the metal oxide 226 can inhibit variations in electrical characteristics of the transistor 200 including the oxide 230 that functions as an oxide semiconductor. Moreover, it was able to be estimated that the electrical characteristics of the transistor 200 including the oxide 230 that functions as an oxide semiconductor can be controlled by provision of the metal oxide 226.

At least part of this example can be implemented in combination with the other embodiments described in this specification as appropriate.

Example 3

In this example, a semiconductor device including a plurality of regions each of which included a plurality of transistors 200 illustrated in FIG. 2 or FIG. 3 (hereinafter referred to as transistor formation regions) was fabricated, and the electrical characteristics of a given transistor 200 were measured. Here, in the transistor formation region, the density of the transistor 200 was set to 2.0/μm². The channel length and channel width of the transistor 200 were each designed to be 60 nm.

Note that the transistor 200 illustrated in FIG. 2, which was fabricated in this example, was Sample 3A. The transistor 200 illustrated in FIG. 3, which was fabricated in this example, was Sample 3B.

<Fabrication Method of Samples>

Fabrication methods of Sample 3A and Sample 3B fabricated in this example are described below.

In Sample 3A and Sample 3B, the conductor 205 was formed in such a manner that a tungsten film was deposited by a sputtering method and processed.

In Sample 3A and Sample 3B, as the insulator 222, a 20-nm-thick hafnium oxide film was deposited by an ALD method.

In Sample 3A and Sample 3B, as the insulator 224, a 30-nm-thick silicon oxynitride film was deposited. As deposition conditions, silane ($SiH_4$) at a flow rate of 1 sccm and dinitrogen monoxide ($N_2O$) at a flow rate of 800 sccm were used. The deposition was performed under the conditions where the pressure in a reaction chamber was 40 Pa, the deposition temperature was 400° C., and a high-frequency (RF) power of 150 W (60 MHz) was applied.

Here, in Sample 3A, as the metal oxide 226, a 3-nm-thick aluminum oxide film was deposited. Here, an oxide film was formed as the metal oxide 226 by a sputtering method in an atmosphere containing oxygen, whereby excess oxygen was injected into the insulator 224. Note that the aluminum oxide film was deposited by a sputtering method using an $Al_2O_3$ target in a mixed atmosphere of oxygen ($O_2$) and argon (Ar). The deposition was performed under the conditions where the pressure in the reaction chamber was 0.4 Pa, the deposition temperature was 250° C., and the deposition power was 2.5 kW (RF).

By contrast, in Sample 3B, a 3-nm-thick aluminum oxide film was deposited as the film 227 that inhibits diffusion of excess oxygen. Here, an oxide film was formed as the film 227 that inhibits diffusion of excess oxygen by a sputtering method in an atmosphere containing oxygen, whereby excess oxygen was injected into the insulator 224. Note that the aluminum oxide film was deposited by a sputtering method using an $Al_2O_3$ target in a mixed atmosphere of oxygen ($O_2$) and argon (Ar). The deposition was performed under the conditions where the pressure in the reaction chamber was 0.4 Pa, the deposition temperature was 250° C., and the deposition power was 2.5 kW (RF).

Next, in Sample 3B, as the insulator 228, a 5-nm-thick silicon oxynitride film was deposited over the film 227 that inhibits diffusion of excess oxygen. As deposition conditions, silane ($SiH_4$) at a flow rate of 1 sccm and dinitrogen monoxide ($N_2O$) at a flow rate of 800 sccm were used. The deposition was performed under the conditions where the pressure in the reaction chamber was 40 Pa, the deposition temperature was 400° C., and a high-frequency (RF) power of 150 W (60 MHz) was applied.

Next, in Sample 3A and Sample 3B, the oxide 230b had a stacked-layer structure including two layers. As the first oxide 230b, an In—Ga—Zn oxide was deposited by a sputtering method using a target with In:Ga:Zn=4:2:4.1 [atomic ratio]. Next, as the second oxide 230b, an In—Ga—Zn oxide was deposited over the first oxide 230b by a sputtering method using a target with In:Ga:Zn=1:3:4 [atomic ratio]. Note that the first oxide 230b and the second oxide 230b were successively deposited.

In Sample 3A and Sample 3B, the oxide 230c had a stacked-layer structure including two layers. As the first oxide 230c, an In—Ga—Zn oxide was deposited by a sputtering method using a target with In:Ga:Zn=4:2:4.1 [atomic ratio]. Next, as the second oxide 230c, an In—Ga—Zn oxide was deposited over the first oxide 230c by a sputtering method using a target with In:Ga:Zn=1:3:4 [atomic ratio]. Note that the first oxide 230c and the second oxide 230c were successively deposited.

In Sample 3A and Sample 3B, as the insulator 250, a 10-nm-thick silicon oxide film was deposited. As deposition conditions, silane ($SiH_4$) at a flow rate of 1 sccm and dinitrogen monoxide ($N_2O$) at a flow rate of 800 sccm were used. The deposition was performed under the conditions where the pressure in the reaction chamber was 200 Pa, the deposition temperature was 350° C., and a high-frequency (RF) power of 150 W (60 MHz) was applied.

In Sample 3A and Sample 3B, the conductor 260 was formed in such a manner that a titanium nitride film and a tungsten film were successively deposited by a CVD method and processed.

Furthermore, heat treatment was performed on Sample 3A and Sample 3B at 400° C. for four hours in an atmosphere containing nitrogen.

Through the above steps, Sample 3A and Sample 3B each including the transistors 200 were fabricated.

<Electrical Characteristics of Transistors>

As electrical characteristics of the transistors included in Sample 3A and Sample 3B, the Id-Vg characteristics and the field-effect mobilities (hereinafter collectively also referred to as electrical characteristics) were measured.

FIG. 29 shows initial Id-Vg characteristics and the field-effect mobility of the transistors positioned in those regions in the samples.

Note that in the measurement of the Id-Vg characteristics, a change in a current between the conductor 240a and the conductor 240b (hereinafter also referred to as a drain current (Id)) when a potential applied to the conductor 260 of the transistor 200 (hereinafter also referred to as a gate potential (Vg)) is changed from a first value to a second value is measured.

Here, a change in a drain current (Id) when a voltage (hereinafter also referred to as a drain voltage) that was a difference between a potential applied to the conductor 240a (hereinafter also referred to as a source potential Vs) and a potential applied to the conductor 240b (hereinafter also referred to as a drain potential Vd) was set to +0.1 V or +1.2 V and a voltage (hereinafter also referred to as a gate voltage) that was a difference between the source potential and the gate potential was changed from −4.0 V to +4.0 V was measured.

Note that in this measurement, the potential of the conductor 205 (hereinafter also referred to as a back gate potential (Vbg)) that functions as a second gate electrode (back gate electrode) was set to 0.0 V.

Each of the graphs of the electrical characteristics shows Id when Vd is 1.2 V and Id when Vd is 0.1 V. Note that in each of the graphs of the electrical characteristics, the vertical axis represents Id [A] and the horizontal axis represents Vg [V].

Figure 29A:
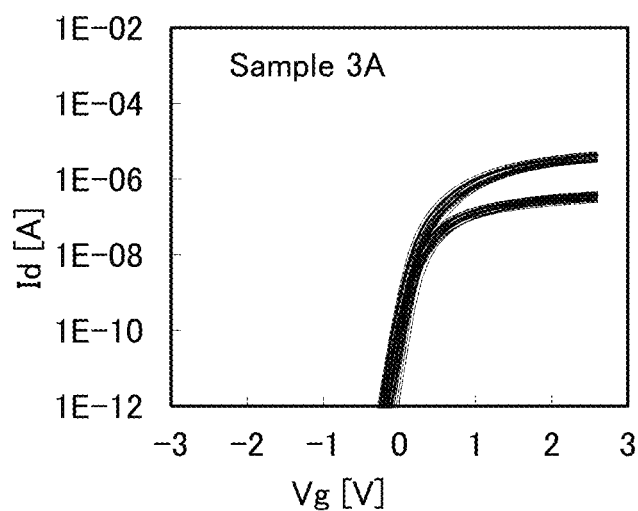
FIG. 29A and FIG. 29B are graphs showing electrical characteristics of transistors fabricated in an example.
Figure 29B:
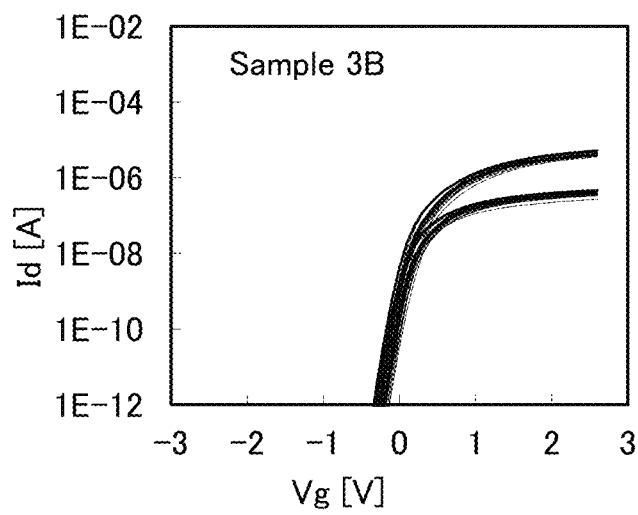

FIG. 29A shows the measurement results of Sample 3A, and FIG. 29B shows the measurement results of Sample 3B. According to the results shown in FIG. 29, it is found that favorable transistor characteristics were obtained in both Sample 3A and Sample 3B.

With this structure, excess oxygen can be efficiently supplied to the channel formation region of the transistor 200. In the structure, the amount of excess oxygen to be supplied to the channel formation region can be controlled with the thickness or deposition conditions of the insulator 224. Accordingly, the design flexibility of a semiconductor device with this structure can be increased.

As described above, providing the metal oxide 226 can inhibit variations in electrical characteristics of the transistor 200 including the oxide 230 that functions as an oxide semiconductor. Moreover, it was able to be estimated that the electrical characteristics of the transistor 200 including the oxide 230 that functions as an oxide semiconductor can be controlled by provision of the metal oxide 226.

Providing the film 227 that inhibits diffusion of excess oxygen and the insulator 228 over the film 227 that inhibits diffusion of excess oxygen can inhibit variations in electrical characteristics of the transistor 200 including the oxide 230 that functions as an oxide semiconductor. Moreover, it was able to be estimated that the electrical characteristics of the transistor 200 including the oxide 230 that functions as an oxide semiconductor can be controlled by provision of the film 227 that inhibits diffusion of excess oxygen and the insulator 228 over the film 227 that inhibits diffusion of excess oxygen.

At least part of this example can be implemented in combination with the other embodiments described in this specification as appropriate.

Example 4

In this example, a semiconductor device including a plurality of regions each of which included a plurality of transistors 200 illustrated in FIG. 2 (hereinafter referred to as transistor formation regions) was fabricated, and the electrical characteristics of a given transistor 200 were measured. Here, in the transistor formation region, the density of the transistor 200 was set to 2.0/μm². The channel length and channel width of the transistor 200 were each designed to be 60 nm.

Note that the transistors 200 illustrated in FIG. 2, which were fabricated in this example, were Sample 4A and Sample 4B.

Here, Sample 4A and Sample 4B had structures in which plugs electrically connected to the transistor 200 (the conductors 246 illustrated in FIG. 11) were different. Specifically, in Sample 4B, the insulator 247 was provided between the insulators 224 and 280 containing excess oxygen and the conductors 246 and 248. By contrast, the insulator 247 was not provided in Sample 4A.

<Fabrication Method of Samples>

Fabrication methods of Sample 4A and Sample 4B fabricated in this example are described below.

In Sample 4A and Sample 4B, the conductor 205 was formed in such a manner that a tungsten film was deposited by a sputtering method and processed.

In Sample 4A and Sample 4B, as the insulator 222, a 20-nm-thick hafnium oxide film was deposited by an ALD method.

In Sample 4A and Sample 4B, as the insulator 224, a 30-nm-thick silicon oxynitride film was deposited. As deposition conditions, silane ($SiH_4$) at a flow rate of 1 sccm and dinitrogen monoxide ($N_2O$) at a flow rate of 800 sccm were used. The deposition was performed under the conditions where the pressure in a reaction chamber was 40 Pa, the deposition temperature was 400° C., and a high-frequency (RF) power of 150 W (60 MHz) was applied.

In Sample 4A and Sample 4B, as the metal oxide 226, a 3-nm-thick aluminum oxide film was deposited. Here, as the metal oxide 226, excess oxygen was injected into the insulator 224 by forming an oxide film by a sputtering method in an atmosphere containing oxygen. Note that the aluminum oxide film was deposited by a sputtering method using an $Al_2O_3$ target in a mixed atmosphere of oxygen ($O_2$) and argon (Ar). The deposition was performed under the conditions where the pressure in the reaction chamber was 0.4 Pa, the deposition temperature was 250° C., and the deposition power was 2.5 kW (RF).

Next, in Sample 4A and Sample 4B, the oxide 230b had a stacked-layer structure including two layers. As the first oxide 230b, an In—Ga—Zn oxide was deposited by a sputtering method using a target with In:Ga:Zn=4:2:4.1 [atomic ratio]. Next, as the second oxide 230b, an In—Ga—Zn oxide was deposited over the first oxide 230b by a sputtering method using a target with In:Ga:Zn=1:3:4 [atomic ratio]. Note that the first oxide 230b and the second oxide 230b were successively deposited.

In Sample 4A and Sample 4B, the oxide 230c had a stacked-layer structure including two layers. As the first oxide 230c, an In—Ga—Zn oxide was deposited by a sputtering method using a target with In:Ga:Zn=4:2:4.1 [atomic ratio]. Next, as the second oxide 230c, an In—Ga—Zn oxide was deposited over the first oxide 230c by a sputtering method using a target with In:Ga:Zn=1:3:4 [atomic ratio]. Note that the first oxide 230c and the second oxide 230c were successively deposited.

In Sample 4A and Sample 4B, as the insulator 250, a 10-nm-thick silicon oxide film was deposited. As deposition conditions, silane ($SiH_4$) at a flow rate of 1 sccm and dinitrogen monoxide ($N_2O$) at a flow rate of 800 sccm were used. The deposition was performed under the conditions where the pressure in the reaction chamber was 200 Pa, the deposition temperature was 350° C., and a high-frequency (RF) power of 150 W (60 MHz) was applied.

In Sample 4A and Sample 4B, the conductor 260 was formed in such a manner that a titanium nitride film and a tungsten film were successively deposited by a CVD method and processed.

Next, in Sample 4A and Sample 4B, the insulator 280, the insulator 274, and the like were removed to provide an opening portion exposing the conductor 240a and the conductor 240b of the transistor 200.

Here, in Sample 4B, a 13-nm-thick aluminum oxide film was deposited as the insulator 247 by an ALD method. Then, part of the aluminum oxide film was removed to expose the conductor 240a and the conductor 240b.

In Sample 4A and Sample 4B, the conductor 246 was formed in such a manner that a titanium nitride and a tungsten film were successively deposited by a CVD method and processed.

Furthermore, heat treatment was performed on Sample 4A and Sample 4B at 400° C. for four hours in an atmosphere containing nitrogen.

Through the above steps, Sample 4A and Sample 4B each including the transistors 200 were fabricated.

<Electrical Characteristics of Transistors>

As electrical characteristics of the transistors included in Sample 4A and Sample 4B, the Id-Vg characteristics and the field-effect mobilities (hereinafter collectively also referred to as electrical characteristics) were measured.

FIG. 30 shows initial Id-Vg characteristics and the field-effect mobility of the transistors positioned in those regions in the samples.

Note that in the measurement of the Id-Vg characteristics, a change in a current between the conductor 240a and the conductor 240b (hereinafter also referred to as a drain current (Id)) when a potential applied to the conductor 260 of the transistor 200 (hereinafter also referred to as a gate potential (Vg)) is changed from a first value to a second value is measured.

Here, a change in a drain current (Id) when a voltage (hereinafter also referred to as a drain voltage) that was a difference between a potential applied to the conductor 240a (hereinafter also referred to as a source potential Vs) and a potential applied to the conductor 240b (hereinafter also referred to as a drain potential Vd) was set to +0.1 V or +1.2 V and a voltage (hereinafter also referred to as a gate voltage) that was a difference between the source potential and the gate potential was changed from −4.0 V to +4.0 V was measured.

Note that in this measurement, the potential of the conductor 205 (hereinafter also referred to as a back gate potential (Vbg)) that functions as a second gate electrode (back gate electrode) was set to 0.0 V.

Each of the graphs of the electrical characteristics shows Id when Vd is 1.2 V and Id when Vd is 0.1 V. Note that in each of the graphs of the electrical characteristics, the vertical axis represents Id [A] and the horizontal axis represents Vg [V].

Figure 30A:
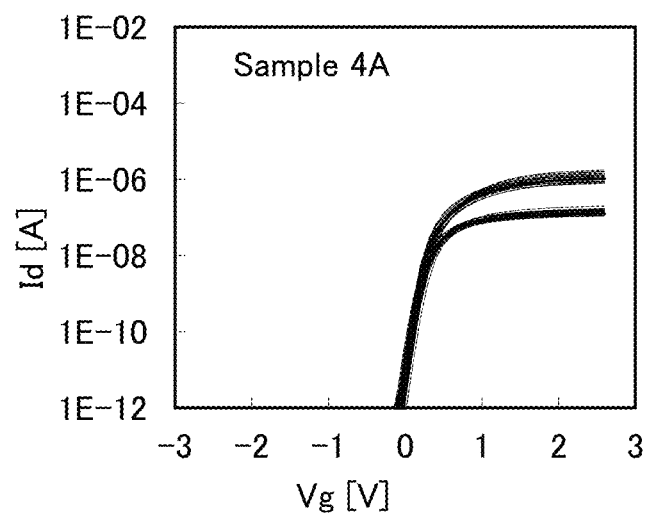
FIG. 30A and FIG. 30B are graphs showing electrical characteristics of transistors fabricated in an example.
Figure 30B:
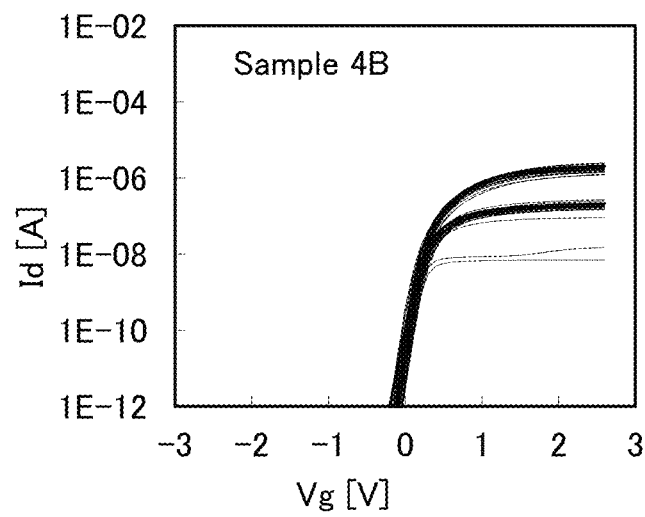

FIG. 30A shows the measurement results of Sample 4A, and FIG. 30B shows the measurement results of Sample 4B. According to the results shown in FIG. 30, it is found that favorable transistor characteristics were obtained in both Sample 4A and Sample 4B.

With this structure, excess oxygen can be efficiently supplied to the channel formation region of the transistor 200. In the structure, the amount of excess oxygen to be supplied to the channel formation region can be controlled with the thickness or deposition conditions of the insulator 224. Accordingly, the electrical characteristics of the transistor 200 are not affected by steps after forming the transistor 200, and thus the design flexibility of a semiconductor device with this structure can be increased.

As described above, providing the metal oxide 226 can inhibit variations in electrical characteristics of the transistor 200 including the oxide 230 that functions as an oxide semiconductor. Moreover, it was able to be estimated that the electrical characteristics of the transistor 200 including the oxide 230 that functions as an oxide semiconductor can be controlled by provision of the metal oxide 226.

At least part of this example can be implemented in combination with the other embodiments described in this specification as appropriate.

REFERENCE NUMERALS

200: transistor, 205: conductor, 210: insulator, 211: substrate, 212: insulator, 214: insulator, 216: insulator, 218: conductor, 222: insulator, 224: insulator, 226: metal oxide, 227: film that inhibits diffusion of excess oxygen, 228: insulator, 230: oxide, 230b: oxide, 230B: oxide film, 230c: oxide, 230C: oxide film, 240: conductor, 240a: conductor, 240A: conductive film, 240b: conductor, 240B: conductive layer, 246: conductor, 246a: conductor, 246b: conductor, 247: insulator, 248: conductor, 250: insulator, 250A: insulating film, 260: conductor, 260a: conductor, 260A: conductive film, 260b: conductor, 260B: conductive film, 274: insulator, 280: insulator, 282: insulator, 284: insulator,

The invention claimed is:

1. A semiconductor device comprising:
a first insulator comprising an excess-oxygen region;
a second insulator comprising a metal oxide, the second insulator being over and in contact with a first region and a third region of the first insulator;
a first oxide semiconductor over the second insulator and overlapping with the first region of the first insulator;
a first conductor in contact with the first oxide semiconductor;
a second conductor in contact with the first oxide semiconductor; and
a second oxide semiconductor comprising a first region being over and in contact with the first oxide semiconductor and a second region being over and in contact with a second region of the first insulator,
wherein the metal oxide contains an element having lower Gibbs energy of formation in an Ellingham diagram for oxide than a metal element contained in the first oxide semiconductor,
wherein the third region of the first insulator is positioned to cover the first region and the second region of the first insulator,
wherein the first region of the second oxide semiconductor is positioned between the first conductor and the second conductor, and
wherein the second oxide semiconductor does not overlap with the first conductor and the second conductor.

2. The semiconductor device according to claim 1, further comprising:
a third insulator in contact with a lower portion of the first insulator; and
a third conductor below the third insulator,
wherein the third insulator is less likely to pass oxygen than the first insulator.

3. The semiconductor device according to claim 1,
wherein the first conductor and the second conductor contain an element having higher Gibbs energy of formation in the Ellingham diagram than the metal element contained in the first oxide semiconductor.

4. The semiconductor device according to claim 1, wherein the first oxide semiconductor comprises an In—Ga—Zn oxide.

5. A semiconductor device comprising:
a first insulator comprising an excess-oxygen region;
a second insulator comprising a metal oxide, the second insulator being over and in contact with a top surface of a first region of the first insulator;
a third insulator over the second insulator;
a first oxide semiconductor over the third insulator;
a first conductor in contact with a top surface of the first oxide semiconductor;
a second conductor in contact with a top surface of the first oxide semiconductor;
a second oxide semiconductor comprising a first region being over and in contact with a top surface of the first oxide semiconductor and a second region being over and in contact with a top surface of a second region of the first insulator; and
a fourth insulator in contact with a top surface and a side surface of the first conductor, a top surface and a side surface of the second conductor, a side surface of the first oxide semiconductor, a side surface of the second insulator, and a top surface of a third region of the first insulator,
wherein the third insulator contains an element having lower Gibbs energy of formation in an Ellingham diagram for oxide than an element contained in the first oxide semiconductor,
wherein the second insulator contains an element having lower Gibbs energy of formation in the Ellingham diagram than the element contained in the third insulator,
wherein the first region of the second oxide semiconductor is positioned between the first conductor and the second conductor, and
wherein the second oxide semiconductor does not overlap with the first conductor and the second conductor.

6. The semiconductor device according to claim 5, further comprising:
a fifth insulator in contact with a lower portion of the first insulator; and
a third conductor below the fifth insulator,
wherein the fifth insulator is less likely to pass oxygen than the first insulator.

7. The semiconductor device according to claim 5, wherein the first conductor and the second conductor contain an element having higher Gibbs energy of formation in the Ellingham diagram than a metal element contained in the first oxide semiconductor.

8. The semiconductor device according to claim 5, wherein the first oxide semiconductor comprises an In—Ga—Zn oxide.

9. The semiconductor device according to claim 1, wherein the second insulator is less likely to pass oxygen than the first insulator.

10. The semiconductor device according to claim 1, wherein the metal oxide comprises one of aluminum oxide and hafnium oxide.

11. The semiconductor device according to claim 5, wherein the second insulator is less likely to pass oxygen than the first insulator.

12. The semiconductor device according to claim 5, wherein the metal oxide comprises one of aluminum oxide and hafnium oxide.

* * * * *